United States Patent
Kagawa et al.

(10) Patent No.: US 6,211,681 B1
(45) Date of Patent: Apr. 3, 2001

(54) APPARATUS FOR DIAGNOSING ELECTRIC POWER SOURCE WHILE POWER IS SUPPLIED TO LOAD DEVICE FROM THE POWER SOURCE

(75) Inventors: Kazunori Kagawa; Tsuyoshi Yano, both of Toyota; Masayuki Sumiyoshi, Okazaki; Yoshiaki Kominami, Aichi-ken; Akihiro Otomo, Toyota; Eiji Nakamura, Aichi-ken, all of (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 0 days.

(21) Appl. No.: 09/562,898

(22) Filed: May 2, 2000

(30) Foreign Application Priority Data

May 24, 1999 (JP) .................................... 11-143416
Aug. 24, 1999 (JP) .................................... 11-237118

(51) Int. Cl.[7] ...................... H01M 10/44; H01M 10/46; G01N 27/416
(52) U.S. Cl. ............................... 324/426; 320/104
(58) Field of Search ..................... 320/103, 104, 320/116, 117, 119, 123, 140, DIG. 33, DIG. 34, DIG. 36; 324/426, 429, 433, 434

(56) References Cited

U.S. PATENT DOCUMENTS 4,234,921 * 11/1980 Kinoshita et al. .
4,733,923 * 3/1988 Dahngrt .
5,897,596 * 4/1999 Kabune et al. .
6,114,952 * 9/2000 Francesangeli et al. .
6,138,801 * 10/2000 Shirai et al. .

FOREIGN PATENT DOCUMENTS 5-211727    8/1993   (JP) .
10-91538    4/1998   (JP) .
10-366915   12/1998  (JP) .

OTHER PUBLICATIONS

J. Vincent Hellmann et al., "Dual/High Voltage Electrical Systems"—Future Transportation Technology Conference and Exposition, Portland, Oregon, Aug. 5–7, 1991, pp. 1–9 (SAE No. 911652).

* cited by examiner

Primary Examiner—Edward H. Tso
(74) Attorney, Agent, or Firm—Oliff & Berridge, PLC

(57) ABSTRACT

A power source monitoring apparatus for monitoring a state of a subject power source which consists of at least one of a plurality of electric power sources in an electric system wherein a load device having at least one electrically operated load is electrically connected to the power sources, the monitoring device apparatus a detecting portion which detects a voltage and/or a current of at least one of the load device and the plurality of electric power sources, and a diagnosing device which diagnoses the subject power source for an abnormality on the basis of an output of the detecting portion, while the electric system is placed in a power supply state wherein an electric power is permitted to be supplied from only the subject power source to the load device.

59 Claims, 25 Drawing Sheets

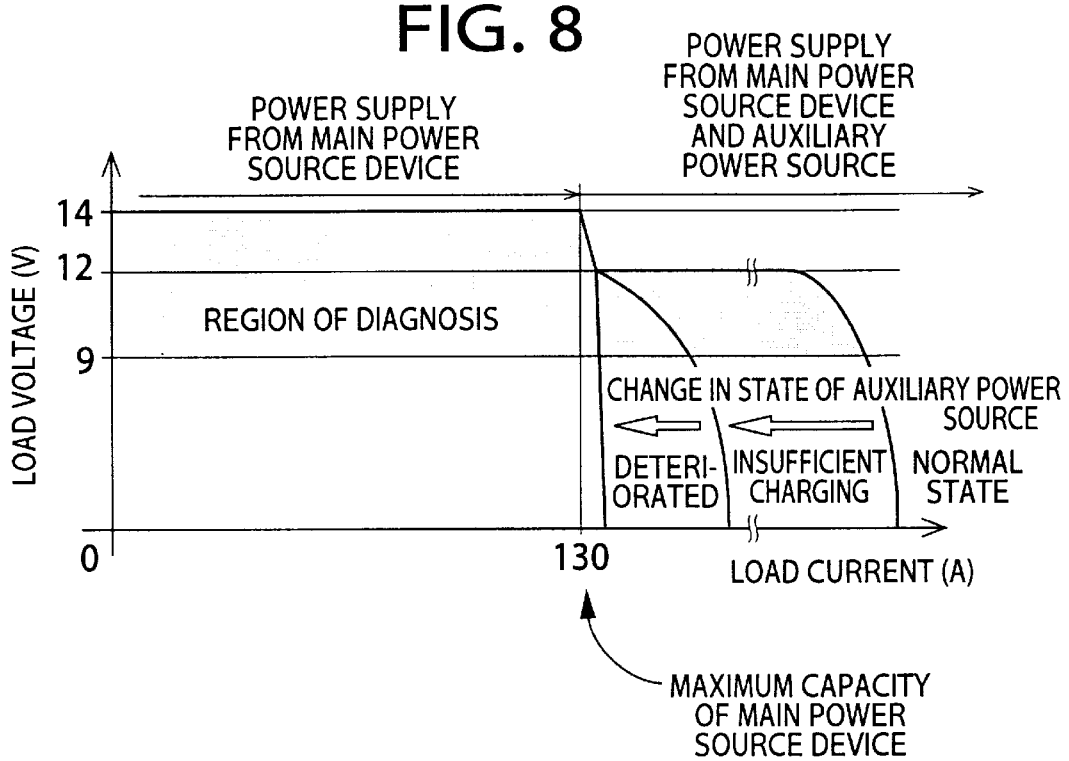
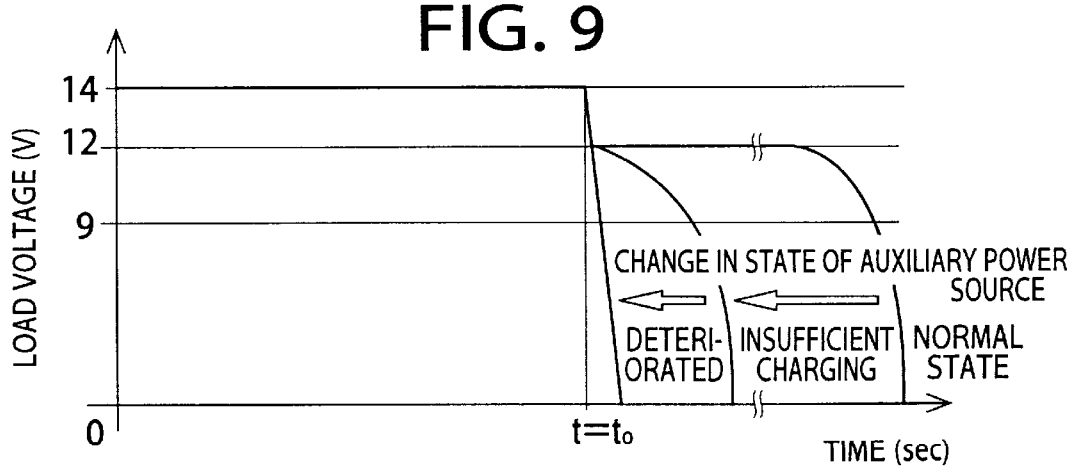

CONDITION FOR DETERMINING
THE DETERIORATION
OF AUXILIARY BATTERY $$\text{AND} \begin{cases} V \leqq V_{thf} \\ t \leqq t_{thf} \end{cases}$$

CONDITION FOR DETERMINING
THE INSUFFICIENT CHARGING
OF AUXILIARY BATTERY $$V \leqq V_{the}$$

$$(V_L < V_{dd} < V_{thf} < V_{the} < V_b)$$

FIG. 11

APPARATUS FOR DIAGNOSING ELECTRIC POWER SOURCE WHILE POWER IS SUPPLIED TO LOAD DEVICE FROM THE POWER SOURCE

This application is based on Japanese Patent Application Nos. 11-143416 and 11-237118 filed May 24, 1999 and Aug. 24, 1999, respectively, the contents of which are incorporated hereinto by reference.

BACKGROUND OF THE INVENTION

1. Field of the Invention

The present invention relates to techniques for monitoring at least one of a plurality of electric power sources in an electric system wherein a load device consisting at least one electrically operated device is electrically connected to the plurality of electric power sources.

2. Discussion of the Related Art

JP-A-10-336915 discloses an electric system wherein a load device is electrically connected to a plurality of electric power sources. In this electric system, the load device can be operated unless all of the plurality of electric power sources are abnormal or defective. Thus, the provision of a plurality of electric power sources in an electric system increases the operating reliability of the electric system.

However, all of the plurality of electric power sources may be defective or abnormal. If it is possible to detect that at least one but not all of the plurality of power sources is defective, it is possible to inform or warn the user of the load device of that fact, that is, that there is a certain possibility that all of the plurality of power sources will be defective. This information or warning help the user of the load device take an appropriate measure or action for the load device, making it possible to avoid undesirable situations which would result from the abnormality of the power source or sources.

The electric current or voltage applied to the load device to which a plurality of electric power sources at least one of which is monitored as a subject power source are connected does not reflect the present capacity or state of each subject subject power source, that is, the ability of the subject power source to energize or activate the load load. To correctly monitor each subject power source, it is necessary to avoid an influence of the other power source or sources on the state of the subject power source.

SUMMARY OF THE INVENTION

It is therefore an object of the present invention to provide an apparatus for correctly monitoring at least one of a plurality of electric power sources connected to a load device, without an influence of the other power source or sources on the state of the subject electric power source or sources.

The above object may be achieved according to any one of the following modes of the present invention, each of which is numbered like the appended claims and depends from the other mode or modes, when appropriate, for easier understanding of technical features disclosed in the present application, and possible combinations of those technical features. However, it is to be understood that the invention is not limited to those technical features or combinations thereof, and that any one of a plurality of technical features described with respect to any one mode of the invention may be a subject of the present invention, without the other technical feature or features being combined with that one feature.

(1) A power source monitoring apparatus for monitoring a state of each of at least one subject power source which consists of at least one of a plurality of power sources in an electric system wherein a load device having at least one electrically operated load is electrically connected to the plurality of electric power sources, the power source monitoring apparatus comprising:

a detecting portion which detects at least one of a voltage and a current of at least one of the load device, the above-indicated at least one subject power source and at least one non-subject power source which consists of the plurality of electric power sources except the at least one subject power source; and a first diagnosing device which diagnoses each subject power source for an abnormality on the basis of an output of the detecting portion, while the electric system is placed in a power supply state wherein an electric power is permitted to be supplied from only the subject power source to the load device.

While the electric system is placed in the above-indicated power supply state, the detecting portion detects at least one of the voltage and the current of at least one of the load device, the above-indicated at least one subject power source and the above-indicated non-subject power source. The use of the output of the detecting portion permits detection of the state of each subject power source (for example, an internal electrical resistance of the subject power source), without an influence of the non-subject power source or sources.

Based on the above finding, the power source monitoring apparatus according to the above mode (1) of this invention is adapted to determine whether each of the at least one subject power source is normal or not, on the basis of the output of the detecting portion representative of at least one of the voltage and current of at least one of the load device and the plurality of electric power sources (at least one subject power source and at least one non-subject power source), while the electric system is in the power supply state in which the electric power can be supplied from only the subject power source to the load device. The present power source monitoring apparatus is capable of diagnosing or monitoring the at least one subject power source without an influence of the at least one non-subject power source.

The present power source monitoring apparatus can detect the presence or absence of a phenomenon that the function of the at least one subject power source has been unexpectedly lowered below a predetermined lower limit, namely, a problem of any subject power source, or the presence or absence of a phenomenon that the function of the at least one subject power source has been expectedly lowered below the lower limit, namely, deterioration of any subject power source. For example, the function of the at least one subject power source is to supply the load device with the required electric power. One example of a cause for the deterioration of the subject power source is a chronological reduction of the internal electrical resistance of the subject power source.

The present power source monitoring apparatus may be utilized for an automotive vehicle that can be run on a road surface, an electric car or rail car that can be run on rails, ships, aircraft, and other mobile bodies. Automotive vehicles are a typical example of the mobile bodies for which the present power source monitoring apparatus is utilized. Where the power source monitoring apparatus is utilized for an automotive vehicle, the load device may include, as at least one electrically operated load, an electrically operated power steering device, an electrically operated pump, an electrically operated air conditioner, head lights, power window motors, wiper motors, an electrically operated braking system utilizing an electric energy (including an electric motor or motors for operating a pump or pumps, an electric motor or motors for driving a friction member or members of a wheel brake or brakes, and solenoid-operated valves for controlling the pressures of a fluid or the direction of flows of the fluid), audio devices or instruments, and a computer or computers for controlling the operations of those electrically operated components or devices.

The above-indicated "power supply state" in which the electric power is permitted to be supplied from only the at least one subject power source to the load device and in which each subject power source is diagnosed may be established for a purpose other than the diagnosis of each subject power source and may be utilized for the diagnostic purpose according to the present invention. Alternatively, the above power supply state may be established for the sole purpose of diagnosing each subject power source.

The detecting portion provided in the present power source monitoring apparatus is preferably adapted to detect the voltage or electric current of the at least one subject power source, since the at least one subject power source is a subject to be monitored by the power source monitoring apparatus. However, the detecting portion may be adapted to detect the voltage or current of the load device, or the voltage or current of the at least one non-subject power source. Any of the subject power source, the load device and the non-subject power source may be used as the subject whose voltage or current is detected by the detecting portion, because the voltage or current of the subject power source, the voltage or current of the load device, and the voltage or current of the non-subject power source relate to each other. For instance, when the voltage of the non-subject power source is lower than that of the subject power source, the electric system is placed in the power supply state wherein the electric power is supplied from only the subject power source to the load device. In this case, the voltage of the load device is the same as the voltage of the subject power source, so that the voltage of the load device can be considered as the voltage of the subject power source.

Further, the detecting portion may be adapted to either directly or indirectly detect at least one of the voltage and current of at least one of the subject power source, non-subject power source and load device. For instance, there may be provided a supply power regulating device between the subject power source and the load device, as described below. In this case, the supply power regulating device controls the electric power to be supplied from the subject power source to the load device, and the operating state of the supply power regulating device is determined by the voltage of the subject power source and the electric power supplied to the load device, so that the voltage of the subject power source can be detected on the basis of the operating state of the supply power regulating device, provided that the electric power to be supplied to the load device is known.

Each of the at least one subject power source is diagnosed for any abnormality, on the basis of the output of the detecting portion. Although the output of the detecting portion per se may be directly used for the diagnosis, the diagnosis may be effected on the basis of at least one of an amount of change of the output, a rate of change of the output, a derivative of the rate of change, or a pattern of change of the output.

(2) A power source monitoring apparatus according to the above mode, wherein the first diagnosing device includes means for assuring an operation of the load device with the electric power supplied from the at least one subject power source when the first diagnosing device diagnoses each subject power source.

To determine whether each subject power source is abnormal or not, the load device must be operated with the electric power supplied from the subject power source, to cause an electric current to flow from the subject power source to the load device. However, there is not an assurance that the load device is operated with the electric power of the subject power source, upon diagnosis of the subject power source for an abnormality, in the absence of an appropriate means.

In the power source monitoring apparatus according to the above mode (2) of the present invention, there is provided means for assuring an operation of the load device with the electric power supplied from the at least one subject power source when each subject power source is diagnosed, whereby the reliability of a result of the diagnosis is improved.

(3) A power source monitoring apparatus according to the above mode (1) or (2), wherein the power supply state is established with the at least one non-subject power source being temporarily disconnected from the load device.

In the power source monitoring apparatus according to the above mode (3), the at least one non-subject power source may be temporarily disconnected from the load device, for the sole purpose of diagnosing the subject power source, or alternatively, for a purpose other than the diagnosis as well for the diagnostic purpose.

(4) A power source monitoring apparatus according to any one of the above modes (1)–(3), wherein the power supply state is established with a temporary limitation of the electric power to be supplied from the at least one non-subject power source to the load device, without a temporary disconnection of the at least one non-subject power source from the load device.

In the apparatus according to the above mode (3), the power supply state indicated above is established by temporarily disconnecting the at least one non-subject power source from the load device so that no electric power is supplied from the non-subject power source to the load device during the temporary disconnection. In this arrangement, therefore, the electric power supplied to the load device may be insufficient if the voltage of the subject power source is low, leading to a possibility that the load device cannot be necessarily operated.

In the light of the above, the apparatus according to the above mode (4) is arranged to establish the power supply state by temporarily limiting or restricting the amount of electric power to be supplied from the at least one non-subject power source to the load device. Unlike the temporary disconnection, the temporary limitation permits the electric power to be supplied from the non-subject power source to the load device if the voltage of the subject power source is low due to an abnormality of the subject power source. Accordingly, the present arrangement is effective to reduce the above-indicated possibility that the load device cannot be necessarily operated due to a low voltage of the subject power source.

In the apparatus according to the above mode (4), the temporary limitation of the electric power to be supplied from the non-subject power source to the load device may be effected by temporarily limiting a flow of the electric current from the non-subject power source to the load device, or by temporarily increasing the amount of electric power consumed by at least one load of the load device which is connected to only the at least one non-subject power source. Further, the temporary limitation can be established for the sole purpose of diagnosing each subject power source, or for another purpose as well as for the diagnostic purpose.

(5) A power source monitoring apparatus according to the above mode (4), wherein the temporary limitation is established while the at least one non-subject power source is intermittently or continuously connected to the load device, such that a voltage of the at least one non-subject power source is lowered to a level which is between an upper limit lower than an expected lowest level of a voltage of the at least one subject power source when the at least one subject power source is normal, and a lower limit higher than zero.

In the power source monitoring apparatus according to the above mode (5), the at least one non-subject power source is selected as a power source for the load device, when the voltage of the at least one subject power source is lowered due to an abnormality thereof to a level lower than the voltage of the at least one non-subject power source which has been lowered below the normal level due to the diagnosis of the at least one subject power source. Accordingly, the present apparatus reduces the possibility that the load device cannot be operated due to a drop of the voltage of the at least one subject power source below the voltage of the at least one non-subject power source.

(6) A power source monitoring apparatus according to any one of the above modes (1)–(6), wherein the at least one non-subject power source cooperates with a switching device to constitute a main power source device, the switching device having a connecting state wherein the at least one non-subject power source is connected to both of the at least one subject power source and the load device, and a disconnecting state wherein the the at least one non-subject power source is disconnected from both of the at least one subject power source and the load device, and wherein the switching device is operable between the connecting and disconnecting states, to thereby control flows of the electric current between the at least one non-subject power source and a series connection of the at least one subject power source and the load device.

In the power source monitoring apparatus according to the above mode (6), the voltage at a point of connection of the at least one non-subject power source and the load device can be considered to be the voltage of the at least one subject power source.

(7) A power source monitoring apparatus according to any one of the above modes (1)–(5), further comprising a switching device which has a connecting state wherein the at least one non-subject power source is connected to both of the at least one subject power source and the load device, and a disconnecting state wherein the the at least one non-subject power source is disconnected from both of the at least one subject power source and the load device, and wherein the switching device is operable between the connecting and disconnecting states, to thereby control flows of the electric current between the at least one non-subject power source and a series connection of the at least one subject power source and the load device, the first diagnosing device commanding the switching device to establish the power supply state.

In the apparatus according to the above mode (7), the voltage at a point of connection of the switching device and the load device can be considered as the voltage of the at least one subject power source.

(8) A power source monitoring apparatus according to the above mode (6) or (7), wherein the switching device includes a switching element which is operable between an on state and an off state.

A transistor may be an example of the switching device provided in the apparatus according to the above mode (8).

(9) A power source monitoring apparatus according to any one of the above modes (6)–(8), wherein each of the at least one subject power source and the at least one non-subject power source is a direct current power source, and the switching device comprises a DC/DC converter including (a) a DC-AC converter which converts a direct current of the at least one non-subject power source into an alternating current, (b) a transformer which changes a voltage of the alternating current, and (c) an AC-DC converter which converts the alternating current whose voltage has been changed, into a direct current.

In the apparatus according to the above mode (9), an example of the DC-AC converter consists of a plurality of transistors in the form of switching elements which are connected to each other so as to permit flows of an electric current in opposite directions, and an example of the AC-DC converter is a rectifying circuit which will be described.

(10) A power source monitoring apparatus according to any one of the above modes (1)–(9), wherein a nominal voltage of the at least one subject power source and a nominal voltage of the at least one non-subject power source are different from each other.

The apparatus according to the above mode (10) may be applicable to an electric system wherein the nominal voltage of each subject power source is higher than that of each non-subject power source, or to an electric system wherein the nominal voltage of each non-subject power source is higher than that of each subject power source.

(11) A power source monitoring apparatus according to any one of the above modes (1)–(10), wherein a nominal voltage of the at least one non-subject power source is higher than that of the at least one subject power source.

In the electric system provided with the power source monitoring apparatus according to the above mode (11), where the at least one non-subject power source and the at least one subject power source are all normal, the at least one non-subject power source is selected as the power source for the load device if the amount of electric power consumed by the load device is held within a normal range , but both the at least one non-subject power source and the at least one subject power source are selected as the power source for the load device if the amount of electric power consumed by the load device is larger than the upper limit of the normal range. Where only the at least one non-subject power source is normal, the at least one non-subject power source is selected as the power source for the load device. Where only the at least one subject power source is normal, the at least one subject power source is selected as the power source for the lad device. When each subject power source is diagnosed, the at least one subject power source is selected as the power source for the load device, as a principle.

(12) A power source monitoring apparatus according to the above mode (11), wherein the at least one non-subject power source constitutes a primary power source, while each of the at least one subject power source is an auxiliary battery which has a lower nominal voltage and which is charged by the primary power source.

(13) A power source monitoring apparatus according to the above mode, wherein the first diagnosing device determines whether the auxiliary battery is in a deteriorated state or in an insufficiently charged state, on the basis of the output of the detecting portion.

(14) A power source monitoring apparatus according to any one of the above modes (11)–(13), further comprising a second diagnosing device which diagnoses each subject power source on the basis of the output of the detecting portion, without temporary disconnection or limitation of an electric power supply from the at least one non-subject power source to the load device, while the electric power is supplied to the load device from both the at least one non-subject power source and the at least one subject power source.

When the nominal voltage of the at least one non-subject power source is higher than that of the at least one subject power source, the electric power is supply from only the at least one non-subject power source to the load device as long as the amount of electric power consumed by the load device is relatively small. After the amount of electric power consumed by the load device exceeds a maximum electric power that can be supplied from the at least one non-subject power source to the load device, the electric power is supplied from both the at least one non-subject power source and the at least one subject power source. In this latter case, the output of the detecting portion reflects the electric power supply capacity of the at least one subject power source, if the output is not influenced by the at least one non-subject power source. If the output is influenced by the at least one non-subject power source, the output must be adjusted so as to remove the influence of the at least one non-subject power source, so that the adjusted output reflects the electric power supply capacity of the at least one subject power source.

Where the electric power is supplied from both the at least one non-subject power source and the at least one subject power source to the load device, the electric power supplied to the load device may be insufficient, causing a possibility that the load device can necessarily be operated, if the load device is temporarily disconnected from the at least one non-subject power source or the flow of the electric current from the at least one non-subject power source to the load device is temporarily limited or restricted, for the purpose of diagnosing each subject power source.

In the power source monitoring apparatus according to the above mode (14), however, each subject power source is diagnosed for any abnormality on the basis of the output of the detecting portion, without temporary disconnection or limitation of the electric power supply from the at least one non-subject power source to the load device, while the electric power is supplied from both the at least one non-subject power source and the at least one subject power source to the load device. Accordingly, the present power source monitoring apparatus makes it possible to avoid a possibility that the load device can not necessarily be operated due to the diagnosis of the at least one subject power source, thereby permitting the diagnosis without disconnecting or limiting the electric power supply from the at least one non-subject power source to the at least one subject power source.

(15) A power source monitoring apparatus according to the above mode (14), wherein the second diagnosing device includes means for determining that the electric power is supplied from both the at least one non-subject power source and the at least one subject power source to the load device, if a first condition is satisfied or if the first and a second condition are both satisfied, the first condition being satisfied when an amount of electric current supplied from the at least one non-subject power source to the load device is substantially equal to a maximum amount of electric current that can be supplied from the at least one non-subject power source to the load device, and the second condition being satisfied when a voltage of the at least one non-subject power source is substantially equal to that of the at least one subject power source.

The power source monitoring apparatus according to the above mode (15) is arranged such that the voltage of the at least one non-subject power source is higher than that of the at least one subject power source, so that the electric power is supplied from only the at least one non-subject power source to the load device as long as the amount of electric current to be consumed by the load device is relatively small. The amount of electric current supplied from the at least one non-subject power source to the load device is smaller than the maximum amount of electric current of the at least one non-subject power source. When the amount of electric current to be consumed by the load device becomes relatively large, the electric power is supplied from both the at least one non-subject power source and the at least one subject power source to the load device. The amount of electric current supplied from the at least one non-subject power source to the load device in this case is substantially equal to the maximum amount of electric current of the at least one non-subject power source. Further, the actual voltage of the at least one non-subject power source at this time becomes substantially equal to the voltage of the at least one subject power source, so that the electric current can flow from the at least one subject power source connected to the at least one non-subject power source, to the load device.

In the light of the above facts, the apparatus according to the above mode (15) is adapted to determine that the electric power is supplied from both the at least one non-subject power source and the at least one subject power source to the load device, if at least the first condition that the amount of electric current supplied from the at least one non-subject power source to the load device is substantially equal to the maximum amount of electric current of the at least one non-subject power source is satisfied. This determination is also made if the second condition that the voltage of the at least one non-subject power source is substantially equal to that of the at least one subject power source is satisfied as well as the first condition.

(16) A power source monitoring apparatus according to any one of the above modes (1)–(15), wherein the load device includes an electric motor which converts an electric energy into a kinetic energy.

(17) A power source monitoring apparatus according to any one of the above modes (1)–(16), wherein each of the plurality of electric power sources includes at least one of a battery and an electric generator.

(18) A power source monitoring apparatus according to claim 14, wherein at least one of the first diagnosing device and the second diagnosing device diagnoses each subject power source at a time interval which changes depending upon a change of the output of the detecting portion.

(19) A power source monitoring apparatus according to claim 18, wherein the at least one of the first and second diagnosing devices changes the time interval such that the time interval is longer when the output is relatively large than when the output is relatively small.

Where each subject power source is repeatedly or periodically diagnosed, the electric power of the subject power source is consumed each time the subject power source is diagnosed. The amount of this consumption of electric power increases with an increase in the amount of electric current applied from the subject power source to the load device.

In the apparatus according to the above mode (19) wherein the time interval of the diagnosis is made longer when the output of the detecting portion is relatively large than when the output is relatively small, so that the diagnosis of the subject power source will not cause an excessive amount of consumption of the electric power of the subject power source.

(20) A power source monitoring apparatus according to any one of the above modes (1)–(19), wherein at least one of the first diagnosing device and the second diagnosing device diagnoses each subject power source on the basis of a result of comparison of the output of the detecting portion with a threshold value which is determined by the output.

Where the subject power source in abnormal in that the capacity of the subject power source to supply the electric power to the load device is abnormally reduced, the amount of drop of the voltage of the subject power source increases with an increase in the amount of electric current flowing through the subject power source. Accordingly, it is desirable that the threshold value with which the output of the detecting portion is compared to diagnose the subject power source for an abnormality be a variable which changes with the output of the detecting portion, rather than a fixed value. In the apparatus according to the above mode (20) wherein the threshold value changes with the output of the detecting portion, the subject power source can be diagnosed with a higher degree of accuracy.

(21) A power source monitoring apparatus according to the above mode (20), wherein the first diagnosing device includes means for determining the threshold value such that the threshold value is larger when the output is relatively large than when the output is relatively small.

In the power source monitoring apparatus according to the above mode (21), the amount of reduction of the output of the detecting portion or the rate of reduction of this output is compared with the threshold value. Where the subject power source is abnormal in that the capacity of the subject power source to supply the electric power is abnormally reduced, the amount or rate of voltage drop of the subject power source increases with an increase in the output of the detecting portion. In the view this fact, the present apparatus is adapted such that the threshold value with which the amount or rate of reduction of the output to diagnose the subject power source is determined to be larger when the output is relatively large than when the output is relatively small.

(22) A power source monitoring apparatus according to any one of the above modes (1)–(21), wherein at least one of the first diagnosing device and the second diagnosing device includes determining means for determining that each subject power source is abnormal, if the output of the detecting portion has been reduced to a threshold value before a predetermined time has passed after the above-indicated power supply state has been established, the determining means determining the predetermined time depending upon the output.

Where the subject power source is abnormal in that the capacity of the subject power source to supply the electric power is abnormally low, the rate of voltage drop of the subject power source increases with an increase in the electric current flowing through the subject power source. In the apparatus according to the above mode (22), the determining means determines that each subject power source is abnormal, if the output has been reduced to the threshold value within the predetermined time after the power supply state indicated above. In this case, it is desirable that the predetermined time be a variable which changes with the output of the detecting portion, rather than a fixed value. Namely, the predetermined time changes with the output which reflects the amount of electric current flowing through the subject power source. The present apparatus wherein the predetermined time is determined as described above permits the diagnosis of the subject power source with a higher degree of accuracy.

(23) A power source monitoring apparatus according to the above mode (22), wherein the determining means determines the predetermined time such that the predetermined time is shorter when the output is relatively large than when the output is relatively small.

Where the subject power source is abnormal in that the capacity of the subject power source to supply the electric power is abnormally reduced, the rate of voltage drop of the subject power source increases with an increase in the output of the detecting portion. In view of this fact, the apparatus according to the above mode (23) is adapted such that the predetermined time within which the output is compared with the threshold value to diagnose the subject power source is determined to be shorter when the output is relatively large than when the output is relatively small.

(24) A power source monitoring apparatus according to any one of the above modes (1)–(23), wherein at least one of the first diagnosing device and the second diagnosing device includes means for permitting a diagnosis of each subject power source when the load device is not required to perform an assigned function thereof.

If each subject power source is diagnosed in the above-indicated power supply state when the load device is required to operate to perform its assigned or intended function, the load device may become defective due to the diagnosis of the subject power source if the diagnosis is effected while the subject power source is abnormal.

In view of the above possibility, the apparatus according to the above mode (24) is arranged to permit the electric system to be placed in the above-indicated power supply state for the purpose of diagnosing the subject power source only when the load device is not required to perform its assigned function. This arrangement prevents the load device from being defective due to an abnormality of the subject power source.

(25) A power source monitoring apparatus according to any one of the above modes (1)–(24), wherein the load device is provided on an automotive vehicle to enable the automotive vehicle to perform an assigned function thereof, and at least one of the first diagnosing device and the second diagnosing device includes means for permitting a diagnosis of each subject power source when the automotive vehicle is in a substantially stationary state.

If the electric system is placed in the above-indicated power supply state while the vehicle is running, the vehicle may become abnormal due to an abnormality of the subject power source. While the vehicle is placed in a substantially stationary or stopped state, there is a low possibility that the vehicle becomes abnormal due to an abnormality of the subject power source.

In view of the above fact, the apparatus according to the above mode (25) is arranged to permit the electric system to be placed in the power supply state for diagnosing the subject power source only when the vehicle in a substantially stationary state. This arrangement prevents the vehicle from being defective due to an abnormality of the subject power source.

In the present apparatus, the automotive vehicle may use an internal combustion engine and/or an electric motor, as a drive power source.

(26) A power source monitoring apparatus according to the above mode (25), wherein the means for permitting a diagnosis of each subject power source permits the diagnosis immediately after the automotive vehicle has been enabled to perform the assigned function while the automotive vehicle is disabled to perform the assigned function, and/or immediately after the automotive vehicle has been disabled to perform the assigned function while the automotive vehicle is enabled to perform the assigned function.

A transition between a state wherein the vehicle is enabled or ready to perform its assigned function and a state wherein the vehicle is disabled to perform its function is established either manually by an operation performed by an operator of the vehicle, or automatically when a predetermined condition is satisfied. In the former case, the transition may be effected by an operation of a main switch (a suitable key or switch such as an ignition switch) by the vehicle operator, for example. This operation by the vehicle operator may be performed to start or terminate a running of the vehicle. In the latter case, the transition may be effected when a load acting on the vehicle operator's seat has exceeded a predetermined value, that is, when the vehicle operator is seated on the seat.

The electric system may be placed in the power supply state wherein the electric power is supplied from the at least one subject power source to the load device, without a supply of the electric power from the at least one non-subject power source to the load device, immediately after the vehicle has been enabled to perform its assigned function while the vehicle is disabled, or immediately after the vehicle has been disabled to perform its assigned function while the vehicle is enabled or ready to perform the function. The apparatus may include a connection control device which is operable when the transition indicated above takes place, so that the at least one non-subject power source is disconnected from both the at least one subject power source and the load device, as discussed below with respect to the following mode (27) of this invention. Where such a connection control device is not provided and where the at least one non-subject power source includes an electric generator (alternator) operated by a drive power source of the vehicle to generate an electric power, while the at least one subject power source includes a battery, the load device is operated with the electric power supplied from the battery, not the electric power supplied from the electric generator, immediately after the vehicle has been enabled to perform its function when the vehicle is disabled, since the amount of electric power generated by the electric generator immediately after the vehicle has been enabled is not sufficient. The power supply state in which the electric power is supplied from only the battery to the load device is also established immediately after the vehicle has been disabled when the vehicle is enabled, since the drive power source is turned off and the electric power is not generated by the electric generator after the vehicle has been disabled.

(27) A power source monitoring apparatus according to the above mode (26), further comprising a connection control device which has a connecting state wherein the at least one non-subject power source is connected to both of the at least one subject power source and the load device, and a disconnecting state wherein the at least one non-subject power source is disconnected from both of the at least one subject power source and the load device, and wherein the connection control device is operable between the connecting and disconnecting states, to thereby control flows of the electric current between the at least one non-subject power source and a series connection of the at least one subject power source and the load device, the connection control device being brought into the disconnecting state immediately after the automotive vehicle has been enabled to perform the assigned function while the automotive vehicle is disabled to perform the assigned function, and/or immediately after the automotive vehicle has been disabled to perform the assigned function while the automotive vehicle is enabled to perform the assigned function.

In the apparatus according to the above mode (27), the at least one non-subject power source is disconnected from both the at least one subject power source and the load device, so as to establish the above-indicated power supply state of the electric system, immediately after the vehicle has been enabled and/or immediately after the vehicle has been disabled. Accordingly, the present apparatus is capable of diagnosing each subject power source without an influence of the at least one non-subject power source.

(28) A power source monitoring apparatus according to the above mode (26) or (27), wherein the first diagnosing device includes means for commanding the load device to perform a predetermined operation with the electric power supplied from the at least one subject power source such that an amount of electric power of the at least one subject power source which is consumed by the load device is made equal to a predetermined value, the load device being commanded to perform the predetermined operation immediately after the automotive vehicle has been enabled to perform the assigned function while the automotive vehicle is disabled to perform the assigned function, and/or immediately after the automotive vehicle has been disabled to perform the assigned function while the automotive vehicle is enabled to perform the assigned function.

The load device may not be required to be operated to perform its assigned function immediately after the vehicle has been enabled to perform its assigned function while the vehicle is disabled to do so, or immediately after the vehicle has been disabled to perform its assigned function while the vehicle is enabled to do so. For diagnosing the subject power source for an abnormality, on the other hand, the load device is required to be operated so that the electric current flows from the subject power source to the load device. Further, for increased stability of accuracy of the diagnosis of the subject power source, the load device is desirably operated under a highly consistent condition, that is, without a variation in the amount of electric power consumed by the load device upon different operations of the load device for diagnosing the subject power source.

In view of the above, the apparatus according to the above mode (28) is arranged such that the load device is commanded to perform the predetermined operation with the electric power supplied from the at least one subject power source such that the amount of electric power of the at least one subject power source which is consumed by the load device is made equal to a predetermined value, upon each diagnosis of the subject power source immediately after the vehicle has been enabled to perform the assigned function while the vehicle is disabled to perform the function and/or immediately after the automotive vehicle has been disabled to perform the assigned function while the automotive vehicle is enabled to perform the assigned function. This arrangement assures improved stability of the predetermined operation of the load device for diagnosing the subject power source, thereby improving the accuracy of the diagnosis.

Where the load device includes an electric motor for operating a pump for delivering a highly pressurized working fluid to an accumulator in a braking system, for example, the electric motor is desirably operated immediately after the vehicle has been enabled while it is disabled or immediately after the vehicle has been disabled while it is enabled. A rise of the fluid pressure in the accumulator immediately after the vehicle has been enabled or disabled will not have a significant influence on the vehicle. In this respect, it is noted that it is desirable to raise the fluid pressure in the accumulator of the braking system immediately after the vehicle has been enabled to perform the assigned function, namely, before an activation of the braking system during functioning of the vehicle (e.g., during running of the vehicle).

(29) A power source monitoring apparatus according to any one of the above modes (25)–(28), wherein at least one of the first diagnosing device and the second diagnosing device includes means for permitting a diagnosis of each subject power source when an amount of consumption of the electric power of the at least one subject power source is larger than a threshold value.

A relatively large amount of consumption of the electric power of the at least one subject power source means a relatively high rate of change of the output of the detecting portion if the subject power source is abnormal. Accordingly, while the amount of consumption of the electric power of the subject power source is relatively large, the abnormality of the subject power source can be relatively easily detected on the basis of the output of the detecting portion even if the degree of abnormality of the subject power source is comparatively small.

Accordingly, the apparatus according to the above mode (29) is capable of detecting the abnormality of the subject power source even where the degree of this abnormality is so small that the abnormality could not be detected where the amount of consumption of the electric power of the subject power source is relatively small.

In the present apparatus, the amount of consumption of the electric power of the subject power source can be made larger than the threshold value by operating the load device as described above with respect to the above mode (28), or by operating another load device which is connected to only the at least one subject power source.

(30) A power source monitoring apparatus according to the above mode (29), wherein the automotive vehicle includes a drive power source which drives the automotive vehicle, and the electric system includes a starter which is operated by the electric power supplied by only the at least one subject power source, to start the drive power source for enabling the automotive vehicle to perform the assigned function, the diagnosis of each subject power source being permitted while the starter is operated to start the drive power source.

In the power source monitoring apparatus according to the above mode (30), the electric power is supplied from the at least one subject power source to the starter when the drive power source of the vehicle is started. The amount of consumption of the electric power of the at least one subject power source is larger when the drive power source is started by the starter with the electric power supplied from the at least one subject power source to the starter, than when the electric power is supplied from the at least one subject power source to another electrically operated device. The diagnosis of the subject power source while the amount of consumption of the electric power of the subject power source is relatively large permits easy detection of a comparatively small degree of abnormality of the subject power source on the basis of the output of the detecting portion.

Accordingly, the present apparatus is capable of detecting the abnormality of the subject power source even where the degree of this abnormality is so small that the abnormality could not be detected while the starter is not in operation to start the drive power source.

(31) A power source monitoring apparatus according to the above mode (30), wherein the first diagnosing device includes means for inhibiting a diagnosis of each subject power source while the drive power source is started without an operation of the starter.

In the apparatus according to the above mode (30), each subject power source is diagnosed on an assumption that the diagnosis is effected while the drive power source is started by the starter. However, the drive power source may be started without using the starter, for example, by so-called "manual cranking" of the drive power source wherein a torque is transmitted from drive wheels of the running vehicle to the drive power source, in place of a torque transmitted from the starter to the drive power source. If the subject power source is diagnosed during the manual cranking to start the drive power source, the diagnosis may provide an erroneous result.

In view of the above, the present apparatus is arranged to inhibit the diagnosis of each subject power source while the drive power source is started without using the starter. This arrangement improves the accuracy of diagnosis of the subject power source.

(32) A power source monitoring apparatus according to any one of the above modes (1)–(31), wherein at least one of the first diagnosing device and the second diagnosing device includes means for inhibiting a diagnosis of each subject power source when a power source other than the plurality of power sources is connected to each subject power source.

In the apparatus according to any one of the above modes (1)–(31), the diagnosis of each subject power source may provide an erroneous result if the diagnosis is effected while a power source other than the plurality of power sources indicated above is connected to each subject power source, since the electric power is not supplied from the subject power source to the load device.

In view of the above, the apparatus according to the above mode (32) is arranged to inhibit a diagnosis of each power source when another power source is connected to the subject power source. This arrangement improves the accuracy of diagnosis of each subject power source.

(33) A power source monitoring apparatus according to any one of the above modes (1)–(32), wherein the load device includes a plurality of electrically operated loads, the apparatus further comprising load limiting means for selecting at least one of the plurality of electrically operated loads as at least one operable load that is permitted to be operated with the electric power supplied from the at least one non-subject power source when at least one of the first and second diagnosing devices determines that any one of the at least one subject power source is abnormal.

In the apparatus according to the above mode (33), at least one of the plurality of electrically operated loads of the load device is selected as an operable load or loads that is/are permitted to be operated with the electric power supplied from the at least one non-subject power source, when only the at least one non-subject power source can be used to supply the electric power to the load device. Thus, the present apparatus assures a normal operation of the selected operable load or loads, even when the subject power source is abnormal.

For example, the load limiting means may include a switching device which is provided between the load device and the at least one non-subject power source, for connecting only the selected or predetermined one or ones of the electrically operated loads of the load device to the at least one non-subject power source, and disconnecting the other load or loads from the at least one non-subject power source, so that the electric power is supplied from the at least one non-subject power source to only the selected operable load or loads. Alternatively, the load limiting means may be adapted to limit the amount of electric power to be supplied to a selected or predetermined one or ones of the loads, so that the selected load or loads cannot be operated while the other load or loads can be operated.

(34) A power source monitoring apparatus according to the above mode (33), wherein the load limiting means includes selecting means for selecting the at least one operable load from the plurality of electrically operated loads, according to priorities which are respectively given to the plurality of electrically operated loads such that the priorities increase in the order of importance of functions performed by the electrically operated loads on an automotive vehicle.

The automotive vehicle equipped with the apparatus according to the above mode (34) is capable of performing its basic functions even when the subject power source is abnormal.

Where the load device includes a braking system, a steering device, head lights, power windows and an air conditioning system, for instance, the priorities of these electrically operated loads may be determined such that the priorities decrease in the order of description. Namely, the highest priority is given to the braking system while the lowest priority is given to the air conditioning system, in this specific example.

(35) A power source monitoring apparatus according to any one of the above modes (1)–(34), further comprising power consumption limiting means for limiting an amount of electric power consumed by the load device when at least one of the first and second diagnosing devices determines that any one of the at least one subject power source is abnormal, such that the limited amount is smaller than an amount normally consumed by the load device.

As described above, the amount of electric power consumed by the load device can be reduced by selecting the at least one operable load that is permitted to be operated, or by limiting the amount of electric power to be supplied to the load device.

(36) A power source monitoring apparatus according to the above mode (34) or (35), wherein the load limiting means includes power consumption limiting means for limiting an amount of electric power consumed by the at least one operable load selected by the selecting means when the first diagnosing device determines that any one of the at least one subject power source is abnormal, such that the limited amount is smaller than an amount normally consumed by the at least one operable load.

The amount of electric power consumed by the load device can be further reduced by reducing the amount of electric power consumed by the selected at least one operable load.

(37) A power source monitoring apparatus according to any one of the above modes (1)–(36), further comprising a third diagnosing device which diagnoses the at least one non-subject power source on the basis of the output of the detecting portion.

In the apparatus according to the above mode (37), the output of the detecting portion is utilized to diagnose both the at least one subject power source and the at least one non-subject power source. Thus, the present apparatus capable of diagnosing the at least one non-subject power source as well as the at least one subject power source can be made relatively simple without the use of an exclusive detecting portion for the at least one non-subject power source.

(38) A power source monitoring apparatus according to any one of the above modes (1)–(37), wherein the detecting portion includes a voltage detecting portion which detects a voltage of the load device, and the electric system includes a voltage regulating device which feedback-controls a voltage of the at least one non-subject power source to a predetermined value on the basis of the voltage detected by the voltage detecting portion.

In the apparatus according to the above mode (38), the detecting portion can be used for controlling the voltage of the at least one non-subject power source as well as diagnosing the at least one subject power source.

Accordingly, the electric system can be made relatively simple without the use of an exclusive detecting portion for controlling the voltage of the at least one non-subject power source.

For example, the voltage regulating device may be a DC/DC converter or regulator as described below.

(39) A power source monitoring apparatus according to the above mode (38), wherein the first diagnosing device commands the voltage regulating device to establish the power supply state wherein the electric power is permitted to be supplied from only the subject power source to the load device.

In the apparatus according to the above mode (39), the voltage regulating device is used for diagnosing the at least one subject power source as well as controlling the voltage of the at least one non-subject power source. Accordingly, the electric system can be made relatively simple without the use of an exclusive voltage regulating device for establishing the power supply state for diagnosing the subject power source.

(40) A power source monitoring apparatus according to any one of the above modes (1)–(39), wherein the electric system includes a supply power regulating device including (a) an electric power regulating portion provided between the at least one subject power source and the load device, to regulate an electric power to be supplied from the at least one subject power source to the load device, and (b) a control portion which controls an operating state of the electric power regulating portion so that an amount of electric power to be supplied to the load device is equal to a predetermined value, and wherein the detecting portion detects the operating state of the electric power regulating portion.

The operating state of the electric power regulating portion is controlled by the control portion, so that the amount of electric power to be supplied from the at least one subject power source to the load device is regulated to the predetermined value. In other words, the operating state of the electric power regulating portion is determined by the voltage of the at least one subject power source and the known amount of electric power required to operate the load device. Where the known amount of electric power required for the load device is constant, the operating state of the electric power regulating portion is determined by the voltage of the at least one subject power source. Accordingly, each subject power source can be diagnosed on the basis of the voltage of the at least one subject power source which can be detected by detecting the operating state of the electric power regulating portion.

(41) A power source monitoring apparatus according to the above mode (40), wherein the electric power regulating portion includes a DC/DC converter including (a) a plurality of switching elements which convert a direct current of the at least one subject power source into an alternating current, (b) a transformer which regulates a voltage of the alternating current, and (c) an AC/DC converting element which converts the alternating current whose voltage has been regulated by the transformer, into a direct current, and the control portion includes a duty ratio control portion which alternately turns on and off the plurality of switching elements at a duty ratio determined by the amount of electric power supplied to the load device and the voltage of the at least one subject power source, and wherein the detecting portion includes a duty ratio detecting portion which detects the duty ratio of the switching elements.

Where the amount of electric power supplied to the load device is constant, the duty ratio of the switching elements is made higher when the voltage of the at least one subject power source is relatively high than when the voltage is relatively low. Accordingly, the voltage of the at least one subject power source can be detected on the basis of the duty ratio of the switching elements. For instance, where the duty ratio is higher than a predetermined threshold, the voltage of the subject power source under diagnosis is lower than a preset level, whereby the subject power source can be determined to be abnormal. The detecting portion may be adapted to detect the duty ratio by detecting the amount of electric current flowing through the switching elements, or determine the duty ratio by obtaining a command value which is generated from the control portion and which represents the duty ratio. The duty ratio may be defined as a ratio of an on time to an off time of the switching elements, or a ratio of the on time to a control cycle time which is a sum of the on time and the off time.

(42) A power source monitoring apparatus according to any one of the above modes (1)–(41), wherein the at least one non-subject power source consists of an electric generator which is operated to generate an electric power, by a drive power source provided to drive an automotive vehicle on which the power source monitoring apparatus is provided, and wherein the first diagnosing device diagnoses each subject power source when the drive power source is turned on, and/or when the drive power source is turned off.

When the drive power source has just been started or turned on, the operating speed of the electric generator has not yet been raised to a value high enough to generate an electric power to be supplied to the load device. When the drive power source is stopped or turned off, the electric generator is also turned off, and no electric power is supplied from the electric generator to the load device. In these cases, therefore, the electric system is placed in the power supply state wherein the electric power is supplied from only the at least one subject power source to the load device, so that the first diagnosing device can diagnose each subject power source. A condition that the vehicle drive power source has been turned on or off may be considered to mean that the vehicle has been enabled to perform its assigned function while the vehicle is disabled to perform the assigned function, or that the vehicle has been disabled to perform the assigned function while the vehicle is enabled to perform the assigned function.

(43) A power source monitoring apparatus according to any one of the above modes (1)–(42), wherein the first diagnosing device includes a composite diagnosing portion on the basis of an output of the detecting portion immediately after an automotive vehicle on which the power source monitoring apparatus is provided has been enabled to perform an assigned function thereof while the automotive vehicle is disabled to perform the assigned function, and an output of the detecting portion immediately after the automotive vehicle has been disabled to perform the assigned function while the automotive vehicle is enabled to perform the assigned function.

In the apparatus according to the above mode (43), the first diagnosing device is adapted to diagnose each subject power source on the basis of not only the output of the detecting portion immediately after the vehicle has been enabled to perform its assigned function, but also the output of the detecting portion immediately after the vehicle has been disabled to perform its assigned function. Where a diagnosis on the basis of the output of the detecting portion immediately after the vehicle has been disabled to perform its function reveals that the subject power source is abnormal, while a diagnosis on the basis of the output immediately after the vehicle has been enabled to perform its assigned function reveals that the subject power source is normal, there is a possibility that the vehicle has been enabled to perform its function by connecting the subject power source to an external assisting power source (through a booster cable, for example). In this case, the subject power source is actually in an abnormal state (e.g., in a deteriorated state), although the former diagnosis apparently indicates that the subject power source is normal. In this case, therefore, it is appropriate that the first diagnosing device determine that the subject power source is abnormal.

(44) A power source monitoring apparatus according to claim 1, wherein the at least one electrically operated load of the load device includes (a) a drive power source of an electrically operated hydraulic pressure source capable of pressurizing a working fluid, (b) a solenoid coil of a solenoid-operated control valve capable of controlling a pressure of the working fluid to be applied to a hydraulically operated brake in a braking system, and (c) a computer which constitutes a major portion of a hydraulic pressure control device which controls the pressure of the hydraulically operated brake, by controlling at least one of an electric energy to be supplied to the drive power source and an electric energy to be supplied to the solenoid coil, and wherein the drive power source, the solenoid coil and the computer are operable with an electric power supplied from an electric power source device which includes the plurality of power sources.

(45) A power source monitoring apparatus according to the above mode (44), wherein the electric power source device consists of a first power source unit including at least one of the plurality of power sources, and a second power source unit including at least one of the plurality of power sources which is other than the at least one power source of the first power source unit, and the solenoid coil and the computer are connected to both of the first and second power source units, while the drive power source of the hydraulic pressure source is connected to the electric power source device such that the drive power source is operated with the electric energy supplied from only the second power source unit, and wherein at least one of the first and second power source units includes at least one of the at least one subject power source.

In the apparatus according to the above mode (45), at least one of the first and second power source units of the power source device includes at least one subject power source, and each of the first and second power source units includes at least one subject power source and/or at least one non-subject power source. Each of the first and second power source units may include at least one subject power source only, or at least one non-subject power source, or alternatively at least one subject power source and at least one non-subject power source.

There will be described a case where the first power source unit consists of at least one subject power source while the second power source unit consists of at least one non-subject power source. Where a switching device as described above with respect to the above mode (6) or (7) is provided between the second power source unit, and the computer, solenoid coil and first power source unit, this switching device enables the electric system to be placed in the above-indicated power supply state wherein the electric power is supplied to the solenoid coil and the computer from only the first power source unit. The first power source unit can be diagnosed by the first diagnosing device on the basis of the voltage of the first power source unit which is detected by the detecting portion in the power supply state indicated above.

If the diagnosis reveals that the first power source unit is abnormal, the drive power source of the hydraulic pressure source and the solenoid coil of the solenoid-operated control valve can be operated with the electric power supplied from the second power source unit, so that the pressure of the brake can be controlled normally within the capacity range of the second power source unit. While the first power source unit is abnormal, the voltage of the solenoid coil, for instance, may suddenly drops when the load current of the solenoid coil has exceeded the electric current supplied from the second power source device (i.e., maximum supply current of the second power source device minus the current consumed by the drive power source), because the electric current is not supplied from the abnormal first power source unit. In view of this, it is desirable to limit or restrict the operation of the solenoid coil or inhibit the drive power source, for example, if the first power source unit is detected to be abnormal. The restriction of operation of the solenoid coil and the inhibition of operation of the drive power source may be effected when the first power source device is detected to be abnormal, or when the sum of the load currents of the solenoid coil and the drive power source has exceeded a predetermined upper limit determined by the maximum current of the second power source unit.

There will next be described a case where the first power source unit consists of at least one non-subject power source while the second power source unit consists of at least one subject power source. Since the braking system for which the apparatus according to the above mode (45) is used is adapted such that the drive power source of the hydraulic pressure source is operated with the electric power supplied from only the second power source unit, the second power source unit can be diagnosed on the basis of the pressure of the hydraulic pressure source. For instance, the second power source unit can be determined to be abnormal if the pressure of the hydraulic pressure source does not rise above a predetermined level within a predetermined time after the moment of initiation of the operation of the drive power source.

If the diagnosis reveals that the second power source unit is abnormal, the electric power is not supplied to the drive power source of the hydraulic pressure source, so that the drive power source is turned off. On the other hand, the solenoid coil and the computer can be operated by the first power source unit which is normal. Where the hydraulic pressure source includes an accumulator, the pressure of the brake can be controlled by the solenoid coil energized with the electric power from the first power source unit, by utilizing the pressurized fluid stored in the accumulator, if the pressure of this pressurized fluid is higher-than a given level, even if the drive power source is held off.

There will be described a case where the second power source unit consists of both the subject power source in the form of a battery and the non-subject power source in the form of an electric generator. The electric generator is operated to generate an electric energy, by a vehicle drive power source. The battery is diagnosed on the basis of the pressure of the pressurized fluid delivered by the electrically operated hydraulic pressure source, as described above, in the power supply state of the electric system wherein the electric power is supplied to the drive power source of the hydraulic pressure source from only the battery. This power supply state may be established when the vehicle drive power source has been turned on or off.

(46) A power source monitoring apparatus according to the above mode (44), wherein the electrically operated hydraulic pressure source includes a low-pressure pump, and a high-pressure pump whose delivery pressure is higher than that of the low-pressure pump and whose delivery rate is lower than that of the low-pressure pump, and the drive power source includes a low-pressure pump motor and a high-pressure pump motor for operating the low-pressure and high-pressure pumps, respectively, and wherein the solenoid coil, the computer and the high-pressure pump motor are connected to the at least one subject power source and the at least one non-subject power source whose voltage is higher than the voltage of the at least one subject power source, and the low-pressure pump motor is connected to the electric power source device such that the low-pressure pump motor is operated with the electric energy supplied from only the at least one non-subject power source.

In the braking system equipped with the power source monitoring apparatus according to the above mode (46), the pressure of the hydraulically operated brake is controlled by controlling at least one of the low-pressure is and high-pressure pump motors, and the solenoid coil of the solenoid-operated control valve. When the brake operating member is operated in a normal manner, the brake is activated primarily with the pressurized fluid delivered from the low-pressure pump operated by the low-pressure pump motor. When the desired rate of increase of the brake pressure is relatively high with a relatively high operating speed of the brake operating member, or when the desired level of the brake pressure is relatively high with a relatively large amount of operation of the brake operating member, the high-pressure pump is also operated by the high-pressure pump motor. Thus, the frequency of operation of the low-pressure pump motor is higher than that of the high-pressure pump motor, and the cumulative operating time of the low-pressure pump motor is longer than that of the high-pressure pump motor. Accordingly, it is appropriate that the low-pressure pump motor is operated with the electric energy or power of a relatively high voltage, while the high-pressure pump motor is operated with the electric energy or power of a relatively low voltage.

The voltage drop of a wire harness or cable for the low-pressure pump motor can be reduced where the low-pressure pump motor having the relatively long cumulative operating time (requiring the relatively large amount of electric power) is operated with the electric power having a relatively high voltage and a relatively low amount of electric current. In this case, therefore, the energy efficiency of the low-pressure pump motor can be improved. The high-pressure pump motor having the relatively short cumulative operating time (the relatively low frequency of operation) can be operated with the comparatively small amount of electric current, so that this motor may be a brush motor, since the amount of wear of the brushes is relatively small, and the energy loss due to sliding of the brushes is relatively small. Further, the use of the brush motor as the high-pressure pump motor is available at a comparatively low cost. On the other hand, the low-pressure pump motor operated at the relatively high voltage and having the relatively low frequency of operation is desirably a brushless motor, for improving the energy efficiency and increasing the expected service life.

When the diagnosis reveals that the subject power source is abnormal, the high-pressure pump motor may be turned off, since the brake pressure can be controlled by controlling the low-pressure pump motor and the solenoid coil of the solenoid-operated control valve, even with the high-pressure pump motor being off.

(47) A power source monitoring apparatus according to any one of the above modes (1)–(43), which is provided on an automotive vehicle including (a) a drive power source, (b) the electric system including the load device connected to the plurality of power sources, and (c) a disconnecting circuit for temporarily disconnecting the at least one non-subject power source from the load device when the drive power source is started, and the at least one subject power source includes at least one of the plurality of power sources which is not temporarily disconnected by the disconnecting circuit from the load device, and wherein the detecting portion detects at least one of a voltage and an electric current of at least one of the load device and the at least one non-subject power source, and the first diagnoses device diagnosing each of the at least one subject power source on the basis of at least one of the output of the detecting portion and a rate of change of the output, when the drive power source of the automotive vehicle is started.

When the vehicle drive power source is started, an unexpected operation of the load device will not cause an inconvenience to the automotive vehicle, since the vehicle is usually stationary upon starting of the vehicle drive power source. Therefore, there arises no inconvenience to the vehicle even if the subject power source is abnormal when the vehicle drive power source is started. On the other hand, the at least one non-subject power source is temporarily disconnected from the load device. Accordingly, the apparatus according to the above mode (47) does not cause any inconvenience to the automotive vehicle due to an abnormality of any subject power source when the subject power source is diagnosed. In addition, the electric system is automatically placed in a suitable state for effecting the diagnosis of each subject power source, namely, in the power supply state in which the electric power is permitted to be supplied to the load device from only the at least one subject power source. That is, the electric system includes the disconnecting circuit for establishing the above-indicated power supply state upon starting of the vehicle drive power source, for a purpose other than the diagnostic purpose, and this disconnecting circuit can be utilized for the present power source monitoring apparatus. Accordingly, the present apparatus is not required to include means for establishing the above-indicated power supply state for the diagnostic purpose, and the complexity of operation of the apparatus required to effect the diagnosis can be avoided.

(48) A power source control apparatus provided in an electric system including (a) at least one subject power source, (b) at least one non-subject power source, (c) a load device connected to the at least one subject power source and the at least one non-subject power source and having at least one electrically operated load, and (d) a voltage regulating portion which is provided between the load device and at least one of the at least one non-subject power source and which regulates a voltage of the at least one of the at least one non-subject power source so that the regulated voltage is applied to the load device, the power source control apparatus comprising:

a power source monitoring device which diagnoses each of the at least one subject power source; and a supply voltage reducing device for controlling the voltage regulating portion such that a voltage to be applied to the load device is lower when the power source monitoring device has determined that any one of the at least one subject power source is abnormal, than when the power source monitoring device has determined that the at least one subject power source is normal.

When the at least one subject power source is normal, the electric current is applied to the load device from not only the at least one non-subject power source but also the at least one subject power source, where the amount of electric current to be consumed by the load device (i.e., load current) is larger than the maximum electric current that can be supplied from the at least one non-subject power source. Where any one of the at least one subject power source is abnormal, no electric current is applied from the at least one subject power source to the load device, and the voltage of the load device suddenly drops, making it impossible to assure a normal operation of a computer which is one of the electrically operated loads of the load device. In this respect, it is desirable to limit the operation of the load device, as described above, so that the amount of electric current consumed by the load device will not exceed the maximum current of the at least one non-subject power source. However, the load current may become excessively large before the operation of the load device is limited upon detection of an abnormality of any one of the at least one subject power source. In view of this, the present power source control apparatus is arranged to control the voltage regulating portion such that the voltage to be applied to the load device is lowered to a level higher than the lowest level that permits a normal operation of the computer included in the load device. This arrangement permits a temporary increase of the electric current applied to the load device, and thereby prevents a sudden voltage drop of the load device, assuring a normal operation of the computer with an appropriate voltage applied thereto.

The power source monitoring device may have any technical features described above with respect to the above-described modes (1)–(43) of this invention.

(49) A power source control apparatus according to the above mode (48), wherein the supply voltage reducing device includes means for controlling the voltage regulating portion to reduce the voltage to be applied to the load device, when an amount of electric power consumed by the load device has exceeded a predetermined upper limit.

When the power source monitoring device detects an abnormality of any subject power source, the voltage to be applied to the load device need not be reduced immediately after the detection of the abnormality. Namely, the voltage may be reduced only after the amount of electric power or current consumed by the load device exceeds the predetermined upper limit. The upper limit is desirably determined on the basis of the maximum current that can be applied from the at least one non-subject power source to the load device. For example, the upper limit may be equal to the maximum current indicated above, or may be slightly smaller than the maximum current.

(50) A power source monitoring apparatus for monitoring a state of a low-voltage power source in an electric system wherein a load device having at least one electrically operated load is connected to the low-voltage power source and a high-voltage power source, the power source monitoring apparatus comprising:

a detecting portion which detects at least one of a voltage and an electric current of at least one of the load device, the high-voltage power source and the low-voltage power source; and a diagnosing device which diagnoses the low-voltage power source for an abnormality on the basis of at least one of an output of the detecting portion and a rate of change of the output, while an electric power is supplied to the load device from both of the high-voltage power source and the low-voltage power source, without temporary disconnection of the high-voltage power source from the load device or temporary limitation of the electric power supplied from the high-voltage power source to the load device.

Like the power source monitoring apparatus according to the above mode (14), the power source monitoring apparatus according to the above mode (50) does not suffer from a problem that the load device cannot be operated due to the diagnosis of the low-voltage power source. Further, the low-voltage power source can be diagnosed without having to temporarily disconnect the high-voltage power source from the load device or temporarily limiting the electric power supplied from the high-voltage power source to the load device.

(51) A power source monitoring apparatus according to the above mode (50), wherein the diagnosing device includes means for determining that the electric power is supplied from both of the high-voltage and low-voltage power sources to the load device, if a first condition is satisfied or if the first and a second condition are both satisfied, the first condition being satisfied when an amount of electric current supplied from the high-voltage power source to the load device is substantially equal to a maximum amount of electric current that can be supplied from the high-voltage power source to the load device, and the second condition being satisfied when a voltage of the high-voltage power source is substantially equal to that of the low-voltage power source.

The apparatus according to the above mode (51) diagnoses the low-voltage power source, in the same manner as described above with respect to the apparatus according to the above mode (15).

(52) A braking system comprising:
a hydraulically operated brake;
an electrically operated hydraulic pressure source including a drive power source and pressurizing a working fluid;
a solenoid-operated control valve including a solenoid coil and capable of controlling a pressure of the working fluid to be applied to the hydraulically operated brake; and
a hydraulic pressure control device which controls the pressure of the hydraulically operated brake, by controlling at least one of an electric energy to be supplied to the drive power source of the electrically operated hydraulic pressure source and an electric energy to be supplied to the solenoid coil,
and wherein at least one of the drive power source and the solenoid coil is connected to a plurality of electric power sources which include at least one subject power source, and the hydraulic pressure control device includes an abnormality-handling pressure control portion which is operated when any one of the at least one subject power source is abnormal, to control at least one of the electric energy to be supplied to the drive power source and the electric energy to be supplied to the solenoid coil, in an abnormality-handling manner which is different from a normal manner in which the at least one of the electric energies is controlled when none of the at least one subject power source is abnormal.

The diagnosis to determine whether any subject power source is abnormal or not may be effected by an appropriate power source monitoring device, which may be a part of the hydraulic pressure control device or a device independent of the hydraulic pressure control device.

The electrically operated hydraulic pressure source may or may not include an accumulator. Where the hydraulic pressure source includes an accumulator, the drive power source of the hydraulic pressure source is an electric motor for driving a pump which is capable of delivering a pressurized working fluid to the accumulator. Where the hydraulic pressure source does not include an accumulator, the drive power source is an electric motor for driving a pump capable of delivering a pressurized working fluid to the hydraulically operated brake.

The solenoid-operated control valve may be a solenoid-operated shut-off valve or a linear solenoid pressure control valve, for instance. Where the solenoid-operated control valve is a solenoid-operated shut-off valve, the electric current to be applied to the solenoid coil of the shut-off valve is controlled so as to control the duty ratio of the solenoid coil. Where the solenoid-operated control valve is a linear solenoid pressure control valve is provided, the electric current to be applied to the solenoid coil of the linear pressure control valve is controlled according to the desired pressure to be applied to the hydraulically operated brake.

When none of the at least one subject power source is abnormal, the pressure of the hydraulically operated brake is controlled in the normal manner. When any one of the at least one subject power source is abnormal, the pressure of the brake is controlled in the abnormality-handling manner different from the normal manner.

An example of control of the brake pressure in the normal manner will first be discussed briefly. Where the electrically operated hydraulic pressure source includes an accumulator, the electric energy to be supplied to the drive power source is controlled so that the fluid pressure in the accumulator is held within a predetermined range. Where the hydraulic pressure source does not include an accumulator, the electric energy to be supplied to the drive power source is controlled so that the pressure of the pressurized fluid delivered from the hydraulic pressure source coincides with a predetermined level. On the other hand, the electric energy to be supplied to the solenoid coil of the solenoid-operated control valve is controlled so that the pressure of the brake coincides with a desired level. The pressure of the brake is raised or reduced by controlling the solenoid-operated control valve, so as to selectively establish fluid communication of a cylinder of the brake with either the hydraulic pressure source or a low-pressure source. Where the present braking system is used for an automotive vehicle, for example, the desired level of the brake pressure may be determined by a desired braking force as represented by the amount of operation of a brake operating member by the vehicle operator, when the brake pressure is controlled in a normal manner. Alternatively, the desired level of the brake pressure may be determined so as to hold the amount or degree of slipping of a wheel of the vehicle in an optimum range, when the brake pressure controlled in an anti-lock control fashion.

Then, the control of the brake pressure in the abnormality-handling manner will be described. This abnormality-handling control manner may be referred to as a "specific control" as distinguished from the normal control described above. For instance, this specific control may be formulated to inhibit operations of electrically operated load or loads of the load device, which operations are not necessary to assure a safe running of the automotive vehicle, and to permit operations of selected ones of the electrically operated loads, which operations can be performed with the capacity of the at least one non-subject power source which is at least one electric power source other than the at least one subject power source.

Described in detail, the amounts of electric energies to be supplied to the drive power source of the hydraulic pressure source and the solenoid coils of the solenoid-operated control valve may be both zeroed, for instance. The braking system may include a master cylinder which is mechanically operated by an operation of the brake operating member by the vehicle operator, to deliver a pressurized fluid, and be arranged such that the solenoid-operated control valve is brought to an operating state for fluid communication between the master cylinder and the brake cylinder when the solenoid coil of the control valve is de-energized with no electric energy being supplied thereto. In this case, the de-energization of the solenoid coil permits an activation of the brake with the pressurized fluid delivered from the master cylinder.

Where the electrically operated hydraulic pressure source includes an accumulator, only the amount of electric energy to be supplied to the solenoid coil of the solenoid-operated control valve may be controlled, with no electric energy being supplied to the electric motor which drives the pump to deliver the pressurized fluid to the accumulator may be zeroed. If the pressure of the hydraulic pressure source (the pressure of the accumulator) is higher than a given lower limit, the brake pressure can be controlled by utilizing the pressure of the accumulator. It is possible that the control of the solenoid coil is not effected in the normal braking operation, but is effected only in the anti-lock pressure control operation. In the normal braking operation, the brake is activated with the pressurized fluid delivered from the master cylinder, without consuming an electric energy for the drive power source and the solenoid-operated control valve. In the anti-lock pressure control operation initiated when the amount of slipping of the vehicle wheel has become excessively large with respect to the friction coefficient of the road surface, the electric energy to be supplied to the solenoid coil is controlled s as to hold the vehicle wheel in an optimum slipping state. This arrangement is desirable as a whole.

In the braking system according to the above mode (52), the power source monitoring apparatus according to any one of the above modes (1)–(43) may be employed to detect an abnormality of any one of the at least one subject power source.

(53) A method of monitoring a state of each of at least one subject power source which consists of at least one of a plurality of electric power sources in an electric system wherein a load device is electrically connected to the plurality of electric power sources, the method comprising the steps of:

detecting at least one of a voltage and a current of at least one of the load device, the at least one subject power source and at least one non-subject power source which consists of the plurality of electric power sources except the at least one subject power source; and diagnosing each subject power source for an abnormality on the basis of at least one of the at least one of the voltage and the current and a rate of change of the at least one of the at least one of the voltage and the current, while the electric system is placed in a power supply state wherein an electric power is permitted to be supplied from only the subject power source to the load device.

Like the power source monitoring apparatus according to the above mode (1), the monitoring method according to the above mode (53) permits a diagnosis of each subject power source without an influence of the non-subject power source or sources.

It is noted that the description given above on the apparatus of the above mode (1) substantially applies to the present monitoring method.

(54) A method according to the above mode (53), wherein the power supply state is established with a temporary limitation of the electric power to be supplied from the at least one non-subject power source to the load device, without a temporary disconnection of the at least one non-subject power source from the load device.

For the same reason as described above with respect to the above mode (4), the method according to the above mode (54) is effective to reduce the possibility that the load device becomes defective or abnormal due to an abnormally low voltage of the subject power source.

It is noted that the description given above on the apparatus of the above mode (4) substantially applies to the present monitoring method.

(55) A method of monitoring a state of a low-voltage power source in an electric system wherein a load device having at least one electrically operated load is electrically connected to the low-voltage power source and a high-voltage power source, the method comprising the steps of:

detecting at least one of a voltage and a current of at least one of the high-voltage and low-voltage power sources; and diagnosing the low-voltage power source for an abnormality on the basis of at least one of the at least one of the voltage and the current and a rate of change of the at least one of the at least one of the voltage and the current, while the electric system is placed in a power supply state wherein an electric power is permitted to be supplied from at least the low-voltage power source.

Like the power source monitoring apparatus according to the above mode (1), the monitoring method according to the above mode (55) permits a diagnosis of the low-voltage power source without an influence of the high-voltage power source.

It is noted that the description given above on the apparatus of the above mode (1) substantially applies to the present monitoring method.

(56) A method according to the above mode (55), wherein the power supply state is established with a temporary limitation of the electric power to be supplied from the high-voltage power source to the load device, without a temporary disconnection of the high-voltage power source from the load device.

For the same reason as described above with respect to the above mode (4), the method according to the above mode (56) is effective to reduce the possibility that the load device becomes defective or abnormal due to an abnormally low voltage of the low-voltage power source.

It is noted that the description given above on the apparatus of the above mode (4) substantially applies to the present monitoring method.

(57) A method according the above mode (56), wherein the power supply state includes a state wherein the electric power is supplied to the load device from both of the high-voltage and low-voltage power sources.

For the same reason as described above with respect to the above mode (14), the monitoring method according to the above mode (57) does not suffer from a problem that the load device cannot be operated due to the diagnosis of the low-voltage power source. Further, the low-voltage power source can be diagnosed without having to temporarily disconnecting the high-voltage power source from the load device or temporarily limiting the electric power supplied from the high-voltage power source to the load device.

(58) A method according to any one of the above modes (53)–(57), wherein the low-voltage power source includes a battery which is charged by the high-voltage power source.

BRIEF DESCRIPTION OF THE DRAWINGS

The above and optional objects, features, advantages, technical and industrial significance of this invention will be better understood by reading the following detailed description of presently preferred embodiments of the invention, when considered in connection with the accompanying drawings, in which:

FIG. 8 is a graph for explaining a change in a relationship between the load current and load voltage, with a change in the operating state of an auxiliary power source 42;

FIG. 9 is a graph for explaining a change in a chronological change of the load voltage, with a change in the operating state of the auxiliary power source 42;

FIG. 11 is a view showing conditions used in the diagnostic routine of FIG. 7;

DETAILED DESCRIPTION OF THE PREFERRED EMBODIMENTS

Referring to the accompanying drawings, there will be described in detail some presently preferred emobidiments of this invention.

Figure 1:
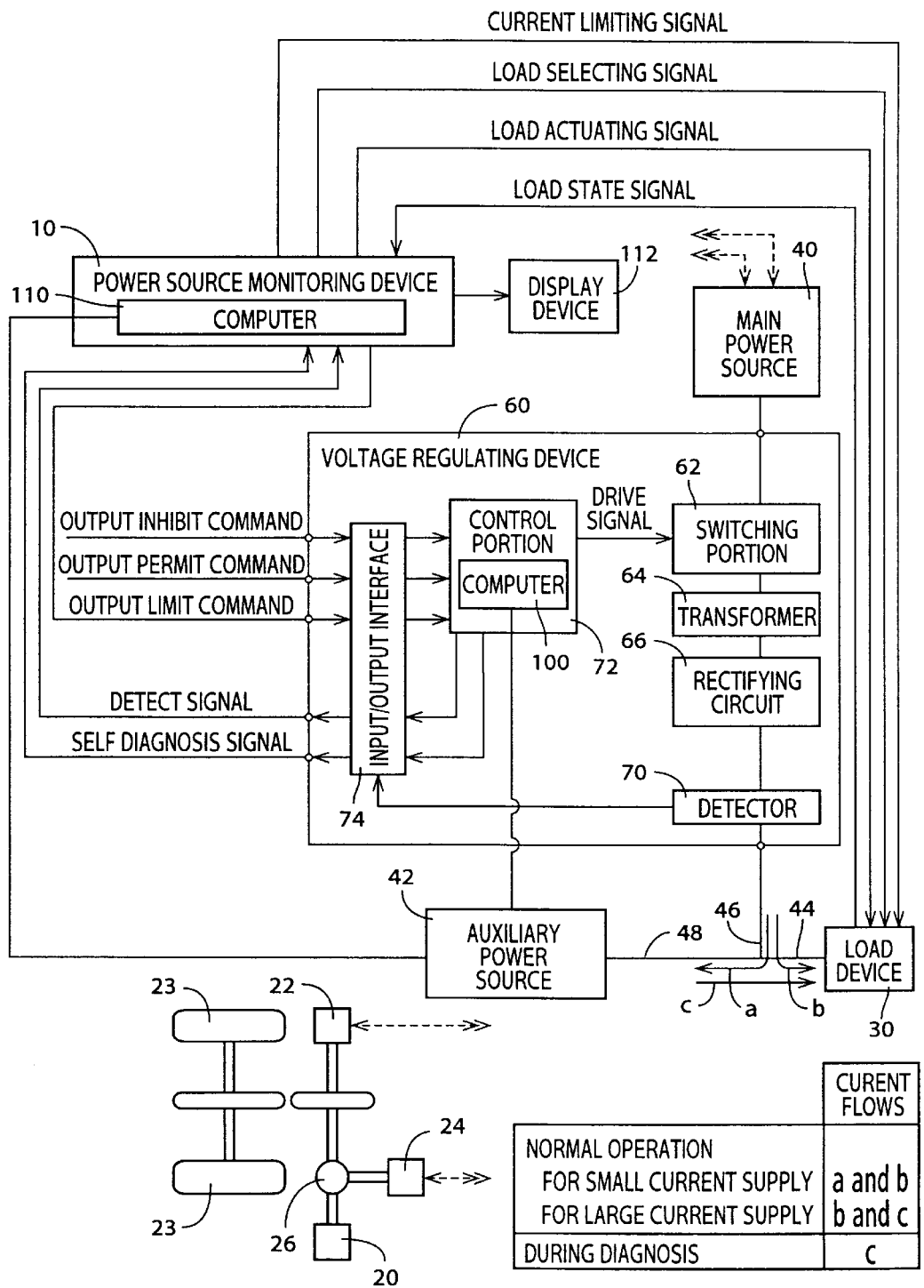
FIG. 1 is a block diagram showing a power source monitoring device apparatus constructed according to one embodiment of this invention, and electrical devices connected to the power source monitoring device.

There is shown in FIG. 1 a powr source monitoring apparatus which is constructed according to a first embodiment of the preesnt invention and which includes a power source monitoring apparatus 10. The power source monitoring apparatus is installed on an automotive vehicle equipped with a drive power source and an electric system. The drive power source consists of an internal combustion engine 20 and an electric motor 22. Namely, the automotive vehicle employs a hybrid type drive power source. As shown in the lower left part of FIG. 1, the vehicle is further equipped with a power distribution mechanism 26 provided for distributing a drive power of the engine 20 to drive wheels 23 for driving the vehicle, and to an electric generator 24 for generating an electric power or energy. The electric system includes a plurality of electric power sources to which there are connected a plurality of electrically operated loads or devices, which are collectively referred to as "a load device 50".

In the present embodiment, the plurality of electric power sources consist of a main power source 40 and an auxiliary power source in the form of an auxiliary battery 42. The main power source 40 is principally constituted by a primary battery which is charged by a selected one of the electric motor 22 and the electric generator 24, which serve as battery charging devices. The electric motor 22, the electric generator 24 and the primary battery of the main power source 40 will be described in detail. The main power source 40 has a nominal voltage higher than that of the auxiliary battery 42, and the auxiliary battery 42 is adapted to be charged by the main power source 40.

The load device 30 is electrically connected to the main power source 40 through a common conduit 44 and a primary power source conduit 46, and to the auxiliary battery 42 through the common conduit 44 and an auxiliary power source conduit 48.

Figure 2:
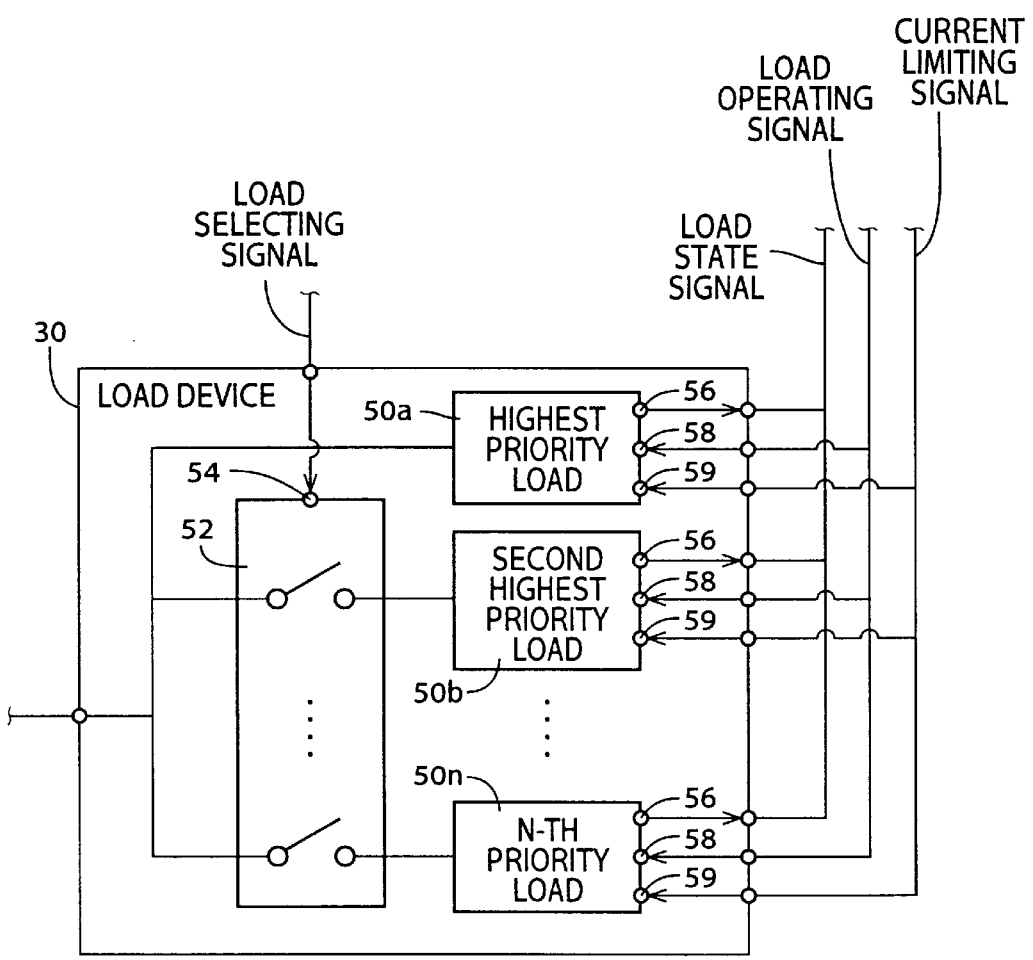
FIG. 2 is a block diagram showing in detail a load device 30 including some of the electrical devices of FIG. 1.

Reference is now made to FIG. 2, wherein the load device 30 is shown in detail. The load device 30 includes a plurality of loads 50 (electrically operated devices) and a selector switch device 52.

The plurality of loads 50 are provided for enabling the automotive vehicle to function as intended. The loads 50 may include: an electrically operated power steering device; an electrically operated fuel pump; an electrically operated compressor for an air conditioner; head lights; electric motors for power windows; an electric motor or motors for a window wiper or wipers; an electrically operated braking system (including electric motors for pumps, electric motors for actuating brake pads with friction members, solenoid-operated control valves for controlling pressures and direction of flow of a working fluid, etc.); and audio devices. The individual loads 50 are given different priorities in the order of importance of their functions assigned in the automotive vehicle. For instance, the load 50a associated with the electrically operated braking system is given the highest priority, and the load 50b associated with the electrically operated power steering device is given the second highest priority.

The selector switch device 52 is provided for selectively connecting each of the loads 50 except the load 50a having the highest priority, to the main power source 40 and the auxiliary battery 42. The selector switch device 52 has a plurality of switching elements associated with the plurality of loads 50. The load 50a having the highest priority is held connected to both the main power source 40 and the auxiliary battery 42. The selector switch device 52 has an input terminal 54 which receives a LOAD SELECTING signal for controlling the switching elements so as to select the loads 50 that are connected to the main power source 40 and the auxiliary battery 42.

Each of the loads 50 has three terminals, which consist of: (a) an output terminal 56 for generating a LOAD STATE signal indicative of the operating state of the load 50 in question; (b) an input terminal 58 for receiving a LOAD OPERATING signal for operating the load 50 in question; and (c) an input terminal 59 for receiving a CURRENT LIMITING signal for limiting the maximum value of an electric current that can be applied to the load 50 in question.

As shown in FIG. 1, the electric system further includes a voltage regulating device 60, as shown in FIG. 1. The voltage regulating device 60 is connected to the main power source conduit 46, and incorporates a switching portion 62, a transformer 64, a rectifying circuit 66, a detector 70, a control portion 72, and an input/output (I/O) interface 74. It is noted that the transformer 64 which is indicated in parenthesis in FIG. 1 is not an element essential to the voltage regulating device 60.

Figure 3:
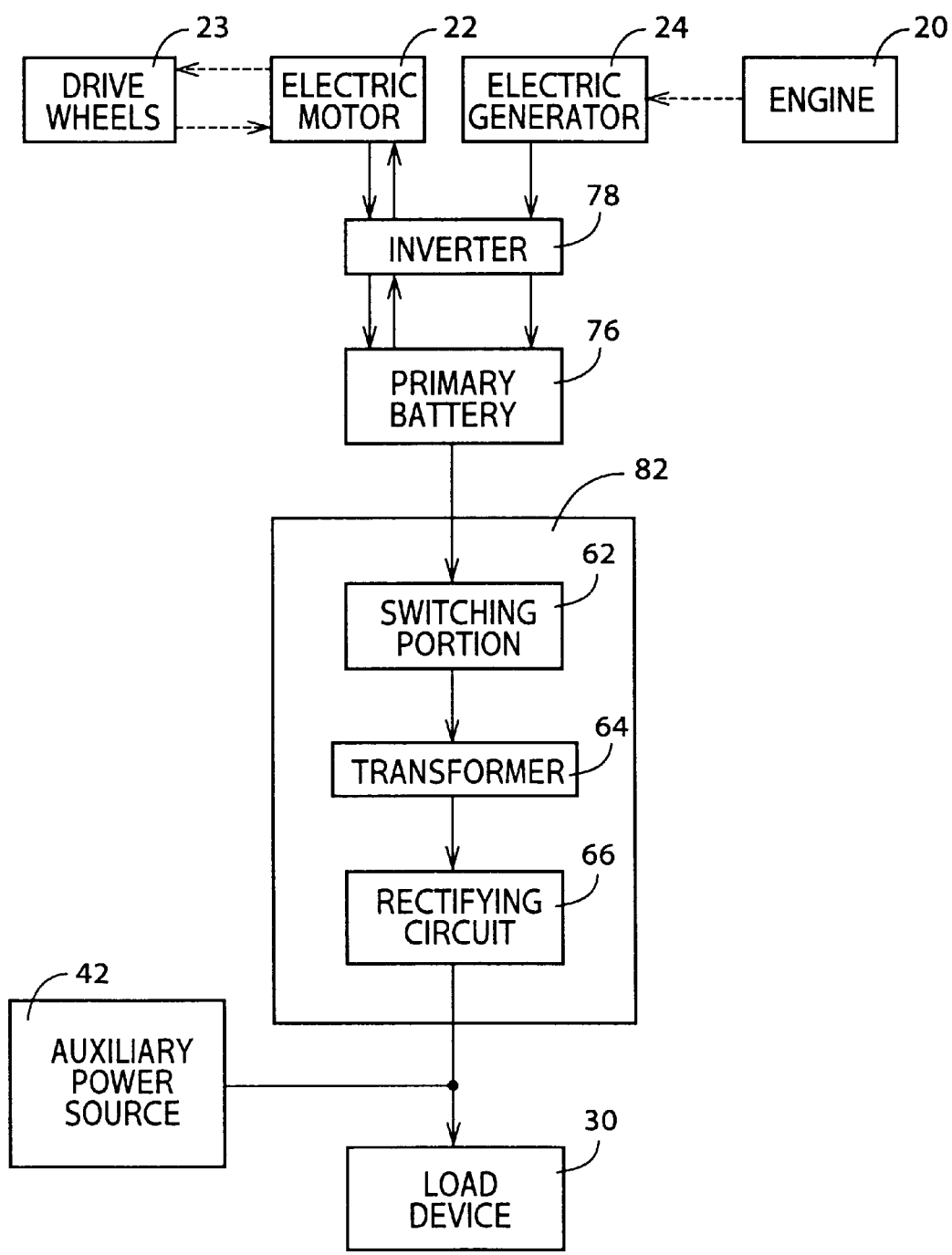
FIG. 3 is a block diagram showing an example of a voltage regulating device 60 as another electrical device of FIG. 1, and the other electrical devices connected thereto.
Figure 4:
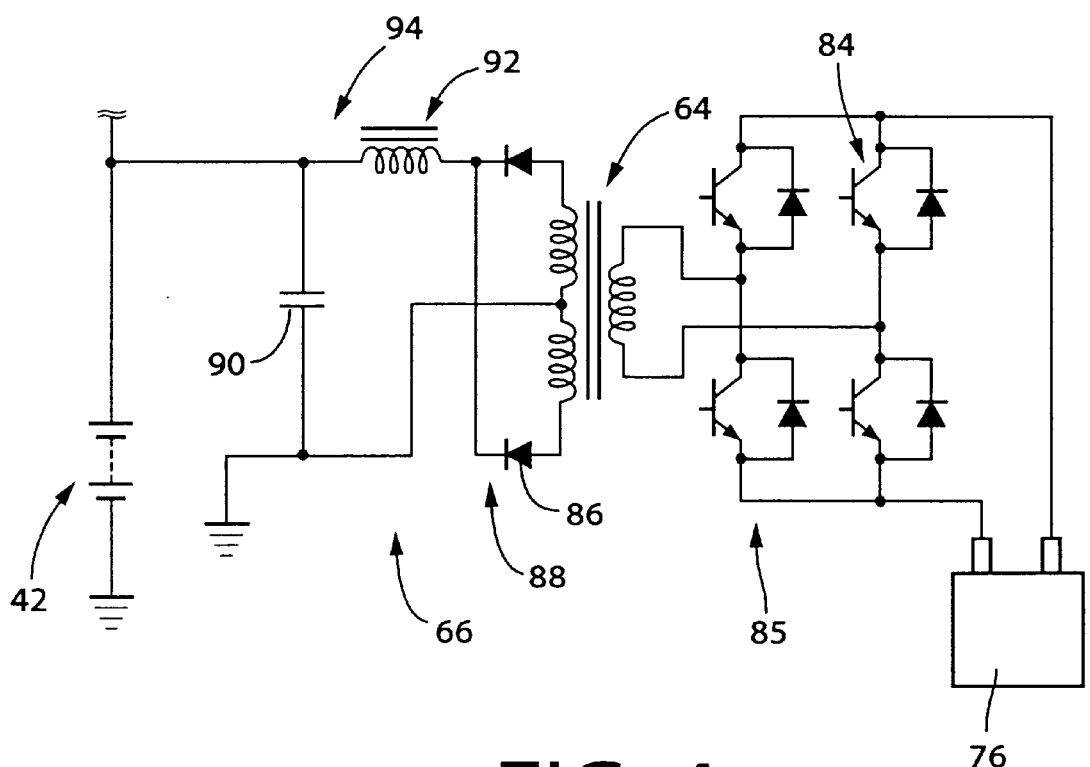
FIG. 4 is an electric circuit diagram showing in detail an example of a DC/DC converter 82 shown in FIG. 3.
Figure 5:
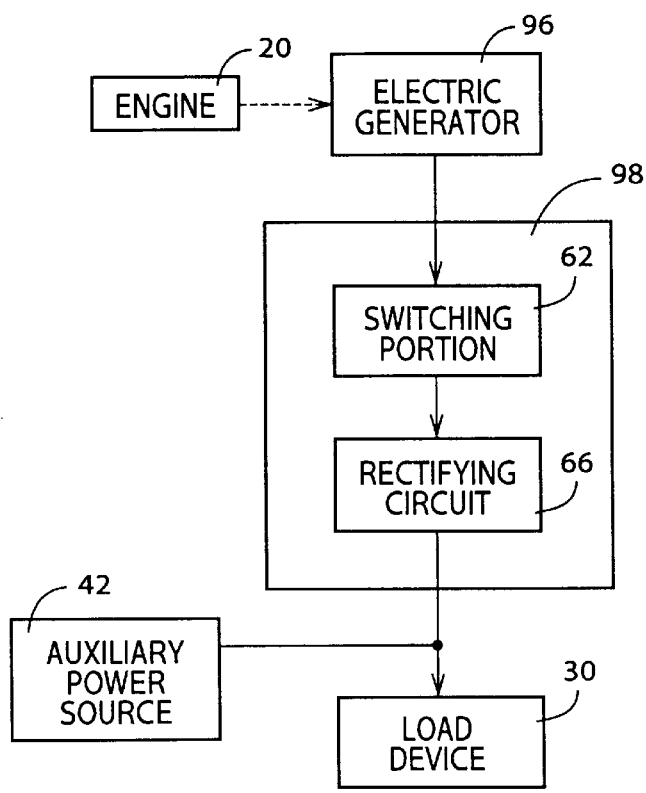
FIG. 5 is a block diagram showing another example of the voltage regulating device 60 of FIG. 1.

FIGS. 3 and 4 show one example of a combination of the switching portion 62, the transformer 64 and the rectifying circuit 66, while FIG. 5 shows another example of the combination where the drive power source provided on the automotive vehicle consists of only the engine 20.

In the example of FIGS. 3 and 4, the main power source 50 is principally constituted by a primary battery 76, which is connected to the electric motor 22 and the electric generator 24 through an inverter 78. When the vehicle is driven, a direct current discharged from the primary battery 76 is converted by the inverter 78 into an alternating current to be supplied to the electric motor 22 for driving the drive wheels 23. When the vehicle is braked, an alternating current generated by the electric motor 22 operated by a torque of the rotating drive wheels 23 is converted by the inverter 78 into a direct current which is used for charging the primary battery 76. The inverter 78 is further assigned to convert an alternating current generated by the electric generator 24 operated by the engine 20, into a direct current used for charging the primary battery 76.

The electric generator 24 functions as a starter for starting the engine 20 when the electric generator 24 is energized with the electric energy supplied from the primary battery 76.

In the example of FIGS. 3 and 4, the switching portion 62, the transformer 64 and the rectifying circuit 66 cooperate to constitute a DC/DC converter 82, which is schematically shown in FIG. 3. As shown in detail in FIG. 4, the DC/DC converter 82 includes a series connection of (a) a transistor bridge circuit 85 having a plurality of transistors 84 which serves as the switching portion 62, (b) the above-indicated transformer 64 having a primary coil and a secondary coil, and (c) the above-indicated rectifying circuit 66 for rectifying and smoothing the alternating current supplied from the secondary coil of the transformer 64, into a direct current. The rectifying circuit 66 includes a rectifier principally constituted by a diode 86, and a smoothing circuit 94 having a capacitor 90 and a coil 92. The rectifying circuit 66 has an output terminal to which the auxiliary battery 42 and the load device 30 are connected.

In the example of FIG. 5, the main power source 40 is principally constituted by an electric generator (in the form of an alternator, for example) which is driven by the engine 20. In this example, a combination of the switching portion 62 and the rectifying circuit 66 (and not including the transformer 64) serves as a so-called regulator 98. As schematically illustrated in FIG. 5, the regulator 98 is a series connection of the above-indicated switching portion 62 having a plurality of transistors, and the above-indicated rectifying circuit 66 having a capacitor and a coil. The rectifying circuit 66 has an output terminal to which the auxiliary battery 42 and the load device 30 are connected.

Referring back to FIG. 1, the above-indicated detector 70 is arranged to detect an amount of an electric current applied from the voltage regulating device 60 to the load device 30, and applies a signal indicative of the detected amount of electric current to the I/O interface 74. The amount of electric current detected by the detector 70 does not necessarily represent an electric current ("load current") flowing through the load device 30, which represents a load acting on the load device 30, since the electric current may be supplied from the voltage regulating device 60 to both the load device 30 and the auxiliary battery 42, and since the load device 30 may be supplied with electric currents from both the voltage regulating device 70 and the auxiliary battery 42.

When the voltage of the secondary coil of the transformer 64 (hereinafter referred to as "output voltage of the voltage regulating device 60") is not lower than the voltage of the auxiliary battery 42, the detector 70 detects a voltage of the load device 30 ("load voltage"), as being equal to the output voltage of the voltage regulating device 60 and the voltage of the auxiliary battery 42. When the output voltage of the voltage regulating device 60 is lower than the voltage of the auxiliary battery 42, the detector 70 detects the load voltage as being equal to the voltage of the auxiliary battery 42. An output signal of the detector 70 is also applied to the I/O interface 74.

The above-indicated control portion 72 is connected to the I/O interface 74 and the switching portion 62, and is adapted to receive the output signal of the detector 70. The control portion 72 is principally constituted by a computer 100 incorporating a CPU, a ROM and a RAM. The computer 100 is operated with an electric power supplied from the auxiliary battery 42. The ROM indicated above stores various control routines such as a voltage regulating routine and a self-diagnostic routine.

The voltage regulating routine is formulated to generate a drive command to be applied to the switching portion 62, for controlling the output voltage of the voltage regulating device 60 to a desired value by lowering the voltage of the main power source 40 by a feedback control on the basis of the output signal of the detector 70. Described more specifically, the voltage regulating routine is formulated to turn on and off the switching portion 62, upon reception of an external OUTPUT PERMIT command, so that the output voltage of the voltage regulating device 70 is made equal to 14V, and to hold the switching portion 62 in an open state for disconnecting the main power source 40 from the load device 30, upon reception of an external OUTPUT INHIBIT command, so that the output voltage of the voltage regulating device 60 is zeroed (made equal to 0V).

On the other hand, the self-diagnostic routine is formulated to diagnose the main power source 40 and the voltage regulating device 60 for any abnormality, on the basis of a DETECT signal in the form of the output signal of the detector 70.

To the voltage regulating device 60, there is connected to the above-indicated power source monitoring device 10.

FIG. 1 also shows flows of the electric current between the main power source 40 and the auxiliary battery 42 and load device 30, and between the load device 30 and the main power source 40 and auxiliary battery 42, when the voltage regulating device 60 is normally operating, and when the power source monitoring device 10 is operating to diagnose the auxiliary battery 42 while the output voltage of the voltage regulating device 60 is limited. The flows of the electric current during the normal operation of the voltage regulating device 60 will be described just below, and the flow of the electric current during the diagnosis will be described later in relation to an operation of the power source monitoring device 10.

Figure 6:
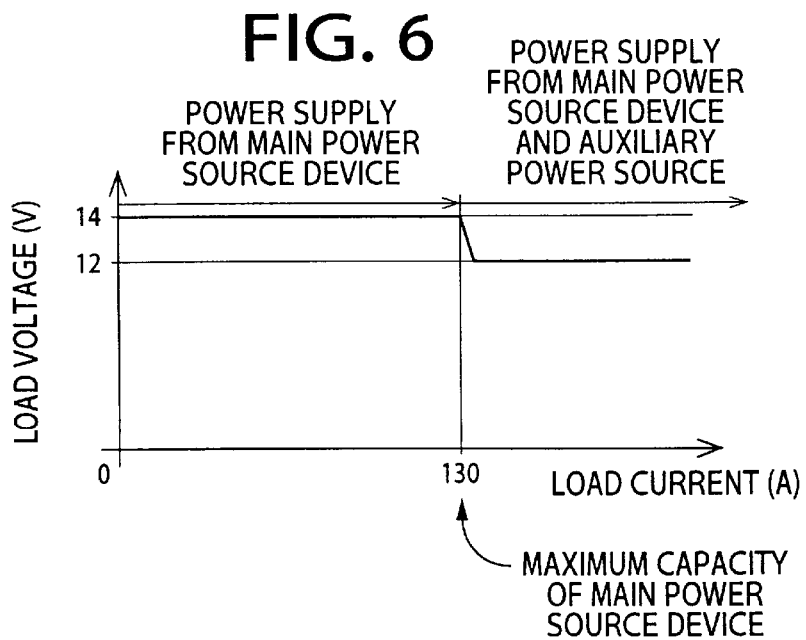
FIG. 6 is a graph for explaining a relationship between a load current and a load voltage in the electric system of FIG. 1.

The voltage regulating device 60 has the nominal voltage of 14V, while the auxiliary battery 42 has the nominal voltage of 12V. Further, the maximum current that can be supplied from the voltage regulating device 60 is 130A. Accordingly, when both a main power source device consisting of the main power source 40 and the voltage regulating device 60 and the auxiliary battery 42 are normal and when the electric current to be consumed by the load device 30 ("load current") is not larger than 130A, the electric current flows from the main power source device to the load device 30 for operating the load device 30, as indicated at "b" in FIG. 1, while at the same time the electric current flows from the main power source device to the auxiliary battery 42 so as to charge the auxiliary battery 42, as indicated at "a" in FIG. 1. In this case, the load voltage (which is equal to the voltage of the voltage regulating device 60) is 14V, as indicated in FIG. 6, and the electric current does not flow from the auxiliary battery 42 to the load current 30. When the main power source device and the auxiliary battery 42 are both normal and when the load current is larger than 130A, the electric current flows from both the main power source device and the auxiliary battery 42 to the load device 30, as indicated at "b" and "c" in FIG. 1. In this case, the load voltage is lowered to 12V which is the nominal voltage of the auxiliary battery 42, but the amount of the electric current applied to the load device 30 is larger than the maximum amount of the main power source device, as indicated in FIG. 6.

The power source monitoring device 10 is principally constituted by a computer 110 incorporating a CPU, a ROM and a RAM. The computer 110 is operated with an electric power supplied from the auxiliary battery 42. The ROM of the computer 110 stores various control routines such as a diagnostic routine and an abnormality handling routine.

The diagnostic routine is formulated to diagnose or check the auxiliary battery 42 for detecting an abnormality that the capacity of the auxiliary battery 42 to supply electric power to the load device 30 has been abnormally lowered. This capacity may be lowered due to deterioration of the auxiliary battery 42 arising from an increase in the internal electric resistance above the upper limit, or due to an insufficient amount of charging of the auxiliary battery 42 by the main power source 40.

The abnormality handling routine is executed when an abnormality of the auxiliary battery 42 is found by execution of the diagnostic routine. This abnormality handling routine is formulated to provide the operator of the automotive vehicle with a warning on a display device 112 connected to the power source monitoring device 10, in order to avoid any inconvenience which may result from the abnormality. The abnormality handling routine is further formulated to limit or select the loads 50 of the load device 30 that are permitted to be operated, and to limit the maximum electric current to be supplied to the selected loads 50, in order to prevent the amount of electric current consumed by the load device 30 from exceeding the maximum value, after the abnormality is found by the diagnostic routine.

Figure 7:
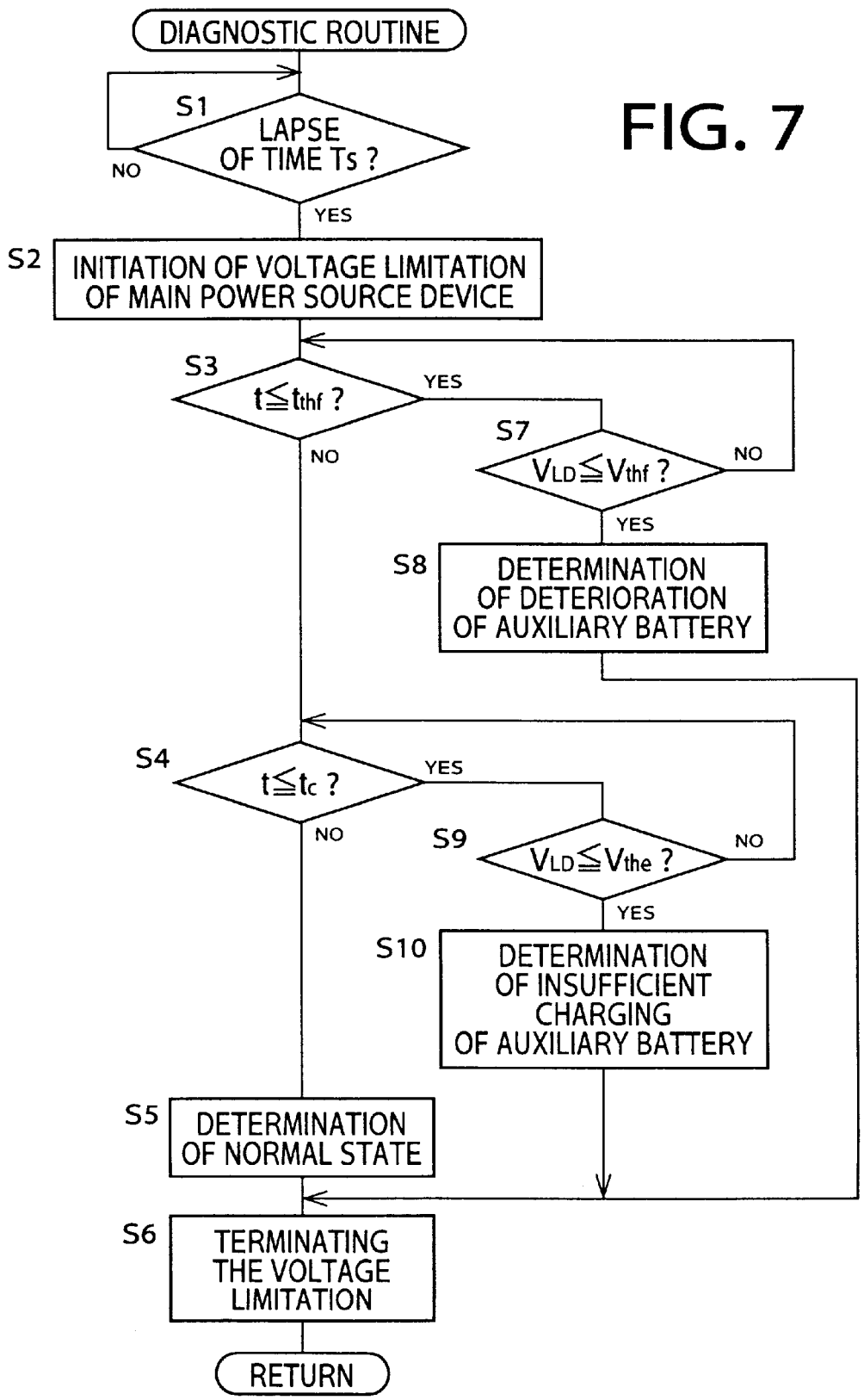
FIG. 7 is a flow chart illustrating a diagnostic routine executed by a computer 110 of the power source monitoring device of FIG. 1.

Referring to the flow chart of FIG. 7, there is illustrated the diagnostic routine. While the diagnostic routine will be described by reference to the flow chart, a concept underlying the diagnostic routine will be first explained.

The graph of FIG. 8 shows different relationships between the load current (A) and the load voltage (V), namely, different A–V curves, which correspond to respective three cases when the load current is larger than the maximum value of the main power source device (40, 60): 1) a case where the auxiliary battery 42 is in the normal state; 2) a case where the auxiliary battery 42 is insufficiently charged; and 3) a case where the auxiliary battery 42 is deteriorated. Where the auxiliary battery 42 is in the normal state, the load voltage is held at 12V for a relatively long time after the load current has exceeded the maximum value of 130A. After this relatively long time has passed, the load voltage drops such that the rate of drop of the load voltage is initially low and is subsequently high. Where the auxiliary battery 42 is insufficiently charged state, the load voltage begins to drop immediately after the load current has exceeded the maximum value of 130A. In this case, the load voltage drops such that the rate of drop of the load voltage is initially low and is subsequently high. Where the auxiliary battery 42 is deteriorated, the load voltage begins to drop immediately after the load current has exceeded the maximum value of 130A, such that the rate of drop is high from the beginning of the drop.

To diagnose the auxiliary battery 42 for any abnormality, the load voltage of the load device 30 must be detected by the detector 70 while an electric current is flowing from the auxiliary battery 42 to the load device 30. The electric current flows from the auxiliary battery 42 to the load device 30 when the total amount of the electric currents flowing from the main power source 40 and the auxiliary battery 42 is larger than 130A, or when the output voltage of the voltage regulating device 60 is limited to a value lower than the voltage of the auxiliary battery 42 so that the electric current flows to the load device 30 from only the auxiliary battery 42.

The graph of FIG. 9 shows a drop of the load voltage of the load device 30 with time t after the output voltage of the voltage regulating device 60 is lowered below the voltage (12V) of the auxiliary battery 42 at a point of time $t_0$. The load voltage drops since the voltage of the auxiliary battery 42 is lowered due to consumption of the electric energy or power stored in the auxiliary battery 42 where the electric current is supplied from only the auxiliary battery 42 to the load device 30, and since the voltage of the auxiliary battery 42 and the load voltage drop together while these voltages are kept equal to each other.

The V-t curves of FIG. 9 representing the relationship between the load voltage (V) and the time (t) are similar to the V-A curves of FIG. 8 representing the relationship between the load voltage (V) and the load current (A). Described in detail, where the auxiliary battery 42 is in the normal state, the load voltage is kept at 12V after the output voltage limitation of the voltage regulating device 50 is initiated, until the load current increases to a relatively large value. Then, the load voltage drops such that the rate of drop of the load voltage is initially low and is subsequently high. Where the auxiliary battery 42 is in an insufficiently charged state, the load voltage begins to drop immediately after the output voltage limitation of the voltage regulating device 50 is initiated. In this case, the load voltage drops such that the rate of drop of the load voltage is initially low and is subsequently high. Where the auxiliary battery 42 is in a deteriorated state, the load voltage begins to drop immediately after the initiation of the output voltage limitation of the voltage regulating device 60, such that the rate of drop is high from the beginning of the drop.

Based on the fact shown in FIG. 9, the diagnostic routine is formulated to check whether the auxiliary battery 42 is in a deteriorated state or in an insufficiently charged state, depending upon a characteristic of a chronological change in the load voltage detected by the detector 70 while the output voltage of the voltage regulating device 60 is limited. The diagnostic routine is repeatedly executed at a time interval $T_s$ which is determined by the characteristic of the chronological change in the detected load voltage.

Figure 10:
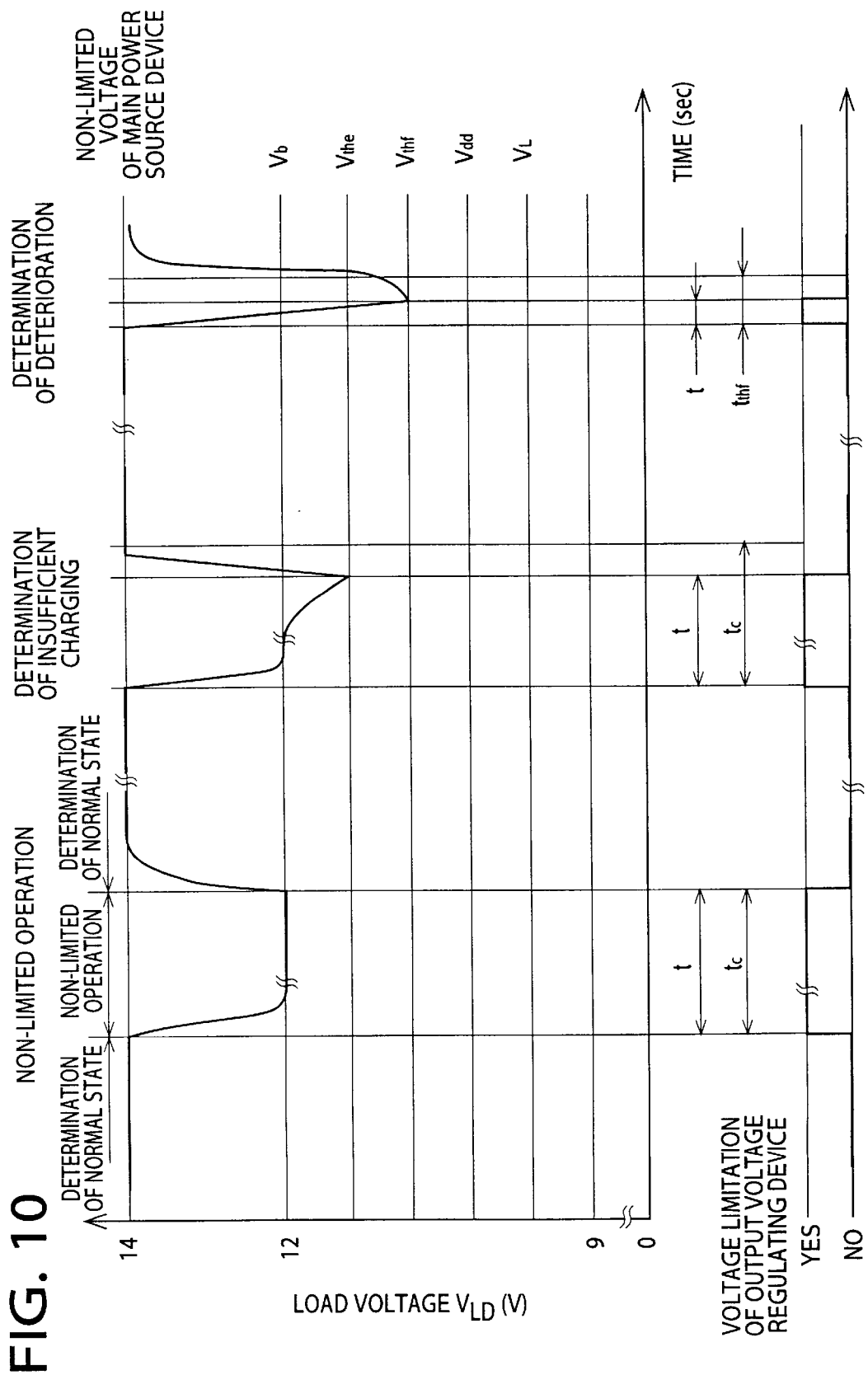
FIG. 10 is a time chart for explaining the diagnostic routine of FIG. 7.

The graph of FIG. 10 shows methods of detecting or determining the normal state, insufficiently charged state and deteriorated state of the auxiliary battery 42, according to the diagnostic routine.

The auxiliary battery 42 is determined to be placed in the normal state, if the load voltage $V_{LD}$ is kept at a level not lower than the nominal voltage $V_b$ (12V) of the auxiliary battery 42 for a predetermined first threshold time $t_c$ after the initiation of the output voltage limitation of the voltage regulating device 60. In this case, the output voltage limitation is terminated when the predetermined threshold time $t_c$ has passed after the initiation of the output voltage limitation.

The auxiliary battery 42 is determined to be placed in the deteriorated state, if the load voltage $V_{LD}$ has lowered to a predetermined first threshold level $V_{thf}$ below the nominal voltage $V_b$ before a predetermined second threshold time $t_{thf}$ shorter than the first threshold time $t_c$ has passed after the initiation of the output voltage limitation. In this case, the output voltage limitation is terminated when the load voltage $V_{LD}$ has been lowered to the first threshold level $V_{thf}$.

The auxiliary battery 42 is determined to be placed in the insufficiently charged state, if the load voltage $V_{LD}$ has been lowered to a second threshold level $V_{the}$ between the nominal voltage $V_b$ and the first threshold level $V_{thf}$ before the first threshold time $t_c$. In this case, the output voltage limitation is terminated when the load voltage $V_{LD}$ has been lowered to the second threshold value $V_{the}$.

Thus, a condition which should be satisfied for determining that the auxiliary battery 42 is in the deteriorated state is expressed as follows, as indicated in FIG. 11:

$$V_{LD} \leq V_{thf} \text{ AND } t \leq t_{thf}$$

wherein "t" represents a time from a moment of initiation of the output voltage limitation of the voltage regulating device 60 to a moment at which the load voltage $V_{LD}$ has been lowered to the first threshold level $V_{thf}$.

Further, a condition which should be satisfied for determining that the auxiliary battery 42 is in the insufficiently charged state is expressed as follows, as also indicated in FIG. 11:

$$V_{LD} \leq V_{the}$$

As described above, the limitation of the output voltage of the voltage regulating device 60 must be effected such that the output voltage is lower than the actual voltage of the auxiliary battery 42. It is also noted that the computer 100 of the control portion 72 of the voltage regulating device 60 and the computer 110 of the power source monitoring device 10 are connected to the auxiliary battery 42. It is further noted that the computers 100, 110 are designed to be normally operable when the voltage applied to those computers is at least 9V. If the output voltage of the voltage regulating device 60 is lowered to a level lower than 9V for the purpose of diagnosing the auxiliary battery 42, there is no assurance that the computers 100, 110 are normally operable. Therefore, a lower limit $V_{dd}$ of the output voltage of the voltage regulating device 60 when the output voltage is limited for the diagnostic purpose is determined to be lower than the above-indicated first threshold level $V_{thf}$ and higher than a permissible lowest voltage level $V_L$ of the computers 100, 110. Accordingly, the permissible lowest voltage level $V_L$, the lower limit $V_{dd}$, the first threshold level $V_{thf}$, the second threshold level $V_{the}$ and the nominal voltage level $V_b$ of the auxiliary battery 42 have following relationship, as indicated in parenthesis at the bottom of FIG. 11:

$$V_L < V_{dd} < V_{thf} < V_{the} < V_b$$

There will be described a manner of determining the first and second threshold times $t_c$, $t_{thf}$.

In the present embodiment, amounts of the electric current consumed by the load device 30 during respective successive periods of limitation of the output voltage of the voltage regulating device 60 are not necessarily equal to each other. Since the successive periods of limitation of the output voltage usually occur during running of the vehicle, it is not always proper to control the amounts of the electric current consumed by the load device 30 during the respective periods of limitation of the output voltage such that those amounts are made equal to a certain value.

Nevertheless, the threshold times $t_c$, $t_{thf}$ may be fixed values according to the present invention. However, the present embodiment is arranged such that the threshold times $t_c$, $t_{thf}$ are changed depending upon the load current such that the times $t_c$, $t_{thf}$ are shorter when the load current is relatively large than when it is relatively small, in view of a fact that the amount of consumption of the electric energy stored in the auxiliary battery 42 increases with an increase in the load current, so that the rate of reduction of the voltage of the auxiliary battery 42 and therefore the load voltage increases with the load current.

It is noted that the detector 70, which is provided to detect the electric current supplied from the voltage regulating device 60 to the load device 30, is not capable of directly detecting the electric current supplied from the auxiliary battery 42 to the load device 30. However, the load current of the load device 30 can be detected by the detector 30 immediately before the initiation of the output voltage limitation of the voltage regulating device 50, since the electric power is supplied to the load device 30 from only the voltage regulating device 60 before the incitation of the output voltage limitation. Further, it is possible to assume that the load current is kept substantially constant while the output voltage of the device 60 is limited, namely, while the output voltage is held lower than the actual voltage of the auxiliary battery 42. On the other hand, the load current is equal to the electric current supplied from the auxiliary battery 42 to the load device 30 while the output voltage of the device 60 is limited. In the present embodiment, therefore, the load current detected by the detector 70 immediately before the initiation of the output voltage limitation of the device 60 is used as the electric current of the auxiliary battery 42 during the output voltage limitation.

It is further noted that since the load current may have a transitional variation, it is preferable that the threshold times $t_c$, $t_{thf}$ be changed not on the basis of one detected value of the load current, but on the basis of a value obtained by smoothing a plurality of detected values of the load current. For instance, it is preferable to use an average of a plurality of detected values of the load current.

There will next be described a manner of determining the first and second threshold levels V the and $V_{thf}$.

Like the threshold times $t_c$, $t_{thf}$, the threshold voltage levels $V_{the}$, $V_{thf}$ may be fixed values according to this invention. In the present embodiment, however, the threshold values $V_{the}$, $V_{thf}$ are changed depending upon the load current such that these values $V_{the}$, $V_{thf}$ are larger when the load current is relatively large than when it is relatively small, in view of a fact that the rate of reduction of the load voltage increases with an increase in the load current, due to deterioration of the auxiliary battery 42 and/or an operating response characteristic of the voltage regulating device 60. The manner of detecting the load current to determine the threshold levels $V_{the}$, $V_{thf}$ is the same as described above with respect to the threshold times $t_c$, $t_{thf}$.

Then, the time interval Ts at which the diagnostic routine is repeatedly executed will be described.

Like the threshold times $t_c$, $t_{thf}$ and the threshold voltage levels $V_{the}$, $V_{thf}$, the time interval $T_s$ may be a fixed value according to the present invention. However, the amount of electric energy stored in the auxiliary battery 42, which is consumed by the load device 30 for the purpose of monitoring or diagnosing the auxiliary battery 42, increases with an increase in the load current of the load device 30. That is, the load acting on the auxiliary battery 42 during its diagnosis increases with the load current. Accordingly, the amount of reduction of the voltage of the auxiliary battery 42 increases with the load current. In the present embodiment, therefore, the tine interval $T_s$ is changed such that the time interval $T_s$ is longer when the load current is relatively large than when it is relatively small. The manner of detecting the load current to determine the time interval $T_s$ is the same described above with respect to the threshold times $t_c$, $t_{thf}$ and threshold levels $V_{the}$, $V_{thf}$.

When the amount of electric energy stored in the primary battery 76 of the main power source 40 is smaller than a predetermined lower limit, it is preferable to inhibit the diagnosis of the auxiliary battery 42 by increasing the time interval $T_s$ substantially to infinity. If the output voltage of the voltage regulating device 60 is limited to diagnose the auxiliary battery 42 when the amount of electric energy stored in the primary battery 76 is smaller than the lower limit, the voltage of the primary battery 76 may not be raised back to the original level in a short time after the limitation of the output voltage of the device 60 is cancelled. For this reason, it is preferable to inhibit the diagnosis of the auxiliary battery 42 when the electric energy amount stored in the primary battery 76 is smaller than the lower limit.

If the amount of electric power consumed by the load or loads 50 connected to only the primary battery 76 is larger than a predetermined upper limit, it is preferable to inhibit the diagnosis of the auxiliary battery 42 by increasing the time interval $T_s$ substantially to infinity. If the output voltage of the voltage regulating device 60 is limited to diagnose the auxiliary battery 42 when the electric power consumed by the loads 50 connected to only the primary battery 76 is larger than the upper limit, the voltage of the primary battery 76 may not be raised back to the original level in a short time after the limitation of the output voltage of the device 60 is cancelled. For this reason, it is preferable to inhibit the diagnosis of the auxiliary battery 42 in the above case.

Once the auxiliary battery 42 is found abnormal by execution of the diagnostic routine, the ignition switch of the vehicle is turned off by the vehicle operator. In this case, it is preferable to inhibit the diagnosis of the auxiliary battery 42 by increasing the time interval $T_s$ substantially to infinity until a signal indicative of the abnormality is removed, in order to avoid a further reduction of the power supply capacity of the auxiliary battery 42 due to its diagnosis while the power supply capacity is smaller than a lower limit.

While the concept underlying the diagnostic routine has been described, it will be described in detail by reference to the flow chart of FIG. 7.

The diagnostic routine is repeatedly executed. Each cycle of execution of the diagnostic routine is initiated with step Si to determine whether the cycle time $T_s$ has passed after the termination of the last cycle. If an affirmative decision (YES) is obtained in step S1, the control flow goes to step S2 to generate a signal for initiating the limitation of the output voltage of the voltage regulating device 60. As a result, the discharging of the auxiliary battery 42 is initiated, so that an electric current flows from the auxiliary battery 42 to the load device 30, as indicated at "c" in FIG. 1.

Step S2 is followed by step S3 to determine whether the time t which has passed after the initiation of the output voltage of the device 60 is equal to or shorter than the second threshold time $t_{thf}$, if an affirmative decision (YES) is obtained in step S3, the control flow goes to step S7 to determine whether the load voltage $V_{LD}$ calculated on the basis of the output signal of the detector 70 is equal to or lower than the first threshold level $V_{thf}$. If a negative decision (NO) is obtained in step S7, the control flow goes back to step S3. If the load voltage $V_{LD}$ has been lowered to the first threshold level $V_{LD}$ as a result of repeated implementation of steps S3 and S7, an affirmative decision (YES) is obtained in step S7, and the control flow goes to step S8 to determine that the auxiliary battery 42 is in a deteriorated state. Then, the control flow goes to step S6 to generate an OUTPUT LIMIT command for terminating the limitation (reduction) of the output voltage of the voltage regulating device 60. Thus, one cycle of execution of the diagnostic routine is terminated.

If the time t becomes longer than the second threshold time $t_{thf}$ and a negative decision (NO) is obtained in step S3 before the affirmative decision (YES) is obtained in step S7, the control flow goes to step S4 to determine whether the time t is equal to or shorter than the first threshold time $t_c$. If an affirmative decision (YES) is obtained in step S4, the control flow goes to step S9 to determine whether the load voltage $V_{LD}$ calculated on the basis of the output signal of the detector 70 is equal to or lower than the second threshold level $V_{the}$. If a negative decision (NO) is obtained in step S9, the control flow goes back to step S4. If the load voltage $V_{LD}$ has been lowered to the second threshold level $V_{the}$ as a result of repeated implementation of steps S4 and S9, an affirmative decision (YES) is obtained in step S9, and the control flow goes to step S10 to determine that the auxiliary battery 42 is in an insufficiently charged state, and then to step S6 to terminate the limitation of the output voltage of the voltage regulating device 60. Thus, one cycle of execution of the diagnostic routine is terminated.

If the time t becomes longer than the first threshold time $t_c$ before the load voltage $V_{LD}$ has been lowered to the second threshold level $V_{the}$, a negative decision (NO) is obtained in step S4, and the control flow goes to step S5 to determine that the auxiliary battery 42 is in the normal state. Thus, one cycle of execution of the diagnostic routine is terminated.

Figure 12:
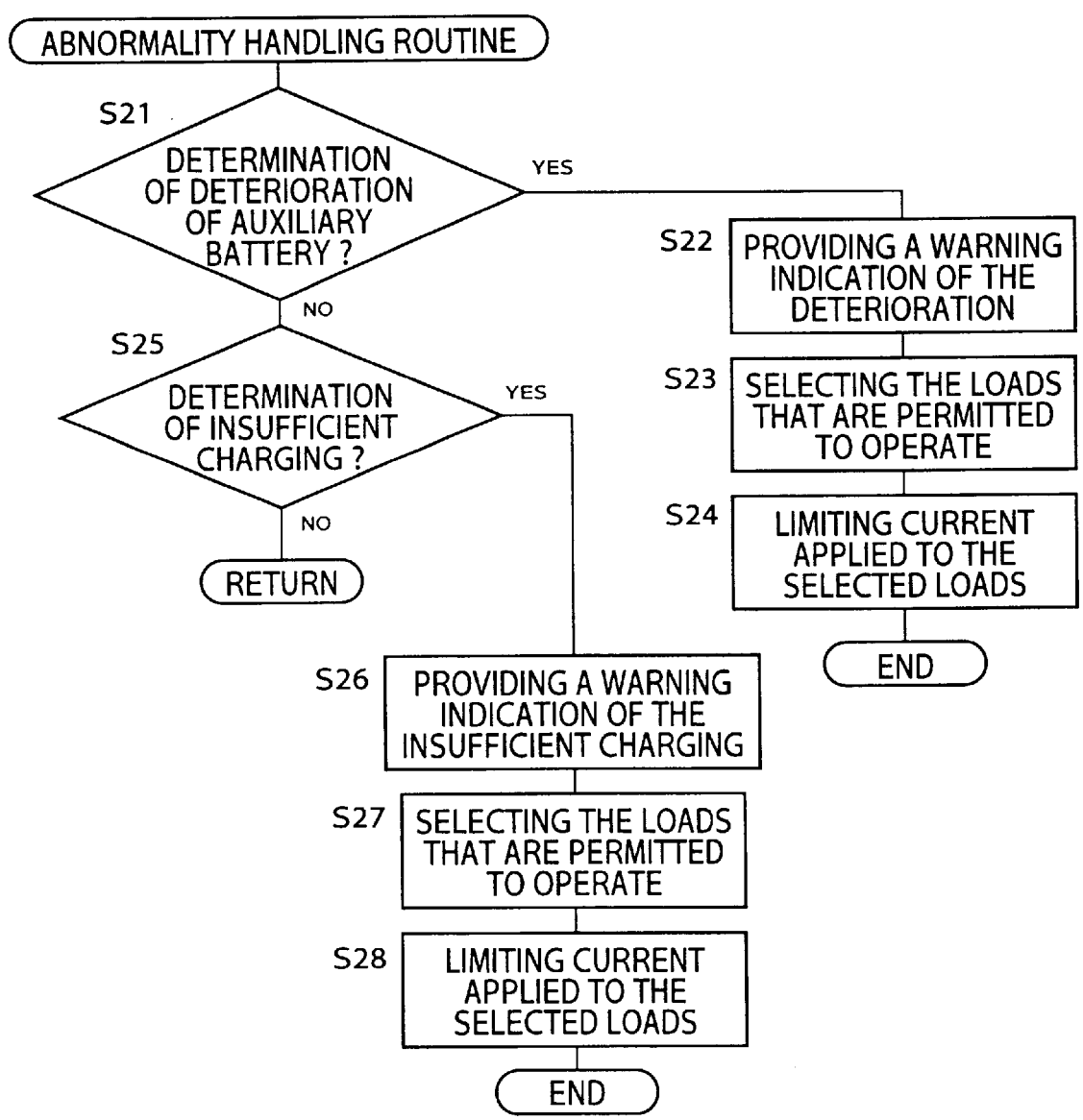
FIG. 12 is a flow chart illustrating an abnormality handling routine executed by the computer 110 of the power source monitoring device 10 of FIG. 1.

Referring to the flow chart of FIG. 12, there is illustrated the abnormality handling routine, which is also repeatedly executed. Each cycle of execution of this routine is initiated with step S21 to determine whether the diagnostic routine has revealed that the auxiliary battery 42 is in the deteriorated state, according to the diagnostic routine. If an affirmative decision (YES) is obtained in step S21, the control flow goes to step S22 to activate the display device 112 for warning the vehicle operator that the auxiliary battery 42 is in the deteriorated state.

Then, the control flow goes to step S23 to limit the loads 50 that are permitted to be operated with the electric power supplied from the main power source 40. Namely, Step S23 is provided to select those ones of the plurality of loads 50 which are permitted to be operated with the electric power supplied from the main power source 40. This selection is made according to the priorities given to the individual loads 50. According to the selected loads 50, the LOAD SELECTING signal indicated above is applied to the selector switch device 52. Step S23 is followed by step S24 wherein the CURRENT LIMITING signal indicated above is generated for limiting the maximum permissible amount of electric current to be applied to the selected loads 50. Steps S23 and S24 cooperate to prevent a total amount of consumption of the electric current by the loads 50 from exceeding the maximum permissible amount of electric current of the main power source 40. Then, the execution of the present abnormality handling routine is inhibited until the ignition switch provided on the vehicle is turned on again.

If the diagnostic routine has revealed that the auxiliary battery 42 is not in the deteriorated state, a negative decision (NO) is obtained in step S21, and the control flow goes to step S25 to determine whether the diagnostic routine has revealed that the auxiliary battery 42 is in the insufficiently charged state. If an affirmative decision (YES) is obtained step S25, the control flow goes to step S26 to activate the display device 112 for warning the vehicle operator that the auxiliary battery 42 is in the insufficiently charged state. Then, step S27 similar to step S23 is implemented to limit the loads 50 that are permitted to be operated with the electric power supplied from the main power source 40. Step S27 is followed by step S28 to limit the maximum permissible amount of electric current of the selected loads 50, as in step S24. In steps S27 and S28 implemented when the auxiliary battery 42 is in the insufficiently charged state, however, the number of the selected loads 50 that are permitted to be operated and/or the maximum permissible electric current of the selected loads 50 is/are larger than in steps S23 and S24 implemented when the auxiliary battery 42 is in the deteriorated state, since the power supply capacity of the auxiliary battery 42 is larger when it is insufficiently charged than when it is deteriorated. Then, the execution of the abnormality handling routine is inhibited until the ignition switch provided on the vehicle is turned on again.

If the diagnostic routine has not revealed that the auxiliary battery 42 is in the deteriorated or insufficiently charged state, the negative decision (NO) is obtained in both of the steps S21 and S25, and one cycle of execution of the abnormality handling routine is terminated. Then, the next cycle of execution of the routine is initiated without the ignition switch being once turned off and turned on again.

For diagnosing the auxiliary battery 42 without an influence of the main power source 40, an exclusive disconnecting switch may be provided between the main power source 40 and the auxiliary battery 42, in addition to the switching portion 62, for disconnecting the auxiliary battery 42 from the main power source 40, so that the load device 30 is operated to diagnose the auxiliary battery 42 while the switch is open. However, this form of the present invention has some disadvantages. Namely, the exclusive disconnecting switch is required, and the load device 30 may not be normally operated for performing some required or intended function or functions when the voltage of the auxiliary battery 42 is relatively low while the disconnecting switch is open.

In the present embodiment described above, the provision of such an exclusive disconnecting switch is not required, and the normal operation of the load device 30 is assured during the diagnosis of the auxiliary battery 42, as long as the voltage of the main power source 40 is in a normal range.

It will be understood from the foregoing description of the present embodiment that the auxiliary battery 42 is one example of a subject power source to be diagnosed by the power source monitoring device 10, while the main power source 40 is one example of a non-subject power source as distinguished from the subject power source, which non-subject power source has a nominal voltage higher than that of the subject power source. It will also be understood that a portion of the computer 110 assigned to execute the diagnostic routine of FIG. 7 constitutes an example of a first diagnosing device for determining whether the subject power source is abnormal or not while the electric power is supplied from only the non-subject power source to the load device, and that the limitation of the output voltage of the voltage regulating device 60 is one form of a power supply state in which the electric power is supplied to the load device 30.

There will next be described a second embodiment of this invention, which has many elements similar to those of the first embodiment and is different from the first embodiment only with respect to the diagnostic routine. Only the diagnostic routine will be described in detail, and no detailed description of the similar elements will be provided.

In the first embodiment, the diagnostic routine is executed at the time interval $T_s$ to diagnose the auxiliary battery 42 while the output voltage of the voltage regulating device 60 is held at a reduced level. However, the present second embodiment is adapted to diagnose the auxiliary battery 42 also when a large amount of electric current is supplied from both the main power source 40 and the auxiliary battery 42 to the load device 30. When the diagnosis is effected while the large amount of electric current is supplied to the load device 30, the output voltage of the voltage regulating device 60 is not limited or reduced, and the diagnosis of the auxiliary battery 42 is repeated at a time interval shorter than the time interval $T_s$.

Figure 13:
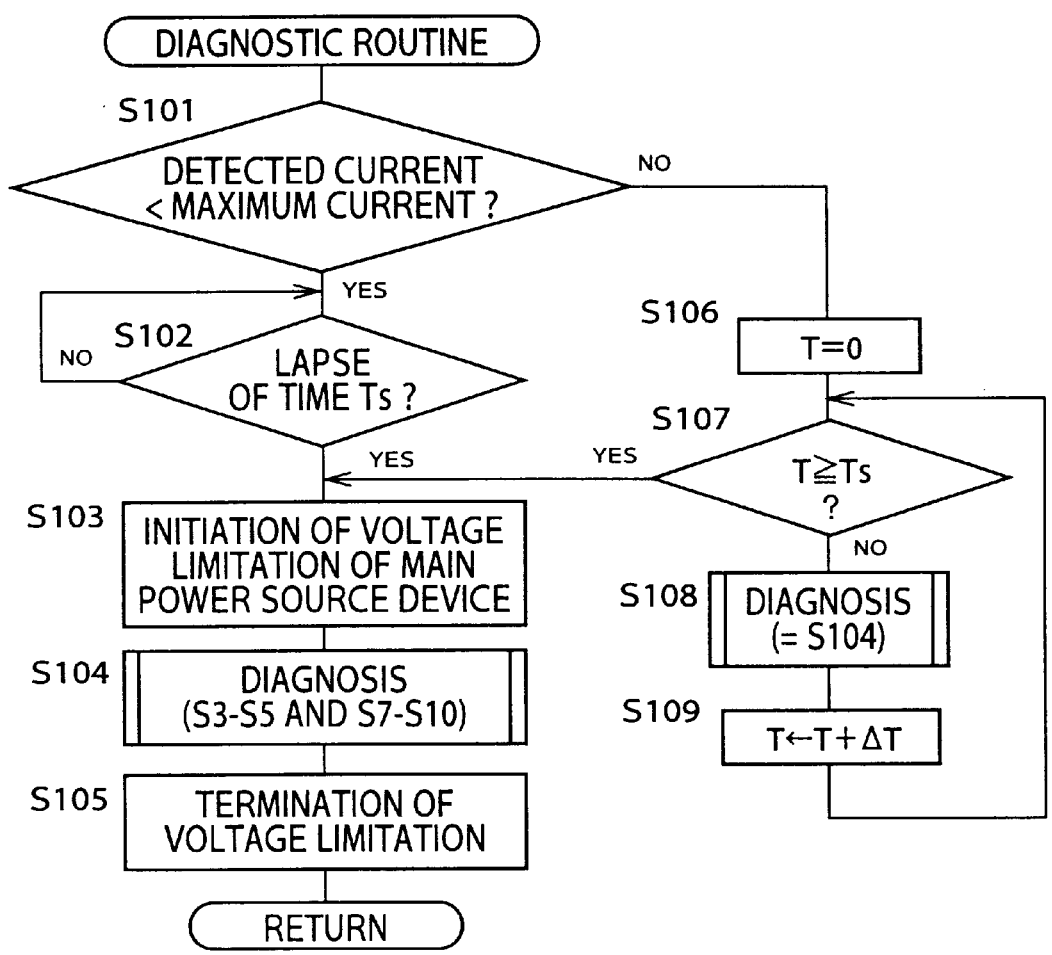
FIG. 13 is a flow chart illustrating a diagnostic routine executed by the computer 110 of the power source monitoring device in a second embodiment of this invention.

The diagnostic routine in the present second embodiment is illustrated in the flow chart of FIG. 13. Like the diagnostic routine in the first embodiment, the present diagnostic routine is repeatedly executed. Each cycle of execution of the diagnostic routine is initiated with step S101 to determine whether the electric current detected by the detector 70, that is, the electric current supplied from the voltage regulating device 60 to the load device 30 is smaller than the maximum electric current of the voltage regulating device 60. This step S101 is provided to determine whether the above-indicated large amount of electric current is not supplied to the load device 30. If the detected electric current is smaller than the maximum electric current of the device 60, that is, if an affirmative decision (YES) is obtained in step S101, the control flow goes to step S102 to determine whether the predetermined time interval $T_s$ has passed after the termination of the last cycle of execution of the diagnostic routine. If an affirmative decision (YES) is obtained in step S102, the control flow goes to step S103 to initiate the limitation of the output voltage of the voltage regulating device 60, as in the first embodiment. Then, step S104 is implemented to effect the diagnosis of the auxiliary battery 42 on the basis of the voltage detected by the detector 70, that is, the load voltage. This diagnosis is effected in the same manner as in steps S3–S5 and S7–S10 in the first embodiment. Then, step S105 is implemented to terminate the limitation of the output voltage of the device 60. Thus, one cycle of execution of the diagnostic routine is terminated.

If the detected electric current is not smaller than the maximum electric current of the voltage regulating device 60, a negative decision (NO) is obtained in step S101, and the control flow goes to step S106 to reset a time T, and then to step S107 to determine whether the time T is equal to or longer than the time interval $T_s$. If a negative decision (NO) is obtained in step S107, the control flow goes to step S108 to effect the diagnosis of the auxiliary battery 42 based on the load voltage, as in step S104. Then, step S108 is implemented to increment the time T by ΔT. The increment ΔT is a time necessary to implement a series of steps S107–S109 once, and is shorter than the tine interval $T_s$. Then, the control flow goes to step S107.

If the time T has increased to the time interval $T_s$ as a result of repeated implementation of steps S107–S109, an affirmative decision (YES) is obtained in step S107, and the control flow goes to step S103 and the subsequent steps.

It is noted that step S101 may be modified to determine whether the large electric current is supplied to the load device 30, by determining whether the detected electric current is equal to the maximum electric current of the device 60 while the load voltage detected by the detector 70 is substantially equal to the nominal voltage of 12V of the auxiliary battery 42.

It will be understood from the foregoing description of the present embodiment that a portion of the computer 110 assigned to implement steps S102–S105 of the diagnostic routine of FIG. 13 constitutes a first diagnosing device for determining whether the subject power source is abnormal or not, and that the limitation of the output voltage of the voltage regulating device 60 is one form of a power supply state in which the electric power is supplied to the load device. It will also be understood that the main power source 40 is an example of the non-subject power source, while a portion of the computer 110 assigned to implement steps S101 and S106–S109 of the diagnostic routine of FIG. 13 constitutes a second diagnosing device for determining whether the subject power source is abnormal or not while the electric power is supplied from both the non-subject power source and the subject power source.

There will next be described a third embodiment of this invention, which has many elements similar to those of the first embodiment and is different from the first embodiment only with respect to the diagnostic routine. Only the diagnostic routine will be described in detail, and no detailed description of the similar elements will be provided.

In the first embodiment, the diagnostic routine is executed to diagnose the auxiliary battery 42 periodically at the predetermined time interval $T_s$ while the output voltage of the voltage regulating device 60 is limited or held at the predetermined lowered level. The present third embodiment is adapted to diagnose the subject power source in the form of the auxiliary battery 42 when a VEHICLE ENABLE signal for enabling the vehicle to perform the intended function is generated by a manual operation by the vehicle operator. The diagnosis in this embodiment is effected without output voltage limitation of the voltage regulating device 60. The present embodiment is based on a design of the vehicle wherein upon generation of the VEHICLE ENABLE signal by a manual operation by the vehicle operator (for example, by turning on the ignition switch of the vehicle), the load device 30 is temporarily disconnected from the main power source 40 by the switching portion 62 of the voltage regulating device 60, so that the load device 30 is supplied with the electric power from only the auxiliary battery 42. The vehicle is designed as described above for the following reason, for example. Namely, when the VEHICLE ENABLE signal is generated, it is desirable that the capacitor in the inverter 78 be charged in a short time. To this end, the load device 30 is temporarily disconnected from the primary battery 76 of the main power source 76 when the VEHICLE ENABLE signal is generated. Therefore, the present third embodiment does not require controlling the voltage regulating device 60 for the sole purpose of diagnosing the auxiliary battery 42.

To diagnose the auxiliary battery 42, the load device 30 must be operated with the electric power being supplied thereto from the auxiliary battery 42. When the VEHICLE ENABLE signal is generated, the load device 30 is not activated at all by the vehicle operator in most cases. As described above, the threshold voltage levels $V_{the}$, $V_{thf}$ and threshold time $t_c$ are preferably changed depending upon the actual load current of the load device 30. When the VEHICLE ENABLE signal is generated, however, the load current cannot be obtained on the basis of the electric current detected by the detector 70 as in the first embodiment, since the load device 30 is disconnected from the main power source 40.

For the purpose of diagnosing the auxiliary battery 42 in the present embodiment, the load device 30 is activated upon generation of the VEHICLE ENABLE signal, to perform a suitable operation for checking the operating state of the load device 30 such as an operation for checking the initial state of the load device 30, such that the operation of the load device 30 will not cause the vehicle operator to feel uneasy with that operation. During this operation of the load device 30, the amount of electric power consumed by the load device 30 is known, so that the auxiliary battery 42 can be diagnosed with consistently high accuracy, without changing the threshold levels V the, $V_{thf}$ and time $T_c$.

Where the engine 20 cannot be started even when the ignition switch is turned on, the vehicle operator may try to start the engine 20 by turning on the ignition switch with the auxiliary battery 42 being connected to another or assisting power source (for example, a 12V battery of another vehicle which is called for the purpose of starting the engine 20). In this case, no electric current is applied from the auxiliary battery 42 to the load device 30, and the auxiliary battery 42 cannot be diagnosed as intended.

In the light of the above fact that the diagnosis of the auxiliary battery 42 cannot be effected as intended if the auxiliary battery 42 is connected to the external assisting power source, the present embodiment is adapted to check if the auxiliary battery 42 is connected to the assisting power source, upon generation of the VEHICLE ENABLE signal, and provide a warning message prompting the vehicle operator to disconnect the auxiliary battery 42 from the external assisting power source, if the checking reveals that the auxiliary battery 42 is connected to the external assisting power source. In this case, the vehicle is placed in a VEHICLE DISABLE state for inhibiting the operations of the vehicle normally performed upon generation of the VEHICLE ENABLE signal such as an operation to start the engine.

Figure 14:
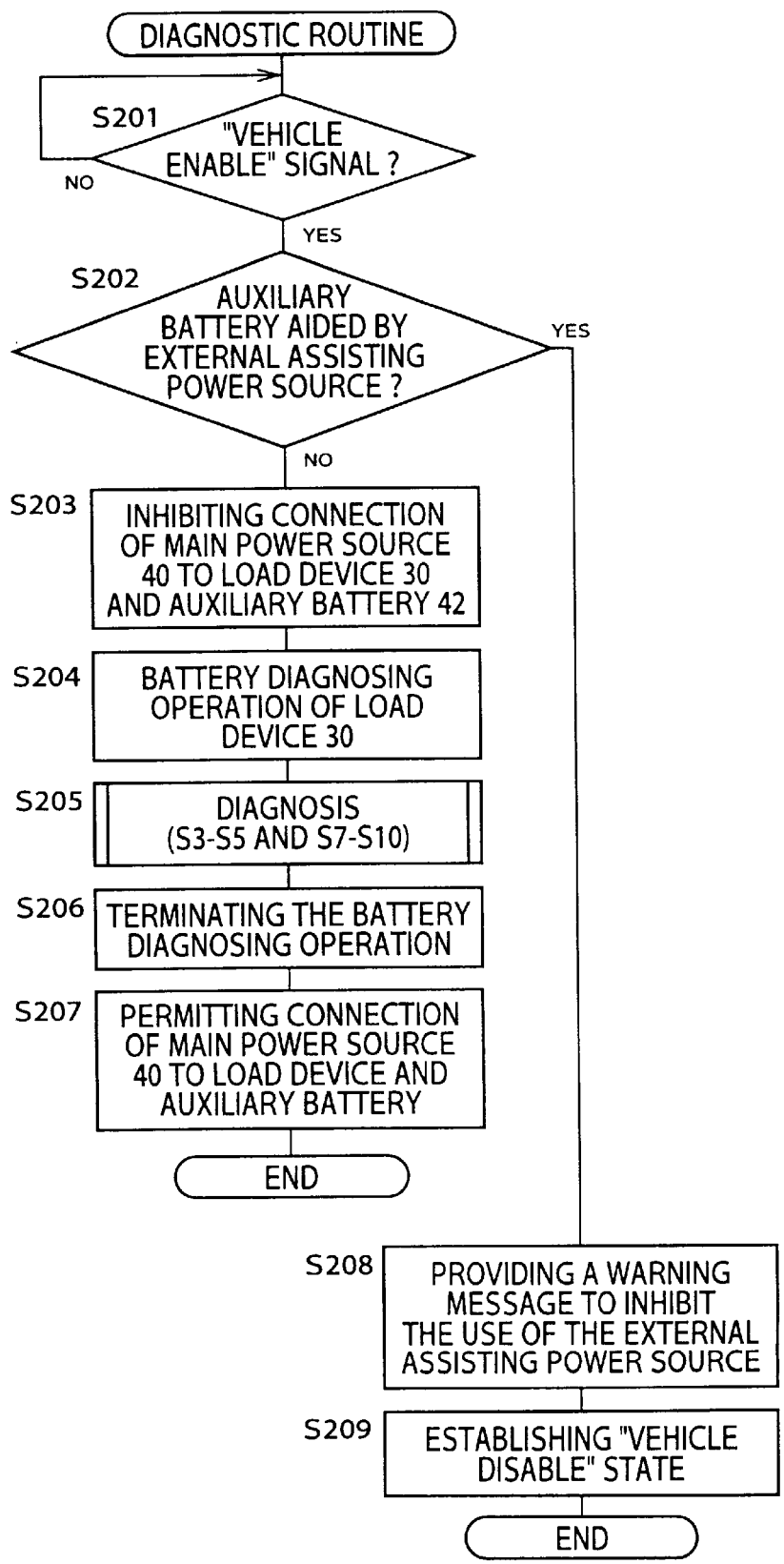
FIG. 14 is a flow chart illustrating a diagnostic routine executed by the computer 110 of the power source monitoring apparatus according to a third embodiment of this invention.

Referring to the flow chart of FIG. 14, there is illustrated a diagnostic routine of the present embodiment. The present diagnostic routine is initiated with step S201 to determine whether the VEHICLE ENABLE signal has been generated by a manual operation by the vehicle operator. Where the vehicle is of a manual transmission type (hereinafter referred to as "MT type"), it is determined that the VEHICLE ENABLE signal has been generated, if the ignition switch has been turned on. Where the vehicle is of an automatic transmission type (hereinafter referred to as "AT type"), it is determined that the VEHICLE ENABLE signal has been generated, if the following two conditions (a) and (b) have been simultaneously satisfied, for example: (a) the condition that the ignition switch has been turned on; and (b) a shifting member for shifting the automatic transmission is placed in one of a drive position D and a neutral position N.

Step S201 is repeatedly implemented as long as a negative decision (NO) is obtained. When an affirmative decision (YES) is obtained in step S201, the control flow goes to step S202.

Step S202 is implemented to determine whether there is a possibility that the auxiliary battery 42 is aided by another or external assisting power source. An affirmative decision (YES) is obtained in step S202 if a predetermined one of the following three conditions is satisfied, if predetermined at least two of these three conditions are simultaneously satisfied, if any one of these three conditions is satisfied, or if at least two of these three conditions are simultaneously satisfied:

First condition that a covering member in the form of an engine hood or a trunk lid of the vehicle is open, where the auxiliary battery 42 is installed in an engine room accessible by opening the engine hood, or in a trunk room accessible by opening the trunk lid;

Second condition that a positive terminal of the auxiliary battery 42 is exposed with a cover for covering the positive terminal being removed; and Third condition that the voltage of the auxiliary battery is 14V or higher while the load device 30 is disconnected from the main power source 40 by the voltage regulating device 60. This condition is based on a fact that the voltage of the auxiliary battery 42 is 13V or lower where the auxiliary battery 42 is not connected to the external assisting power source, but is raised to 14V or higher where the auxiliary battery 42 is connected to the assisting power source.

If there is a possibility that the auxiliary battery 42 is aided by the external power source, the affirmative decision (YES) is obtained in step S202, and the control flow goes to step S208 to activate the display device 112 for providing the vehicle operator with a warning message "Do not connect the auxiliary battery to an external assisting power source." Then, step S209 is implemented to place the vehicle in the VEHICLE DISABLE state described above. Described in detail, the main power source 40 is inhibited from energizing the electric generator 24 (which is selectively operated as the engine starter). Subsequently, the execution of the present diagnostic routine is inhibited until the ignition switch is turned off.

If a negative decision (NO) is obtained in step S202, the control flow goes to step S203 wherein the OUTPUT INHIBIT command described above is applied to the voltage regulating device 60. As explained above, the OUTPUT INHIBIT command causes the main power source 40 to be disconnected from the load device 30 and the auxiliary battery 42, for supplying the electric power from the main power source 40 preferentially to the inverter 78, so that charging of the capacitor of the inverter 78 can be completed in a short time.

Then, the control flow goes to step S204 to initiate a predetermined operation (hereinafter referred to as "battery diagnosing operation") of the load device 30 for the purpose of diagnosing the auxiliary battery 42. Then, step S205 is implemented to diagnose the auxiliary battery for any abnormality, on the basis of the load voltage detected by the detector 70. This diagnosis is effected in the same manner as in steps S3–S5 and S7–S10 of the first embodiment. Then, step S206 is implemented to terminate the battery diagnosing operation of the load device 30. Step S206 is followed by step S207 to cancel the OUTPUT INHIBIT command, and generate the OUTPUT PERMIT command for commanding the voltage regulating device 60 to permit the main power source 40 to be connected to the load device 30 and the auxiliary battery 42. Then, the execution of the present diagnostic routine is inhibited until the ignition switch is turned off.

It is noted that the present third embodiment is arranged to effect the diagnosis of the auxiliary battery 42 only when the VEHICLE ENABLE signal is generated. This arrangement of limiting the opportunity of effecting the diagnosis is considered not to cause a problem because the state of the auxiliary battery 42 is considered not to change to a considerable extent during running of the vehicle. Rather, the present arrangement of limiting the opportunity of effecting the diagnosis to the moment of generation of the VEHICLE ENABLE signal contributes to an increase in the stability of the amount of electric power consumed by the load device 30 during the diagnosis, and an increase in the accuracy of the diagnosis. However, it is of course possible to effect a periodic diagnosis of the auxiliary battery 42 even after the moment of generation of the VEHICLE ENABLE signal, as in the first embodiment.

Figure 15:
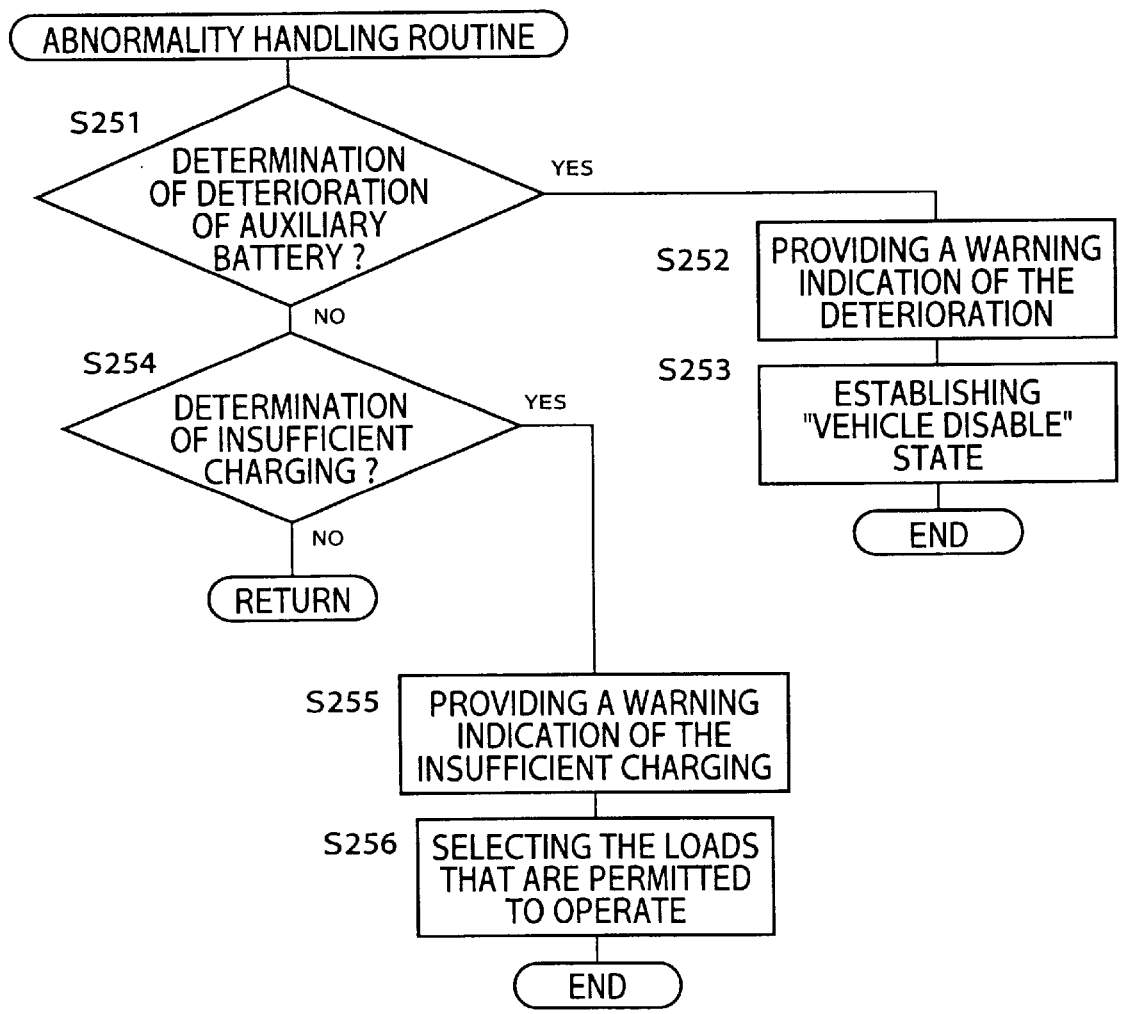
FIG. 15 is a flow chart illustrating an abnormality handling routine executed by the computer 110.

Referring to the flow chart of FIG. 15, there is illustrated an abnormality handling routine to be executed in the present third embodiment. This abnormality handling routine is also repeatedly executed. Each cycle of execution of the routine is initiated with step S151 to determine whether the diagnostic routine has revealed that the auxiliary battery 42 is in the deteriorated state. If an affirmative decision (YES) is obtained in step S251, the control flow goes to step S252 to activate the display device 112 for warning the vehicle operator that the auxiliary battery 42 is in the deteriorated state. Then, step S253 is implemented to place the vehicle in the VEHICLE DISABLE state. Then, the execution of the present routine is inhibited until the ignition switch is turned on again.

If the diagnostic routine has not revealed that the auxiliary battery 42 is not in the deteriorated state, a negative decision (NO) is obtained in step S201, and the control flow goes to step S254 to determine whether the diagnostic routine has revealed that the auxiliary battery 42 is in the insufficiently discharged state. If an affirmative decision (YES) is obtained in step S254, the control flow goes to step S255 to activate the display device 112 for warning the vehicle operator that the auxiliary battery 42 is in the insufficiently charged state.

Then, the control flow goes to step S256 to place the vehicle in an energy saving mode. Described in detail, the loads 50 that are permitted to be operated with the electric power from the main power source 40 are limited, namely, selected according to the priorities given to the loads 50. According to this selection, the LOAD SELECTING signal described above is is generated and applied to the selector switch device 52. Further, the CURRENT LIMITING signal described above is generated to limit the electric current to be applied to the selected loads 50, so as to prevent the amount of consumption of the electric current by the load device 30 from exceeding the maximum electric current of the main power source 40. Subsequently, the execution of the abnormality handling routine is inhibited until the ignition switch is turned on again.

It will be understood from the above description of the present third embodiment that a portion of the computer 110 assigned to execute the diagnostic routine of FIG. 14 constitutes an example of a first diagnosing device for determining whether the subject power source is abnormal or not while the electric power is supplied from only the non-subject power source to the load device, and that the limitation of the output voltage of the voltage regulating device 60 is one form of a power supply state in which the electric power is supplied to the load device 30. It will also be understood that the main power source 40 is one example of a non-subject power source as distinguished from the subject power source, and that a portion of the computer 110 assigned to execute the diagnostic routine of FIG. 14 constitutes an example of means for effecting the diagnosis of the subject power source while the vehicle is in a substantially stopped state. It will further be understood that the switching portion 62 constitutes an example of a device for controlling connection and disconnection of the load device 30 and the subject power source 42 with respect to the non-subject power source 40, while a portion of the computer 110 assigned to implement steps S204 and S207 constitutes an example of means for performing a predetermined operation of the load device 30 with the electric power supplied from the subject power source 42.

Then, a fourth embodiment of this invention will be described.

Figure 16:
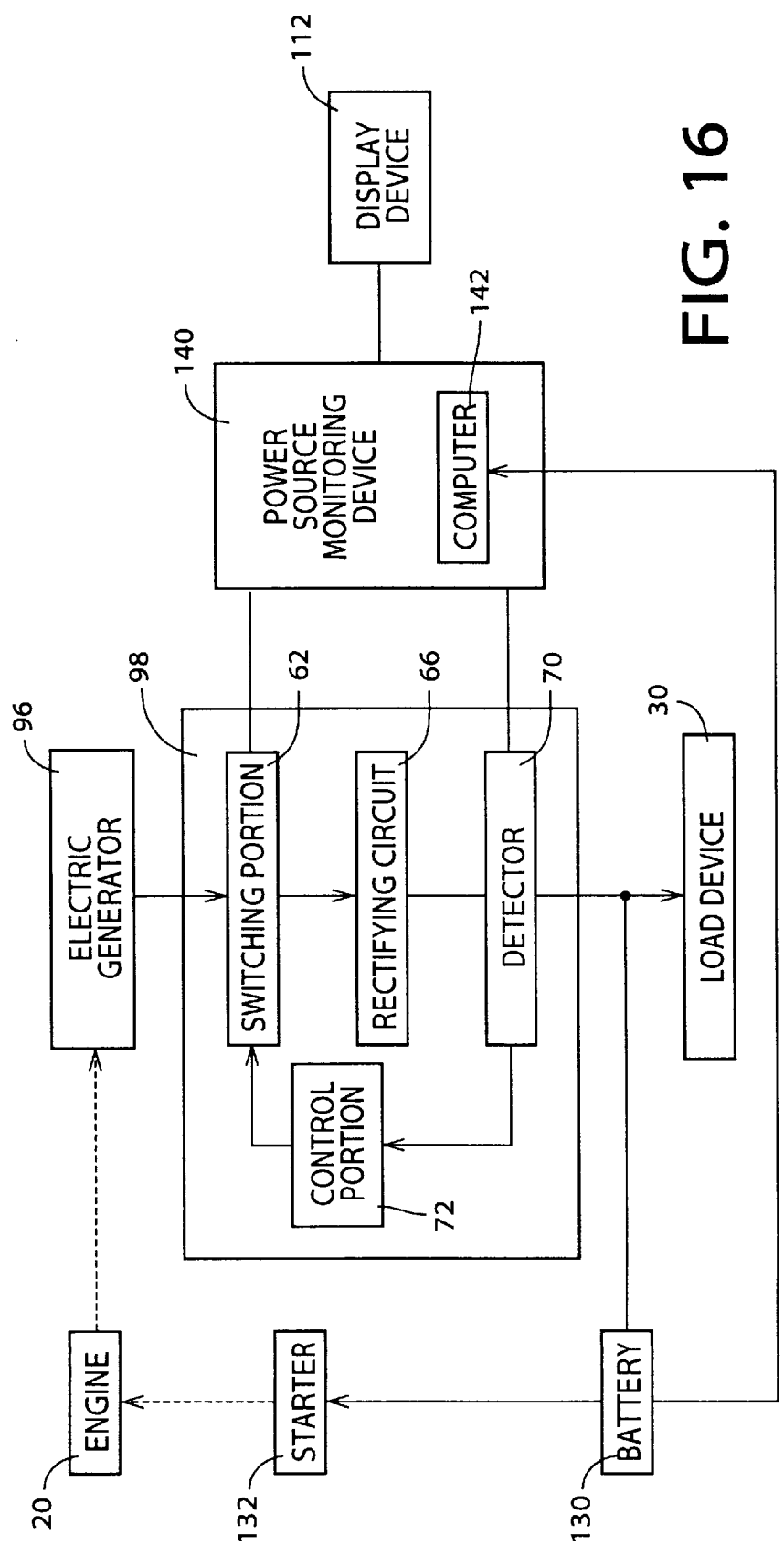
FIG. 16 is a block diagram showing a power source monitoring device 140 in a fourth embodiment of this invention, and electrical devices connected thereto.

Unlike the vehicle provided with the power source monitoring device 10 in the first embodiment, a vehicle provided with a power source monitoring device 140 in the present fourth embodiment has only the engine 20 as the drive power source. In the electric system of the present vehicle, a plurality of power sources include an electric generator 96 operated by the engine 20 to generate an electric power, and a battery 130, as shown in FIG. 16, as in the electric system shown in FIG. 5. The electric generator 96 and the battery 130 are connected to the load device 30. The electric generator 96 is connected to the voltage regulating device 60 in the form of a regulator 98 including the switching portion 62, the rectifying circuit 66, the detector 70 and the control portion 72. The engine is started by a starter 132 which is operated with an electric power supplied from the battery 130. To the switching portion 62 and the detector 70 of the regulator 98, there is connected the above-indicated power source monitoring device 140 constructed according to the present embodiment. To the power source monitoring device 140, there is connected the display device 112. The elements in the present embodiment which are identical with those in the first embodiment are identified by the same reference numerals as used in the first embodiment.

The power source monitoring device 140 is principally constituted by a computer 142 incorporating a CPU, a ROM and a RAM. The computer 142 is operated with an electric power supplied from the battery 130. The ROM stores various control routines such as a diagnostic routine, and an abnormality handling routine identical with that of the third embodiment of FIG. 15. While the diagnostic routine will be described in detail by reference to the flow chart of FIG. 17, no detailed description will be provided with respect to steps similar to those of the diagnostic routine in the third embodiment.

In the present embodiment, the threshold levels $V_{the}$, $V_{thf}$ and threshold time $t_c$ are fixed values, in view of an arrangement wherein the starter 132 is operated with the electric power supplied from the battery 130, to start the engine 20, when the VEHICLE ENABLE signal is generated. The battery 130 is diagnosed for an abnormality, on the basis of the output signal of the detector 70 when the amount of electric power consumed by the battery 130 is larger than a threshold value. This arrangement permits even a small degree of abnormality of the battery 130 which would not be detected if the electric power of the battery 130 were not consumed by the starter 132.

Where the engine 20 cannot be started by turning on the ignition switch, the vehicle operator may start the engine 20 by manual cranking utilizing torques of the drive wheels 23 which are rotated by manual efforts to move the vehicle. When the engine 20 is started by such a manual cranking, the battery 130 cannot be diagnosed as intended, since the electric power stored in the battery 130 is not consumed by the starter 132.

In the light of the above fact that the diagnosis of the battery 130 cannot be effected as intended if the engine 20 is started by the manual cranking, the present embodiment is adapted to check if the engine 20 is started by the manual cranking or not, upon generation of the VEHICLE ENABLE signal, and provide a warning message prompting the vehicle operator not to effect the manual cranking to start the engine 20, if the checking reveals the manual cranking of the engine 20. In this case, the vehicle is placed in the VEHICLE DISABLE state for inhibiting the operations of the vehicle normally performed upon generation of the VEHICLE ENABLE signal such as an operation to start the engine.

Figure 17:
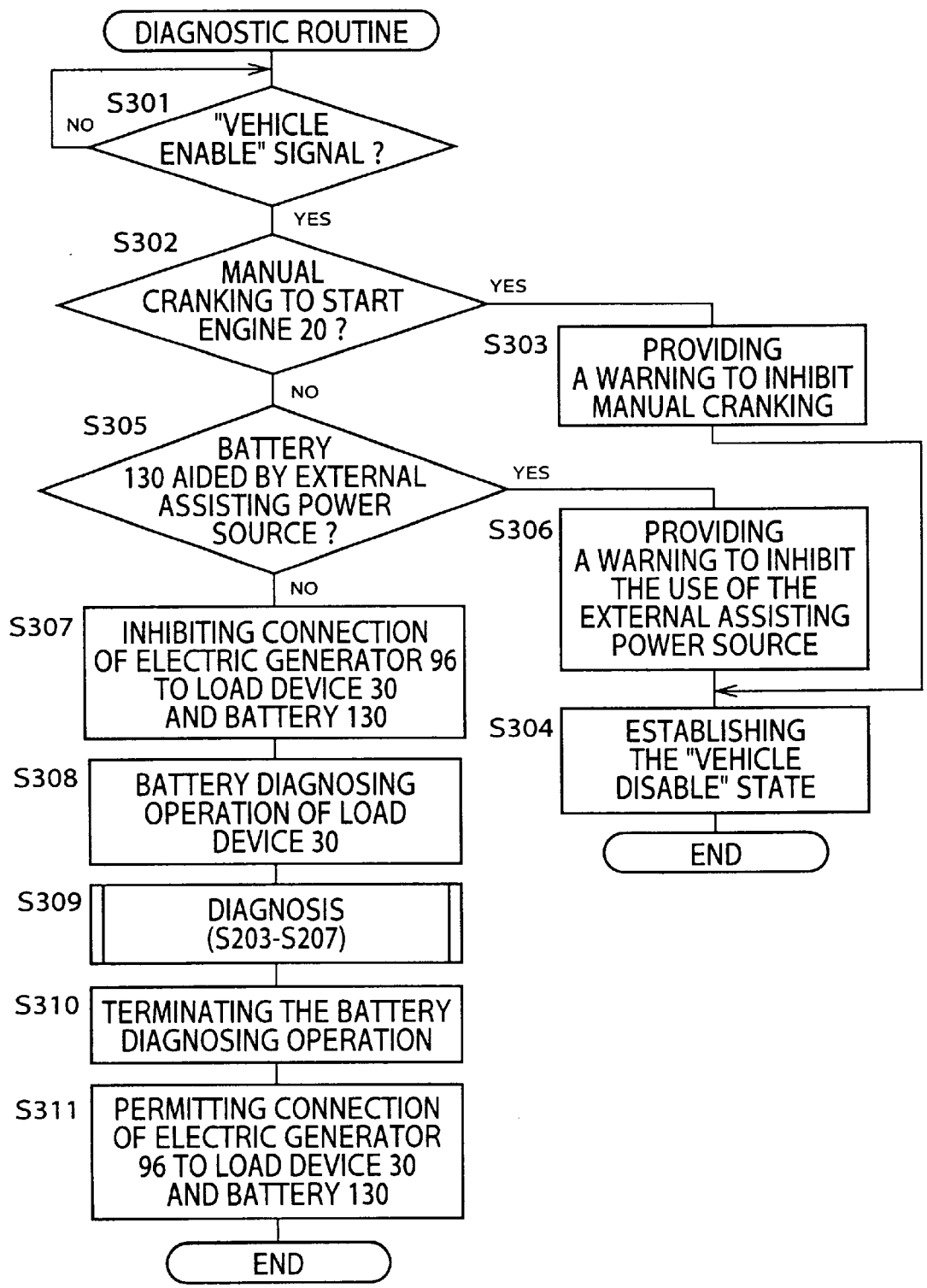
FIG. 17 is a flow chart illustrating a diagnostic routine executed by a computer 142 of the monitoring device 140 of FIG. 16.
Figure 18:
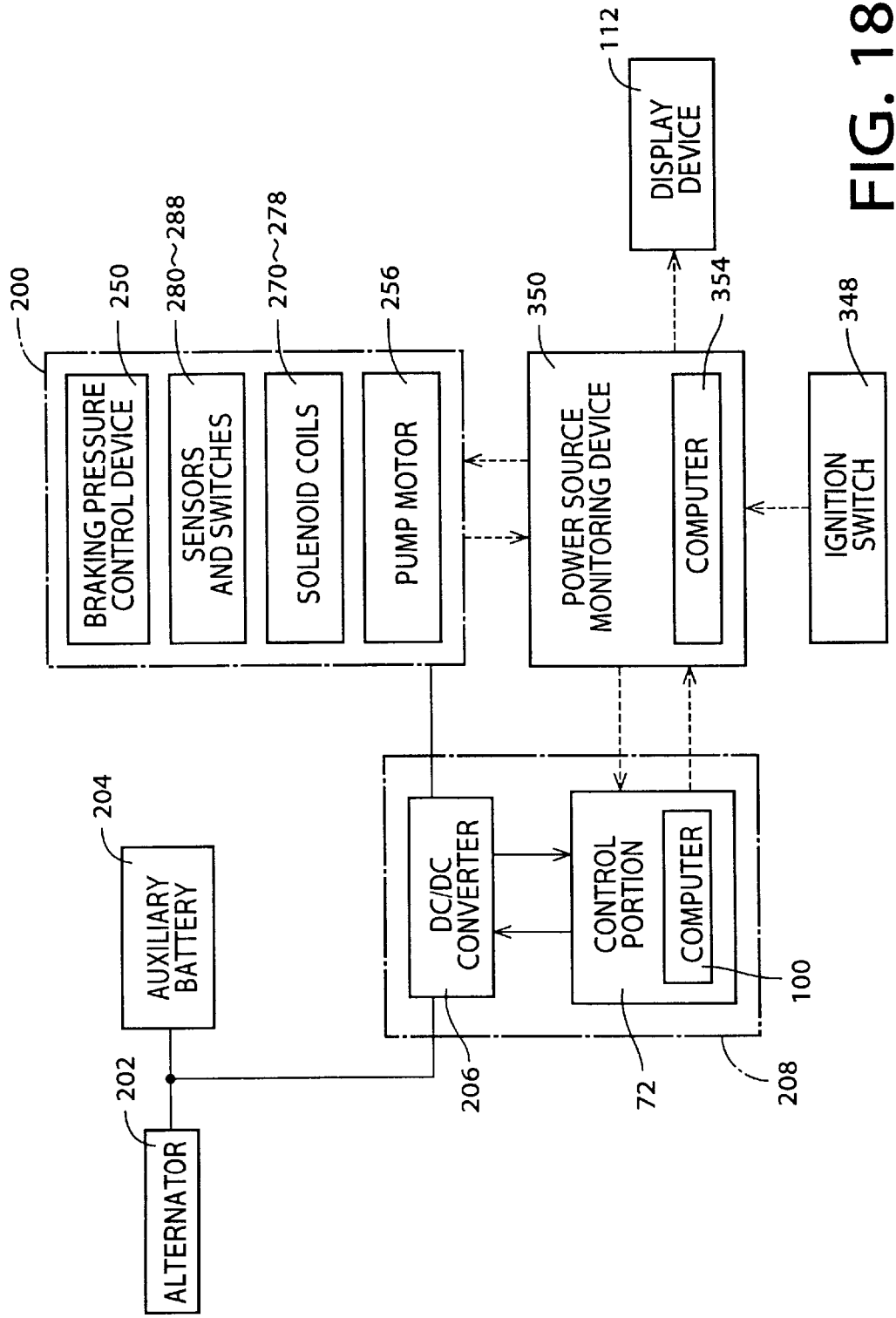
FIG. 18 is a block diagram showing a power source monitoring device 350 in a fifth embodiment of this invention, and electrical devices connected thereto.

Referring to the flow chart of FIG. 17, there is illustrated the diagnostic routine to be executed according to the present embodiment. This routine is initiated with step S301 to determine whether the VEHICLE ENABLE signal has been generated by a manual operation by the vehicle operator. Step S301 is repeatedly implemented as long as a negative decision (NO) is obtained. When an affirmative decision (YES) is obtained in step S301, the control flow goes to step S302.

Step S302 is implemented to determine whether there is a possibility that the engine 20 is started by manual cranking. Where the vehicle is of the MT type, an affirmative decision (YES) is obtained in step S302 if a predetermined one of the following five conditions is satisfied, if predetermined at least two of these five conditions are simultaneously satisfied, if any one of these five conditions is satisfied, or if at least two of these five conditions are simultaneously satisfied:

First condition that the vehicle speed or wheel speed is substantially zero;

Second condition that a primary brake system is not operated by the vehicle operator, for instance, that an operation of the primary brake system is not detected by a primary brake switch provided to detect the operation of the primary brake system;

Third condition that a parking brake system is not operated by the vehicle operator, for example, that an operation of the parking brake system is not detected by a parking brake switch provided to detect the operation of the parking brake system;

Fourth condition that a shifting member for shifting the manual transmission is not placed in its neutral position; and Fifth condition that a clutch which is engaged to connect the engine 20 and the manual transmission to each other and released to disconnect the engine 20 and the manual transmission from each other is placed in the engaged state.

Where the vehicle is of the AT type, the affirmative decision (YES) is obtained in step S302 if a predetermined one of four conditions consisting of the above-indicated first, third and fourth conditions and a sixth condition described below is satisfied, if predetermined at least two of these four conditions are simultaneously satisfied, if any one of these four conditions is satisfied, or if at least two of these four conditions are simultaneously satisfied. The sixth condition is that the shifting member is operated from its parking position to another position. This sixth condition may be satisfied, if a shift lock mechanism for preventing starting of the AT type vehicle due to an erroneous operation of the shifting member is placed in the released position.

If there is a possibility that the engine 20 is started by the manual cranking, the affirmative decision (YES) is obtained in step S302, and the control flow goes to step S303 to activate the display device 112 for providing the vehicle operator with a warning message "Do not start the engine by manual cranking". Then, step S304 is implemented to place the vehicle in the VEHICLE DISABLE state described above. Described in detail, the main power source 40 is inhibited from energizing the electric generator 24 (which is selectively operated as the engine starter). Subsequently, the execution of the present diagnostic routine is inhibited until the ignition switch is turned off.

If there is not a possibility that the engine 20 is started by the manual cranking, a negative decision (NO) Is obtained in step S302, and the control flow goes to step S305 to determine whether there is a possibility that the battery 130 is aided by another or external assisting power source.

If there is a possibility that the battery 130 is aided by the assisting power source, an affirmative decision (YES) is obtained in step S305, and the control flow goes to step S306 to activate the display device 112 for providing the vehicle operator with a warning message "Do not connect the battery to an external assisting power source." Then, step S306 is implemented to place the vehicle in the VEHICLE DISABLE state described above. Subsequently, the execution of the present diagnostic routine is inhibited until the ignition switch is turned off.

If there is neither a possibility that the engine 20 is started by the manual cranking, nor a possibility that the battery 130 is aided by the assisting power source, the negative decision (NO) is obtained in both of the steps S302 and S305, and the control flow goes to step S307 wherein the OUTPUT INHIBIT command described above is applied to the voltage regulating device 60 (regulator 98).

Then, the control flow goes to steps S308–S311 identical with steps S203–S207 in the third embodiment. Thus, one cycle of execution of the diagnostic routine is terminated. Then, the execution of the present diagnostic routine is inhibited until the ignition switch is turned off.

It will be understood from the above description of the present fourth embodiment that the battery 130 is one example of a subject power source to be diagnosed by the power source monitoring device 140, while the electric generator 96 is one example of a non-subject power source as distinguished from the subject power source. It will also be understood that a portion of the computer 142 assigned to execute the diagnostic routine of FIG. 17 constitutes an example of a first diagnosing device for determining whether the subject power source is abnormal or not while the electric power is supplied from only the non-subject power source to the load device, and that the limitation of the output voltage of the voltage regulating device 60 is one form of a power supply state in which the electric power is supplied the load device 30. It will also be understood that a portion of the computer 142 assigned to execute the diagnostic routine of FIG. 17 constitutes an example of means for effecting the diagnosis of the subject power source while the vehicle is in a substantially stopped state. It will further be understood that the switching portion 62 constitutes an example of a device for controlling connection and disconnection of the load device 30 and the subject power source 42 with respect to the non-subject power source 96, while a portion of the computer 142 assigned to implement steps S308 and S310 constitutes an example of means for performing a predetermined operation of the load device 30 with the electric power supplied from the subject power source 130. It will also be understood that a portion of the computer 142 assigned to implement step S302 constitutes an example of means for effecting the diagnosis of the subject power source 130 when the amount of electric power of the subject power source which is consumed by the load device is larger than a threshold value.

It is noted that while the embodiments described above are adapted to diagnose the subject power source for abnormality, by comparing the load voltage detected by the detector 70 with the threshold levels, the monitoring device according to the present invention may be adapted to diagnose the subject power source for abnormality, by comparing an amount of change of the detected load voltage with predetermined threshold values. The amount of change of the detected load voltage is an amount of change of the load voltage value detected in each cycle of execution of the diagnostic routine, from the load voltage value detected in the first cycle of execution, or an amount of change of the load voltage value detected in each cycle of execution from the load voltage value detected in the preceding cycle, which amount of change represents the rate of change of the detected load voltage.

While the computer for controlling the DC/DC converter is provided in addition to the computer of the power source monitoring device in the embodiments described above, a single computer may be used for controlling the DC/DC converter and for monitoring the subject power source.

There will next be described a power source monitoring device constructed according to a fifth embodiment of this invention. In the present embodiment, an alternator 202 serving as an electric generator and an auxiliary battery 204 are connected to a load device 200 through a DC/DC converter 206. The alternator 202 is operated by the engine 20 of the vehicle, to generate an electric power, while the auxiliary battery 204 is charged with the electric power generated by the alternator 202. The DC/DC converter 206, which is similar to that shown in FIG. 4, includes the switching portion 62 having the transistor bridge circuit 85, the transformer 64 and the rectifying circuit 66. The on/off control of the switching portion 62 is effected by the control portion 62 incorporating the computer 100, for regulating the electric power supplied to the load device 200. When the auxiliary battery 204 is diagnosed, the DC/DC converter 206 (switching portion 62) is controlled so that the amount of electric power consumed by the load device 200 is made equal to a predetermined value, that is, so that the amount of electric power to be supplied to the load device 200 is made equal to a predetermined amount. The DC/DC converter 206 and the control portion 72 cooperate to constitute a major portion of a supply power regulating device 208.

Figure 19:
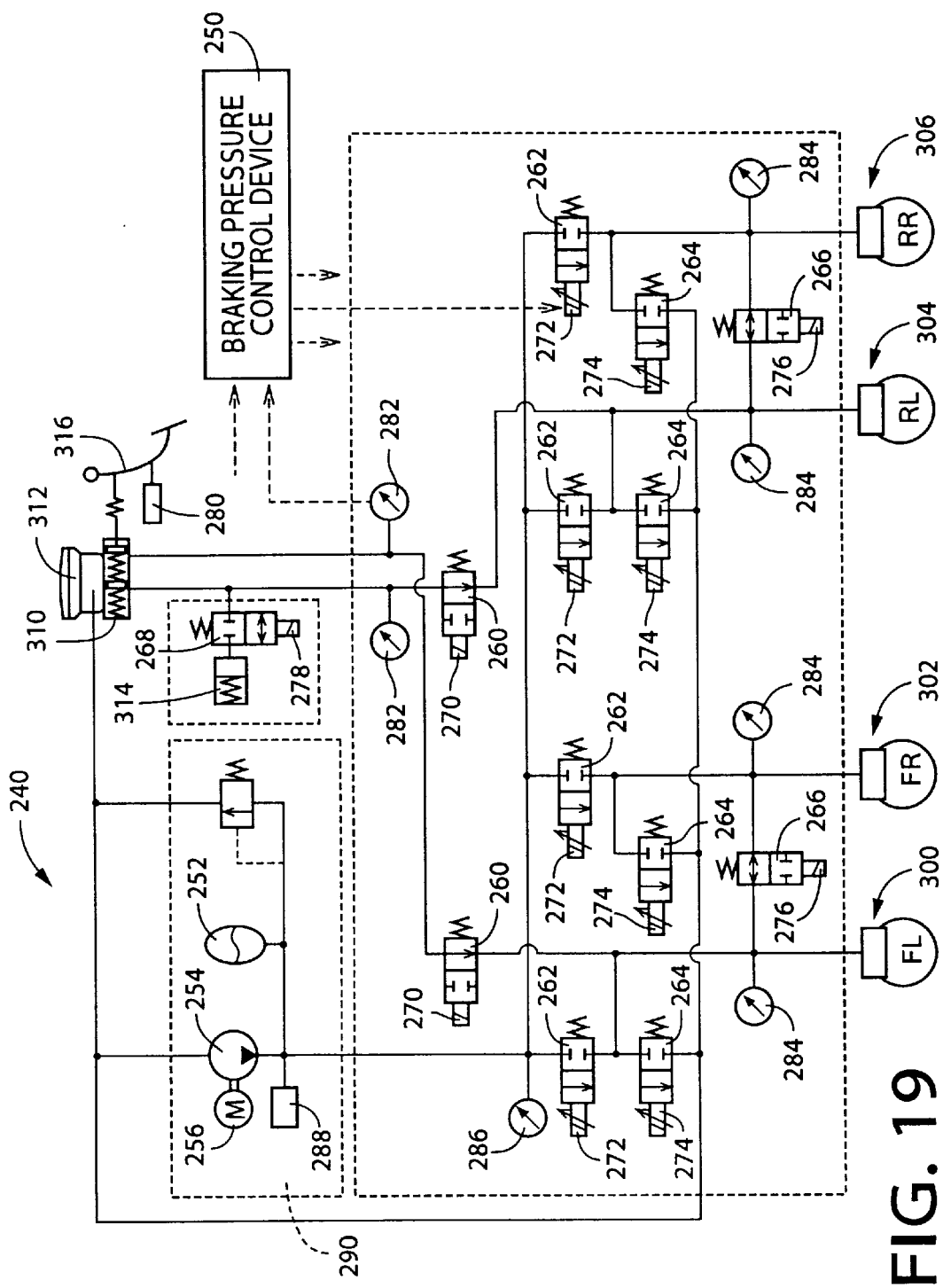
FIG. 19 is a circuit diagram of a braking system including a load device 300 including some of the electrical devices shown in FIG. 18.
Figure 20:
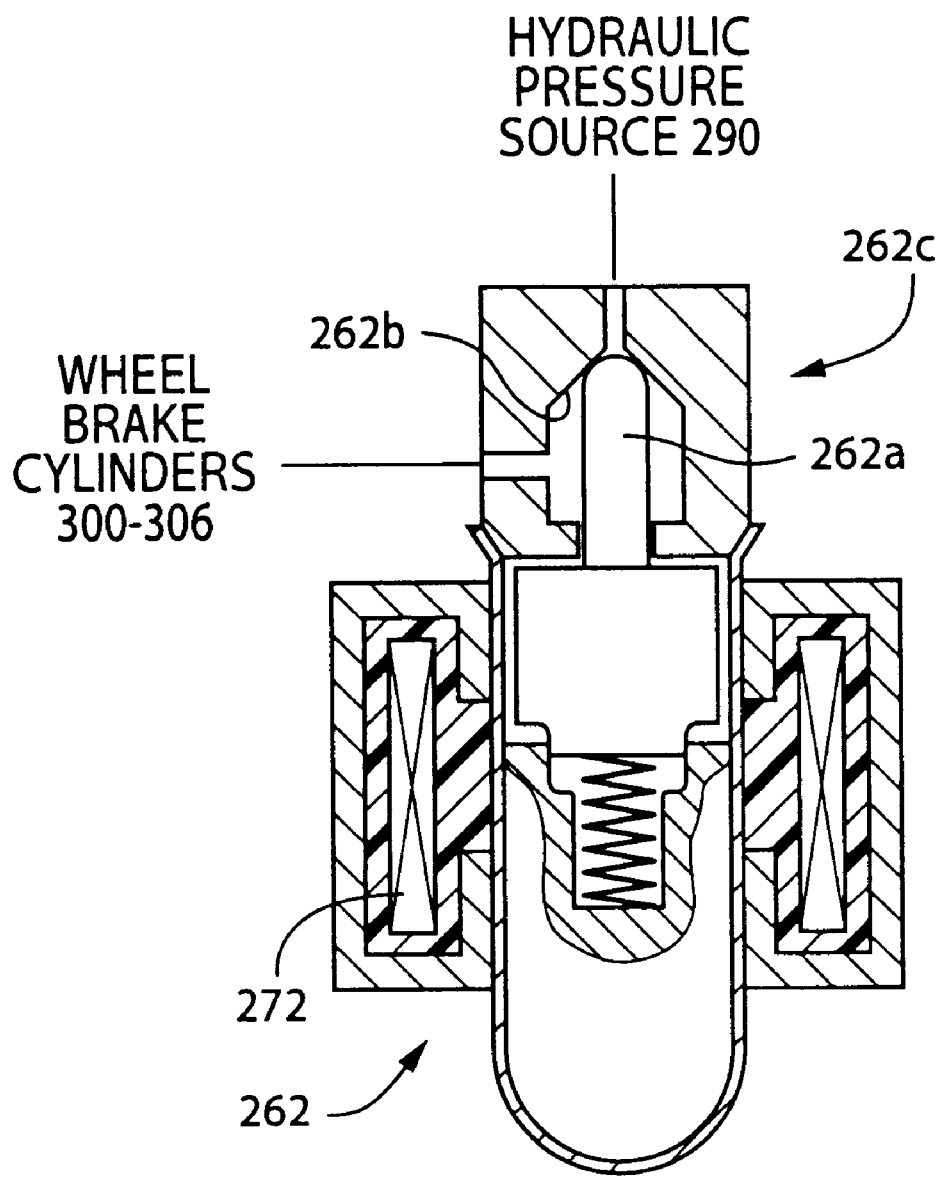
FIG. 20 is an elevational view in cross section of a linear pressure control valve included in the braking system of FIG. 19.

The load device 200 in the present embodiment includes a plurality of electrically operated loads provided in a braking system 240 as shown in FIG. 19. For instance, the electrically operated loads include a braking pressure control device 250 principally constituted by a computer, an electrically operated pump motor 256 for operating a pump 254 to deliver a pressurized working fluid to be stored in an accumulator 252, solenoid coils 270–278 included in a plurality of solenoid-operated control valves 260–268, driver circuits (not shown) for driving the solenoid coils 270–278, and various sensors and switches 280–288. The accumulator 252, the pump 254 and the pump motor 256 are major elements of an electrically operated hydraulic pressure source 290.

In the braking system 240, the pump motor 256 is controlled such that the pressure of the working fluid stored in the accumulator 252 is held within a predetermined range, while the electric system is normal.

Further, the amounts of electric current to be supplied to the plurality of solenoid coils 270–278 are controlled. Of the solenoid-operated control valves 260–268, the control valves 260, 266 and 268 are solenoid-operated shut-off valves, and the solenoid coils 270, 276 and 278 are controlled so as to be selectively energized and de-energized. The solenoid-operated pressure control valves 262, 264 are linear solenoid valves having the solenoid coils 272, 274. The amounts of electric current supplied to these solenoid coils 272, 274 are controlled for regulating the fluid pressure.

The solenoid-operated shut-off valves 260 are provided between wheel brake cylinders 300–306 and a master cylinder 310. While the solenoid coils 270 of the shut-off valves 260 are in the de-energized state, the wheel brake cylinders 300–306 are held in communication with the master cylinder 310. While the solenoid coils 270 are in the energized state, the wheel brake cylinders 300–306 are disconnected from the master cylinder 310. Described more precisely, while the solenoid-operated shut-off valves 266 are open (with their solenoid coils 276 being de-energized), the wheel brake cylinders 300–306 are held in communication with the master cylinder 310. While the shut-off valves 266 are closed (with their solenoid coils 276 being energized), only the wheel brake cylinders 300, 304 are communicated with the master cylinder 310, and the wheel brake cylinders 300, 302 are disconnected from each other while the wheel brake cylinders 304, 306 are disconnected from each other.

Each linear solenoid valve 262 is a normally closed valve including a seating valve 262*c* which has a valve member 262*a* and a valve seat 262*b*. A difference between the fluid pressure in the wheel brake cylinder 300–306 and the fluid pressure of the electrically operated hydraulic pressure source 290 can be controlled according to an amount of electric current applied to the solenoid coil 262, such that the fluid pressure in the wheel brake cylinder increases toward the fluid pressure of the hydraulic pressure source 290, with an increase in the amount of electric current applied to the solenoid coil 272.

Each linear solenoid valve 264, which is identical in construction with the linear solenoid valve 262, is disposed between the corresponding wheel brake cylinder 300–306 and a master reservoir 312. By controlling the amounts of electric current to be applied to the solenoid coils 272, 274 of the linear solenoid valves 262, 264, the fluid pressures in the wheel brake cylinders 300–306 are controlled to a determined desired or target level. The solenoid-operated shut-off valve 268 is disposed between the master cylinder 310 and a stroke simulator 314. When an electric current is applied to the solenoid coil 278 of the shut-off valve 268, the master cylinder 310 and the stroke simulator 314 are brought into communication with each other through the shut-off valve 268, so as to permit an operation of a brake pedal 316.

An amount of operation of the brake pedal 316 is detected by the pedal operation sensor 280. The fluid pressure in the master cylinder 310 is detected by the pressure sensor 282, and the fluid pressures in the wheel brake cylinders 300–306 are detected by respective pressure sensors 284. In the present embodiment, a braking force desired by the vehicle operator is determined on the basis of the operating stroke of the brake pedal 316 detected by the pedal operation sensor 280, in an initial period of operation of the brake pedal 316, and on the basis of the fluid pressure in the master cylinder 310 detected by the pressure sensor 282, in the subsequent period of operation of the brake pedal 316. An output of the accumulator switch 288 indicates whether the fluid pressure in the accumulator 252 is in the predetermined range. The pressure of the pressurized fluid delivered from the electrically operated hydraulic pressure source 290 is detected by the pressure sensor 286.

In a normal operation of the braking system 240, the desired braking force is determined on the basis of the operating stroke of the brake pedal 316 or the fluid pressure in the master cylinder 310, and the desired fluid pressure in the wheel brake cylinders 300–306 is determined on the basis f the determined desired braking force, so that the actual fluid pressure in the wheel brake cylinders is controlled to the determined desired fluid pressure.

When the fluid pressure in the wheel brake cylinders 300–306 is controlled, the solenoid coils 270 are energized to disconnect the wheel brake cylinders 300–306 from the master cylinder 310, and the wheel brake cylinders are communicated with the hydraulic pressure source 290, so that the wheel brake cylinder pressure is controlled by utilizing the pressurized fluid delivered from the hydraulic pressure source 290. The solenoid-operated shut-off valve 260 is opened with its solenoid coil 278 being energized, for communication of the master cylinder 310 with the stroke simulator 314. The solenoid-operated shut-off valves 266 are held open for communication of the two wheel brake cylinders 300, 302 with each other and for communication of the two wheel brake cylinders 304, 306 with each other, so that the fluid pressures in the four wheel brake cylinders 300–306 are controlled to the substantially same level, in the normal braking operation. In this condition, the amounts of electric current applied to the solenoid coils 272, 274 of the linear solenoid valves 262, 264 are controlled so that the wheel brake cylinder pressure coincides with the desired level.

When the tendency of slipping of a certain wheel of the vehicle during activation of the braking system 240 by operation of the brake pedal 316 becomes excessive with respect to the friction coefficient of the road surface, an anti-lock pressure control operation is performed for the wheel brake cylinder 300–306 corresponding to the slipping wheel in question. The linear solenoid valves 262, 264 are controlled to regulate the fluid pressure in the wheel brake cylinder 300–306 in question, while the corresponding solenoid-operated shut-off valve 260 and the two solenoid-operated shut-off valves 266 are held in the closed position, so that the tendency of slipping of the wheel in question is held in an optimum range. In the anti-lock pressure control wherein the fluid pressures in the individual wheel brake cylinders 300–306 are controlled independently of each other, the two solenoid-operated shut-off valves 266 are held in the closed position.

In the present embodiment, the auxiliary battery 204 is diagnosed for an abnormality while the pump motor 256 is in operation. The amount of electric power consumed by the pump motor 256 is controlled by the DC/DC converter 206, so that the electric power consumed by the pump motor 256 is made equal to the predetermined value. When the ignition switch 348 is turned on, the pump motor 256 is turned on to start the pump 254, for initiating a flow of the pressurized fluid delivered from the pump 254 into the accumulator 252.

Thus, the fluid pressure in the accumulator 252 is raised before the brake pedal 316 is operated. This arrangement is useful for a braking operation initiated by an operation of the brake pedal 316.

The present embodiment is adapted to inhibit the operation of the pump motor 256 and hold the solenoid coils 270–278 in the de-energized state, if the diagnosis reveals an abnormality of the auxiliary battery 204. In this case, therefore, the solenoid-operated control valves 260–268 are held in the original positions, for fluid communication of the wheel brake cylinders 300–306 with the master cylinder 310.

That is, if the diagnosis reveals an abnormality of the auxiliary battery 204, the amount of electric power to be supplied to the load device 200 is restricted by the DC/DC converter 206, to a minimum extent necessary to assure an operation of the braking pressure control device 250 (its computer).

The diagnosis of the auxiliary battery 204 is effected by the power source monitoring device 350. In the present embodiment, the monitoring device 350 determines that the auxiliary battery 204 is abnormal, if the duty ratio of the switching portion 62 of the DC/DC converter 206 is higher than a predetermined threshold.

Where the amount of electric power consumed by the load device 200 is constant, that is, where the amount of electric power supplied from the DC/DC converter 206 to the load device 200 is constant, the duty ratio of the switching portion 62 is relatively low when the voltage applied to the DC/DC converter 206 is relatively high, and is relatively high when the voltage is relatively low. Accordingly, if the duty ratio is higher than the threshold, it indicates that the voltage of the auxiliary battery 204 is lower than a predetermined threshold, and therefore indicates that the auxiliary battery 204 is abnormal. In the present embodiment, the control signal applied to the switching portion 62, which represents the duty ratio of the switching portion 62, is read into the computer 100 and used to diagnose the auxiliary battery 204. It is noted that the duty ratio of the switching portion 62 may be detected on the basis of the electric current flowing through the switching portion 62.

The determination as to whether the duty ratio of the switching portion 62 of the DC/DC converter 206 is higher than the predetermined threshold is effected at two points of time, namely, when the ignition switch 348 is turned from off to on and when the ignition switch 348 is turned from on to off. At each of these two points of time, the electric power is supplied from the auxiliary battery 204 to the DC/DC converter 206, while no electric power is supplied from the alternator 202 to the DC/DC converter 206. When the ignition switch 348 is turned on, the amount of operation of the alternator 202 is not sufficient, and the electric power is not supplied from the alternator 202 to the DC/DC converter 206. When the ignition switch 348 is turned off, the engine 20 is turned off, and accordingly the alternator 202 is turned off.

A result of the diagnostic determination obtained when the ignition switch 348 is turned off (hereinafter referred to as "IGNITION-OFF diagnostic result") is stored in a memory which is not cleared while the ignition switch 348 is held off. When the ignition switch 348 is turned on again, the diagnostic determination is made while taking the IGNITION-OFF diagnostic result into account. If the IGNITION-OFF diagnostic result is a determination that the auxiliary battery 204 is abnormal and if a diagnostic result provisionally obtained when the ignition switch 348 is turned on again (hereinafter referred to as "provisional IGNITION-ON diagnostic result") is a determination that the auxiliary battery 204 is normal, there is a possibility that the ignition switch 348 is turned on while the auxiliary battery 204 is connected to or aided by an external assisting power source through a booster or jumper cable) to start the engine 20 (to effect a so-called "jumper start" of the engine 20). In this case, the provisional IGNITION-ON diagnostic result is the determination of the normal state of the auxiliary battery 204, while the auxiliary battery 204 is in fact in a deteriorated state. In this case, therefore, the power source monitoring device 350 eventually obtains a final diagnostic determination that the auxiliary battery 204 is abnormal.

Where the auxiliary battery 204 is replaced with a fresh one, too, the IGNITION-OFF diagnostic result is a determination of an abnormal state of the auxiliary battery 205, and the provisional IGNITION-ON diagnostic result is a determination of the normal state. In this case, too, the monitoring device 350 obtains the final diagnostic determination that the auxiliary battery 204 is abnormal. When the ignition switch 348 is turned off again, the IGNITION-OFF diagnostic result is a determination of the normal state, and the subsequent erroneous diagnostic determinations that the auxiliary battery 204 is abnormal can be avoided. The replacement of the auxiliary battery 204 can be detected on the basis of the three successive diagnostic results (first IGNITION-OFF diagnostic result, provisional IGNITION-ON diagnostic result, and second IGNITION-OFF diagnostic result).

Figure 21:
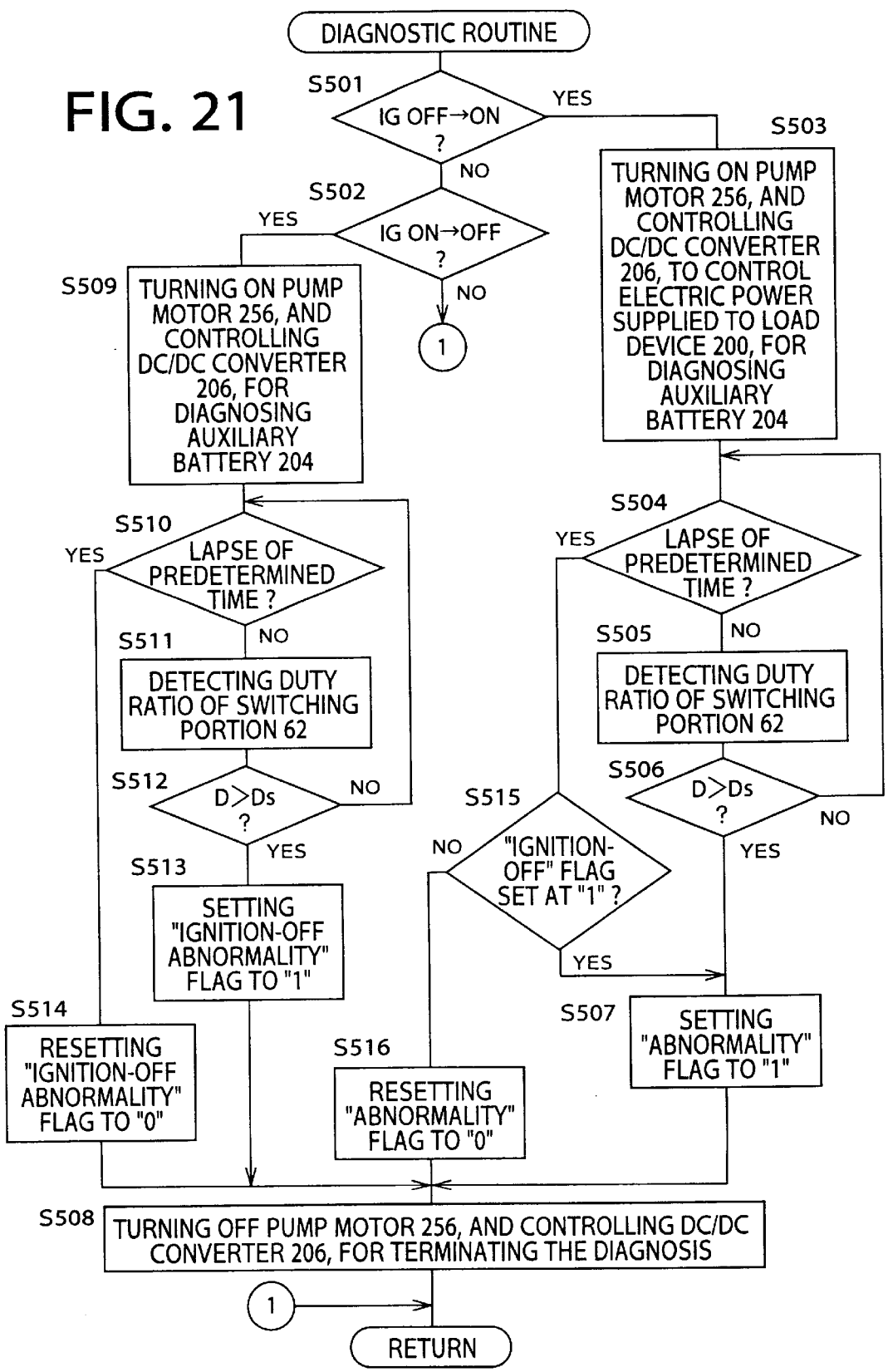
FIG. 21 is a flow chart illustrating a diagnostic routine executed by a computer 354 of the power source monitoring device 350 of FIG. 18.
Figure 22:
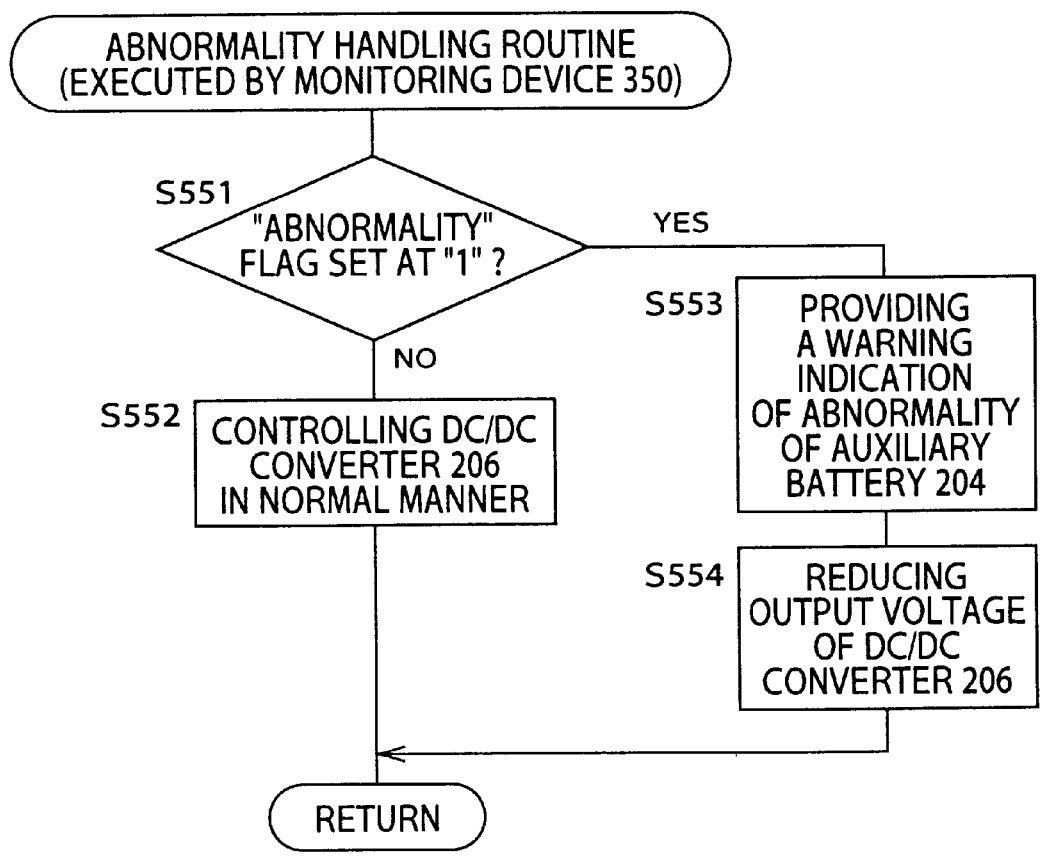
FIG. 22 is a flow chart illustrating an abnormality handling routine executed by the computer 354.

The computer 354 of the power source monitoring device 350 has a memory which stores control programs such as those for executing a diagnostic routine illustrated in the flow chart of FIG. 21 and an abnormality handling routine illustrated in the flow chart of FIG. 22.

The diagnostic routine of FIG. 21 is executed at a predetermined time interval. The routine is initiated with step S501 to determine whether the ignition switch 348 is turned from off to on. Step S502 is then implemented to determine whether the ignition switch 348 is turned from on to off. If the ignition switch 348 is turned from off to on, an affirmative decision (YES) is obtained in step S501, and the control flow goes to step S503 to command the braking system 240 to turn on the pump motor 256, and command the computer 100 of the supply power regulating device 208 to establish the predetermined amount of electric power to be supplied to the load device 200. As a result, the duty ratio of the switching portion 62 of the DC/DC converter 206 is controlled so that the load acting on the pump motor 256 is made equal to a predetermined value. Thus, the amount of electric power to be supplied from the auxiliary battery 204 to the load device 200 is reduced by the DC/DC converter 206 to the predetermined value. This control is effected for diagnosing the auxiliary battery 204 for an abnormality, and may be referred to as "diagnostic control" of the duty ratio of the switching portion 62.

Then, the control flow goes to step S504 to determine whether a predetermined time has passed after the initiation of the diagnostic control of the duty ratio of the switching portion 62 of the DC/DC converter 206 (after the initiation of the operation of the pump motor 256). Before the predetermined time has passed, a negative decision (NO) is obtained in step S504, and the control flow goes to step S505 to detect the duty ratio D of the switching portion 62, and then goes to step S507 to determine whether the detected duty ratio D is higher than a predetermined threshold $D_s$. If the duty ratio D is not higher than the threshold $D_s$, the control flow goes back to step S504. Steps S504–S507 are repeatedly implemented until an affirmative decision (YES) is obtained in step S506. As described above with respect to the first embodiment, the voltage of the auxiliary battery 204 will not drop immediately after the supply of the electric power from the auxiliary battery 204 to the load device 200 is initiated, even if the auxiliary battery 204 is abnormal.

If the duty ratio D becomes higher than the threshold $D_s$ as a result of repeated implementation of steps S504–S506, the affirmative decision (YES) is obtained in step S506, and the control flow goes to step S507 to set an ABNORMALITY flag to "1", and then to step S508 to generate commands for terminating the diagnostic operation, more specifically, to command the braking system 240 to turn off the pump motor 256, and command the computer 100 to terminate the diagnostic control of the duty ratio of the switching portion 62.

When the ignition switch 348 is turned from on to off, an affirmative decision (YES) is obtained in step S502, and the control flow goes to step S509 in which the pump motor 256 is turned on and the diagnostic control of the duty ratio of the switching portion 62 is effected, as in step S503 which is implemented when the ignition switch 348 is turned from off to on. Step S509 is followed by steps S510–S512 to determine whether the duty ratio D becomes higher than the threshold $D_s$ during the predetermined time. If the duty ratio D becomes higher than the threshold $D_s$ during the predetermined time, it indicates that the auxiliary battery 204 is abnormal. In this case, the control flow goes to step S513 in which an IGNITION-OFF ABNORMALITY flag is set to "1". If the duty ratio D does not become higher than the threshold $D_s$ during the predetermined time, it indicates that the auxiliary battery 204 is normal. In this case, the control flow goes to step S514 to reset the IGNITION-OFF ABNORMALITY flag to "0".

As described above, steps S503–S506 are implemented when the ignition switch 348 is turned from off to on. If the duty ratio D becomes higher than the threshold $D_s$ during the predetermined time, the ABNORMALITY flag is set in step s507, as described above. If the duty ratio D does not become higher than the threshold $D_s$ during the predetermined time, an affirmative decision (YES) is obtained in step S503, and the control flow goes to step S515 to determine whether the IGNITION-OFF ABNORMALITY flag is set at "1". If an affirmative decision (YES) is obtained in step S515, the control flow goes to step S507 to set the ABNORMALITY flag to "1". Even if the auxiliary battery 204 is normal (the duty ratio of the switching portion 62 is not higher than the threshold) upon termination of the predetermined time after the ignition switch 348 is turned from off to on, the auxiliary battery 204 is determined to be abnormal if the auxiliary battery 204 was determined abnormal (the duty ratio was higher than the threshold) when the ignition switch 348 was previously turned from on to off, since this situation indicates that the ignition switch 348 is turned on this time with the auxiliary battery 204 connected to the external assisting power source, while the auxiliary battery 204 is deteriorated (after this deterioration has been detected). In this sense, the IGNITION-OFF ABNORMALITY flag may be considered to indicate the previous determination of the deterioration of the auxiliary battery 204. If the IGNITION-OFF ABNORMALITY flag is set at "0", on the other hand, this means that the duty ratio D of the switching portion 62 is not higher than the threshold $D_s$ both when the ignition switch 348 is turned on and when the same is turned off. In this case, the auxiliary battery 204 is determined to be normal, and the control flow goes to step S516 to reset the ABNORMALITY flag to "0".

Depending upon the state of the ABNORMALITY flag, the power source monitoring device 350 controls the display device 112 and the DC/DC converter 206, as described below.

The abnormality handling routine illustrated in the flow chart of FIG. 22 is executed at a predetermined time interval.

The routine of FIG. 22 is initiated with step S551 to determine whether the ABNORMALITY flag is set at "1". If the ABNORMALITY flag is not set at "1", it means that the auxiliary battery 204 is normal, and the control flow goes to step S552 to command the computer 100 to control the DC/DC converter 206 in the normal manner, that is, such that the output voltage of the converter 206 is made equal to the nominal value (e.g., 14V) in the present embodiment. If the ABNORMALITY flag is set at "1", on the other hand, the control flow goes to step S553 to activate the display device 112 to provide a warning indication that the auxiliary battery 204 is abnormal, and to step S554 to command the computer 100 to lower the output voltage of the DC/DC converter 206, to a level slightly higher than the lowest level necessary to permit an operation of the braking pressure control device 250 which is principally constituted by a computer. When the auxiliary battery 204 is abnormal, the load device 200 is operated with the electric power supplied from the alternator 202. If the amount of electric current consumed by the load device 200 (load current) exceeds the maximum electric current that can be supplied from the alternator 202 (maximum current capacity of the alternator 202), the voltage of the load device 200 may suddenly drop to a level lower than the above-indicated lowest level which permits the operation of the computer of the braking pressure control device 250. To avoid this situation, it is desirable that the output voltage of the DC/DC converter 206 be lowered to restrict the operation of the load device 200, in the case where the auxiliary battery 204 is determined to be abnormal.

As a result of the lowering of the output voltage of the DC/DC converter 206, the solenoid coils 270–278 in the braking system 240 are brought to the de-energized state, so that the wheel brake cylinders 300–306 are held in communication with the master cylinder 310.

When the brake pedal 316 is depressed in the above condition, the working fluid pressurized by the master cylinder 310 is delivered directly to the wheel brake cylinders 300–306, for braking the wheels of the vehicle.

Thus, the present embodiment is arranged to effect the diagnosis of the auxiliary battery 204 on the basis of the duty ratio of the DC/DC converter 206, which is disposed between the electric power source consisting of the alternator 202 and the auxiliary battery 204, and the load device 200.

Since the DC/DC converter 206 is disposed between the load device 200 and the electric power source (alternator 202 and auxiliary battery 204), the amount of variation of the voltage to be applied to the load device 200 can be reduced. Where the DC/DC converter 206 were not provided, the electric power would be supplied from the alternator 202 or auxiliary battery 204 directly to the load device 200. In this case, the amount of variation of the voltage to be applied to the load device 200 would be relatively large. Therefore, the electrically operated loads included in the load device 200 must be constructed so as to withstand the highest voltage applied thereto. For instance, the number of windings of the coils of the loads must be increased. In the presence of the DC/DC converter 206, the voltage applied to the load device 200 can be controlled to be substantially constant, and the loads of the load device 200 need not be constructed so as to withstand an excessively high voltage. Accordingly, the provision of the DC/DC converter 206 permits reduction in the size and cost of manufacture of the electrically operated loads of the load device 200.

In the present fifth embodiment which has been described above, the alternator 202 is the non-subject power source which is not diagnosed by the power source monitoring device 350, while the auxiliary battery 204 is the subject power source which is diagnosed by the power source monitoring device 350. The DC/DC converter 206 serves as an electric power regulating device for controlling the amount of electric power to be supplied from the subject power source to the load device 200. The control portion 72 including the computer 100 cooperates with the DC/DC converter 206 to constitute the supply power regulating device 208. It will also be understood that a portion of the computer 352 of the electric power monitoring device 350 which is assigned to implement S554 serves as load limiting means for limiting or restricting the amount of electric power to be supplied to the load device 200, or limiting loads of the load device 200 that are permitted to operate. The supply power regulating device 208 also serves as a supply power restricting device. It will further be understood that a portion of the computer 352 of the monitoring device 350 which is assigned to implement steps S515, S507 and S516 serves as a composite diagnosing portion for diagnosing the subject power source on the basis of not only the duty ratio of the switching portion 62 detected when the ignition switch 348 is turned on but also the duty ratio detected when the ignition switch 348 is turned off.

The fifth embodiment is adapted to detect the duty ratio D of the switching portion 62 once when the ignition switch 348 is turned from off to on and once when the ignition switch 348 is turned from on to off. However, the duty ratio D can be detected a plurality of times when the ignition switch 348 is turned on and a plurality of time when the ignition switch 348 is turned off. While the electric current is supplied from only the auxiliary battery 204 to the load device 200, the auxiliary battery 204 can be diagnosed. It is also noted that the detection of the duty ratio D at the two points of time when the ignition switch 348 is turned on and when it is turned off is not essential. Namely, the detection may be effected at one of those two points of time. In other words, the use of the diagnostic determinations at the two points of time is not essential. Further, the diagnosis may be effected on the basis of the duty ratio D detected at any opportunity other than the above-indicated two points of time when the ignition switch 348 is turned on and off.

In the present embodiment, the pump motor 256 is turned on for the purpose of diagnosing the auxiliary battery 204 when the ignition switch 348 is turned on. In a braking system wherein the pump motor 256 is automatically turned on to raise the fluid pressure in the accumulator when the ignition[ ]switch 348 is turned on, however, the pump motor 256 need not be commanded to be turned on for the purpose of diagnosing the auxiliary battery 204. In this type of braking system, the diagnosis can be effected on the detected duty ratio D while the DC/DC converter 206 is controlled so as to regulate the amount of electric power consumed by the load device 200 to the predetermined value.

In most braking systems, the fluid pressure in the accumulator is held at the atmospheric level while the ignition switch 348 is off. In some braking system, however, the accumulator pressure is held at a predetermined level higher than the atmospheric level. In this type of braking system, the predetermined value to which the amount of electric power consumed by the load device 200 is regulated to diagnose the auxiliary battery 204 is desirably larger than in the braking system wherein the accumulator pressure is held at the atmospheric pressure.

Although the fifth embodiment is arranged to determine whether the auxiliary battery 204 is normal or abnormal, depending upon whether the detected duty ratio d is higher than the predetermined threshold $D_s$, it is possible to detect the insufficiently charged state or the deteriorated state of the auxiliary battery 204, depending upon the detected duty ratio D. For instance, a determination that the auxiliary battery 204 is in the deteriorated state is made if the duty ratio of the switching portion 62 detected when a predetermined time has passed after the pump motor 256 is turned on is equal to or higher than a first predetermined threshold, and a determination that the auxiliary battery 204 is in the insufficiently charged state is made if the detected duty ratio is lower than the first threshold value and is equal to or higher than a second predetermined threshold which is smaller than the first threshold. The duty ratio used for the diagnosis may be replaced by an amount of change of the duty ratio, a rate of change of the duty ratio, or a pattern of change of the duty ratio.

The transformer is not essential in the DC/DC converter 206.

The braking pressure control device 250 may be adapted to control the braking system 240 in different pressure control modes, depending upon different diagnostic results obtained in the diagnostic routine. For instance, the solenoid coils 270–278 are permitted to be energized with controlled electric currents if the accumulator pressure is higher than a predetermined lower limit upon detection of an abnormality of the auxiliary battery 204, and are inhibited from being energized (namely, the coils are held de-energized) if the accumulator pressure not higher than the lower limit upon detection of the abnormality.

Figure 23:
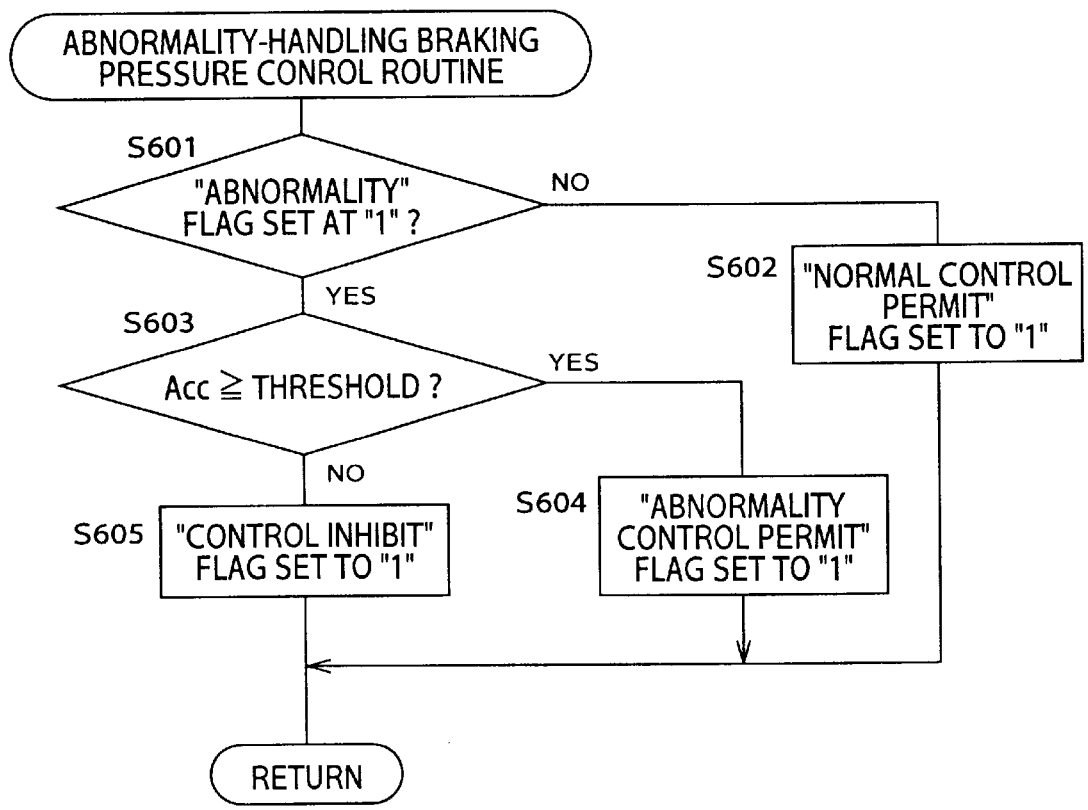
FIG. 23 is a flow chart illustrating an abnormality-handling routine that can be executed by the braking control device including the braking system indicated above.

In the present fifth embodiment, the ROM of the braking pressure control device 250 stores the control program for executing an abnormality-handling braking pressure control routine illustrated in the flow chart of FIG. 23. The power source monitoring device 350 is adapted to apply a flag signal indicative of the state of the ABNORMALITY flag to the braking pressure control device 250. This flag signal may be sent to the braking pressure control device 250 upon request from the device 250, or may be stored in the I/O port of the device 250 from which the flag signal is read into the computer of the device 250 when needed.

The abnormality-handling braking pressure control routine of FIG. 23 is initiated with step S601 to read in the flag signal and determine whether the ABNORMALITY flag is set at "1". If the ABNORMALITY flag is set at "0", a negative decision (NO) is obtained in step S601, and the control flow goes to step S602 to set a NORMAL CONTROL PERMIT flag to "1". If the ABNORMALITY flag is set at "1", an affirmative decision (YES) is obtained in step S601, and the control flow goes to step S603 to determine whether the fluid pressure Acc detected by the pressure sensor 286 is equal to or higher than t predetermined threshold. If the detected fluid pressure Acc is equal to or higher than the threshold, the control flow goes to step S604 to set an ABNORMALITY CONTROL PERMIT flag to "1". If the fluid pressure Acc is lower than the threshold, the control flow goes to step S605 to set a CONTROL INHIBIT flag to "1".

When the ABNORMALITY CONTROL PERMIT flag is set to "1", the braking pressure control device 250 commands the electric power monitoring device 350 to control the electric power to be supplied to the load device 200 such that this electric power is larger than a value necessary to control the solenoid coils 270–278 and the other electrically operated elements of the braking system 240 such as the braking pressure control device 250, the sensors 280–288 and the driver circuits. When the CONTROL INHIBIT flag is set to "1", the braking pressure control device 250 commands the monitoring device 350 so that the electric power power to be supplied to the load device 200 is made equal to the minimum value necessary to permit an operation of the braking pressure control device 250. The electric power monitoring device 350 controls the DC/DC converter 206 on the basis of the control commands received from the braking pressure control device 250.

When the NORMAL CONTROL PERMIT flag is set to "1", the braking system 240 is operated in the normal manner. When the brake pedal 310 is operated, the electric currents to be applied to the solenoid coils 270–278 are controlled, so that the fluid pressures in the wheel brake cylinders 300–306 coincide with the desired level corresponding to the desired braking force represented by the operating amount or stroke of the brake pedal 310. Further, the pump motor 256 is controlled so that the accumulator pressure Acc is held in a predetermined range. When the anti-lock pressure control mode is established, the fluid pressure in the wheel brake cylinder corresponding to the slipping wheel is controlled so that the slipping tendency is held in an optimum range.

When the CONTROL INHIBIT flag is set to "1", the solenoid coils 270–278 are de-energized to establish fluid communication between the master cylinder 310 and the wheel brake cylinders 300–306, and the pump motor 256 is turned off. When the brake pedal 316 is operated in this condition, the wheel brake cylinders 300–306 are activated with the fluid pressure delivered from the master cylinder 310. The anti-lock pressure control mode cannot be established while the CONTROL INHIBIT flag is set at "1".

When the ABNORMALITY CONTROL PERMIT flag is set at "1", the pump motor 256 is held off, and the control of the electric currents to be applied to the solenoid coils 270–278 is permitted. While the accumulator pressure Acc is higher the lower limit, the fluid pressures in the wheel brake cylinders can be controlled with the accumulator pressure Acc, so as to meet the vehicle operator's intention as much as possible. The anti-lock pressure control mode can be established while the ABNORMALITY CONTROL flag is set at "1".

The amount of electric power necessary to permit an operation of the pump motor 256 is larger than the amount necessary to control the electric currents to be applied to the solenoid coils 270–278. Accordingly, the operation of the pump motor 256 is inhibited when the auxiliary battery 204 is abnormal. However, the solenoid coils 270–278 can be controlled within a range of the electric power that can be supplied from the alternator 202.

The present fifth embodiment is adapted to control the wheel brake cylinder pressure in an abnormality-handling manner as described above when the auxiliary battery 204 is detected to be abnormal. This abnormality-handling manner is different from the normal manner in which the wheel brake cylinder pressure is controlled when the auxiliary battery 204 is detected to be normal. In this case, the abnormality-handling pattern of control of the wheel brake cylinder pressure can be changed depending upon the duty ratio D of the DC/DC converter 206. For instance, the CONTROL INHIBIT flag is set to "1" where the duty ratio D becomes equal to or higher than the first threshold value within the predetermined time, and the ABNORMALITY CONTROL PERMIT flag is set to "1" where the duty ratio D becomes lower than the first threshold and equal to or higher than the second threshold.

Further, a MOTOR OPERATION INHIBIT flag for inhibiting an operation of the pump motor 256 may be set to "1" where the ABNORMALITY flag is set at "1". According to this arrangement, the operation of the pump motor 256 is inhibited even while the brake pedal 316 is not in operation. While the brake pedal 316 is not in operation, the load current of the load device 200 will not be large, and the operation of the pump motor 256 can be permitted. To prevent a drop of the voltage of the load device 200, however, it is desirable to inhibit the operation of the pump motor 256 even while the brake pedal 316 is not in operation.

Figure 24:
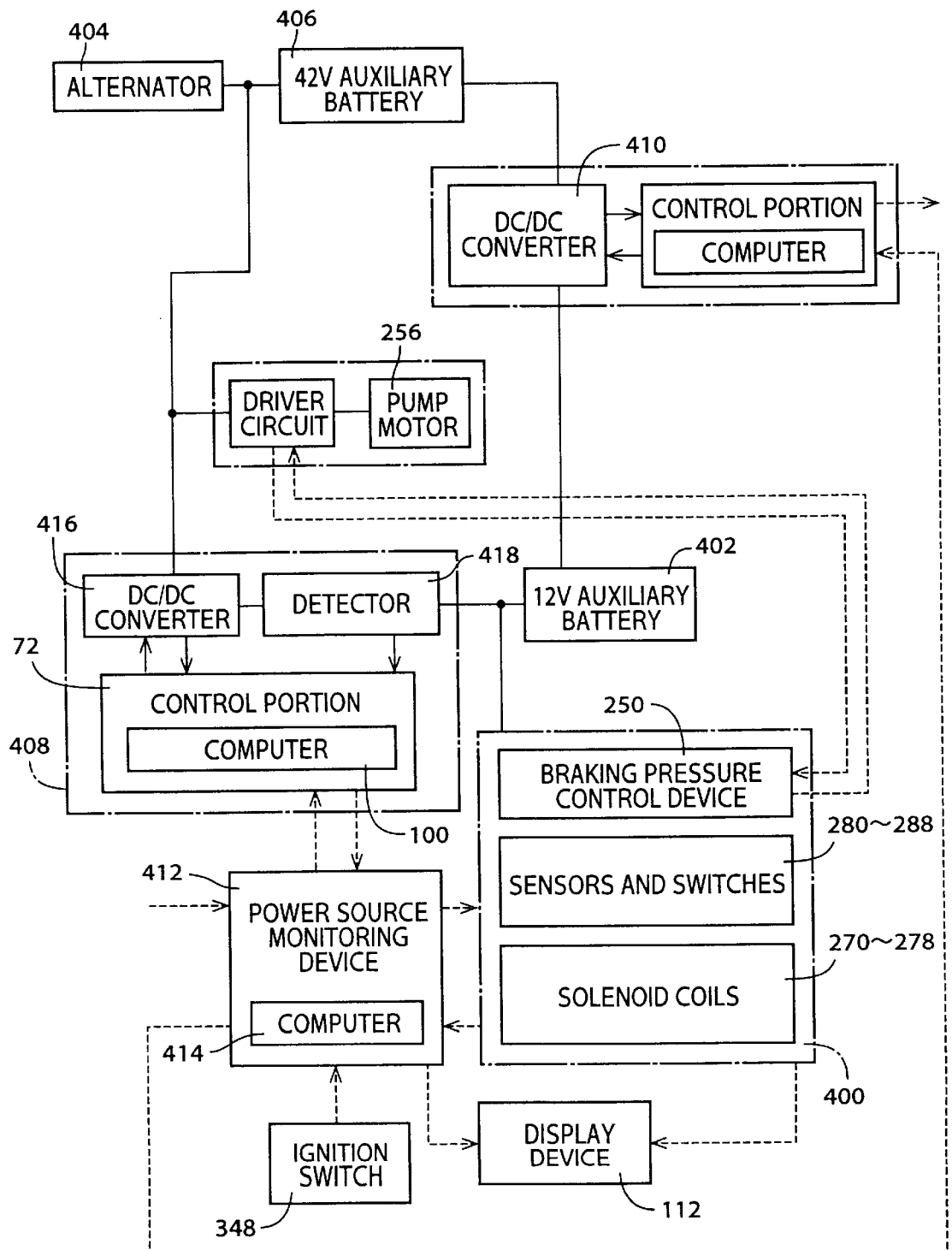
FIG. 24 is a block diagram showing a power source monitoring device 412 in a sixth embodiment of this invention, and electrical devices connected thereto.

Then, a sixth embodiment of the present invention will be described. The electric system of an automotive vehicle to which the present invention is applied is shown in FIG. 24. This electric system includes a load device 400 to which a 12V auxiliary battery 402 is connected. The electric system further includes an alternator 404 and a 42V auxiliary battery 406, which are connected to the load device 400 through a supply power regulating device 408. To the load device 400, there is supplied an electric power of 14V under the control of the supply power regulating device 408. The pump motor 256 is connected between the supply power regulating device 408 and a power source consisting of the alternator 404 and the 42V auxiliary battery 406. The supply power regulating device 408 includes a DC/DC converter 416 through which the 12V auxiliary battery 402 is connected to the 42V auxiliary battery 406. Both the 12V auxiliary battery 402 and the 42V auxiliary battery 406 are charged by the alternator 404.

The two auxiliary batteries 402, 406 are diagnosed by a computer 414 of a power source monitoring device 412.

Like the voltage regulating device 60 in the first embodiment, the supply power regulating device 408 includes a detector 418 as well as the DC/DC converter 416. The detector 418 is adapted to detect the voltage on the output side of the DC/DC converter 416, and an electric current flowing from the DC/DC converter 416 to the load device 400. When the electric power is supplied from only the 12V auxiliary battery 402 to the load device 400, the detector 418 can detect the voltage of the 12V auxiliary battery 402 (which is the voltage of the load device 400).

The 42V auxiliary battery 406 is diagnosed depending upon whether the accumulator pressure detected by the pressure sensor 286 (shown in FIG. 19) has exceeded the predetermined lower limit within the predetermined time. The diagnosis is effected at least one of the two points of time when the ignition switch 348 is turned from off to on and when the ignition switch 348 is turned from on to off, and while the pump motor 256 is operated with the electric power being supplied thereto from only the 42V auxiliary battery 406. If the accumulator pressure does not exceed the lower limit within the predetermined time after the pump motor 256 is turned on, the 42V auxiliary battery 406 is determined to be abnormal. In this case, the electrically operated hydraulic pressure source 290 may be considered to be abnormal.

The 12V auxiliary battery 402 is diagnosed in the same manner as described above with respect to the auxiliary battery 42 in the first embodiment. This diagnosis is effected while the electric power supplied from at least one of the 42V auxiliary battery 402 and the alternator 404 to the load device 400 is limited or lowered by the supply power regulating device 402. The 12V auxiliary battery 402 is determined to be abnormal if the voltage of the 12V auxiliary battery 402 detected by the detector 418 has been lowered below the threshold value within the predetermined time.

If the diagnosis reveals that the 42V auxiliary battery 406 is abnormal while the 12V auxiliary battery 402 is normal, a DC/DC converter 410 is activated for raising the accumulator pressure. In this case, the voltage of the 12V auxiliary battery 402 is raised to 42V by the DC/DC converter 410, and the 42V power is supplied to the 42V auxiliary battery 406, so that the 42V electric power is supplied with high stability to the pump motor 256 and the supply power regulating device 408. In this case, the braking system 240 can be controlled in the normal manner.

The pump motor 256 and the load device 400 can be operated with the electric power supplied from the alternator 404, without activating the DC/DC converter 410. The operations of these pump motor 256 and load device 400 are permitted as long as a sum of the load current of the pump motor 256 and the load current of the load device 400 is smaller than the maximum amount of electric current that is available from the alternator 404 (maximum capacity of the alternator 404). The braking system 240 can be operated as long as this condition is satisfied.

If the above-indicated sum exceeds the capacity of the alternator 404, the load voltages of the pump motor 256 and the load device 400 suddenly drop. Since this sudden voltage drop is not desirable, the operation of the pump motor 256 is preferably inhibited when the 42V auxiliary battery 406 is determined to be abnormal. In this case, the 12V auxiliary battery 402 is normal, so that the operation of the load device 400 is permitted since the electric current can be applied from the normal 12V auxiliary battery 402 to the load device 400 when the load current of the load device 400 increases. The braking system 240 can be controlled to perform a braking operation by controlling the solenoid coils 270–278, as long as the accumulator pressure is higher than the lower limit above which the braking operation is possible, even if the pump motor 256 is turned off.

In the above case, the display device 112 may be activated to provide an indication that the accumulator pressure cannot be controlled or the accumulator is abnormal. Further, the operation of the pump motor 256 need not be inhibited immediately after the 42V auxiliary battery 406 is determined to be abnormal, but may be inhibited only after the sum of the load currents of the pump motor 256 and the load device 400 exceeds a predetermined upper limit determined by the maximum current of the alternator 404. This upper limit may be slightly smaller than the maximum current.

If the diagnosis reveals that the 12V auxiliary battery 402 is abnormal while the 42V auxiliary battery 406 is normal, the DC/DC converter 416 is controlled so as to permit an operation of the load device 400. If the maximum electric current available from the DC/DC converter 416 (maximum capacity of the converter 416) is large than the maximum load current of the load device 400, the braking system 240 can be operated in the normal manner, even if the load current increases. Since the load device 400 does not include an electrically operated device or load whose amount of consumption of the electric power is relatively large, such as the pump motor 256, the load current of the load device 400 will not become excessively large.

If the diagnosis reveals that both the 12V auxiliary battery 402 and the 42V auxiliary battery 406 are abnormal, the pump motor 256 is turned off, and the output of the DC/DC converter 416 is restricted to restrict the operation of the load device 400. In the braking system 240, the master cylinder 310 is brought into communication with the wheel brake cylinders 300–306, so that the wheel brake cylinders can be activated with the pressurized fluid delivered from the master cylinder 310 when the brake pedal 356 is operated.

While the accumulator pressure is higher than the lower limit, the load device 400 is operated within the current capacity of the alternator 404, to permit the braking operation of the braking system 240.

In the present sixth embodiment described above, the 42V electric power can be stably supplied to the pump motor 256 and the supply power regulating device 408, by operation of the DC/DC converter 410, even when the 42V auxiliary battery 406 is abnormal. Even in the absence of the DC/DC converter 410, the load device 400 can be operated as long as the 12V auxiliary battery 402 is normal, so that the braking system 240 can be operated as long as the accumulator pressure is higher than the lower limit, even if the accumulator pressure cannot be controlled with the pump motor 256 turned off. Further, the load device 400 can be operated and the braking system 240 can be operated to perform a braking operation, in the presence of the supply power regulating device 408, even while the 12V auxiliary battery 402 is abnormal.

The 42V auxiliary battery 406 can be diagnosed depending upon whether the duty ratio of the DC/DC converter 416 is higher than a threshold or not, as in the fifth embodiment. It is also noted that the DC/DC converter 410 for raising the accumulator pressure is not essential, and that the DC/DC converter 416 need not have a large current capacity. Where the current capacity of the DC/DC converter 416 is relatively small, the operation of the pump motor 256 is desirably inhibited to restrict the operation of the load device 400, when the 12V auxiliary battery 402 is abnormal.

Figure 25:
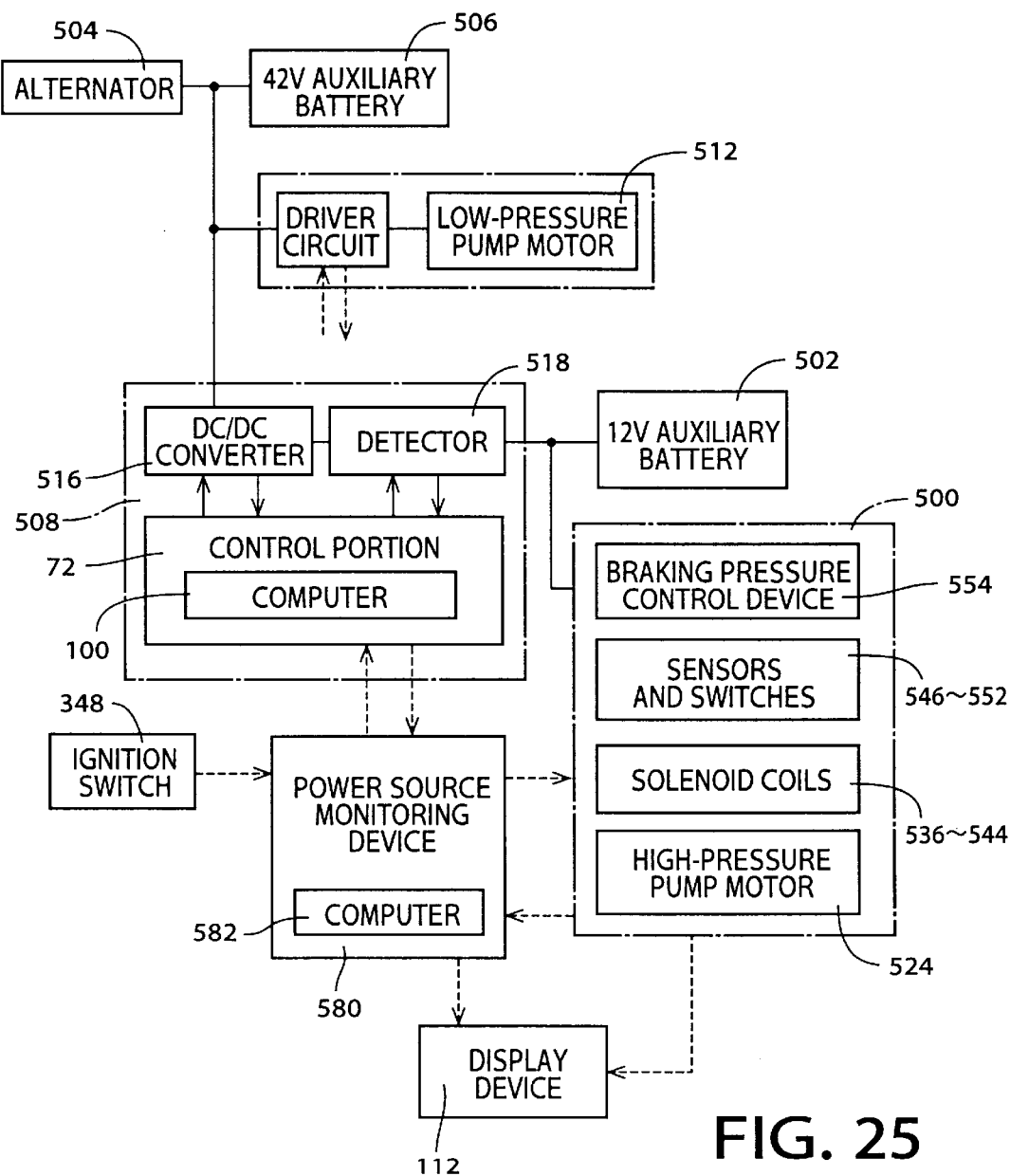
FIG. 25 is a block diagram showing a power source monitoring device 580 in a seventh embodiment of this invention, and electrical devices connected thereto.

There will next be described a seventh embodiment of this invention. Like the electric system incorporating the sixth embodiment, the electric system shown in FIG. 25 incorporating the present seventh embodiment includes a load device 500 to which a 12V auxiliary battery 502 is connected. The electric system further includes an alternator 504 and a 42V auxiliary battery 506, which are connected to the load device 400 through a supply power regulating device 508. To the load device 500, there is supplied an electric power of 14V under the control of the supply power regulating device 508. A low-pressure pump motor 512 for operating a low-pressure pump 510 (shown in FIG. 26) is connected between the supply power regulating device 508 and a power source consisting of the alternator 404 and the 42V auxiliary battery 406. The supply power regulating device 508 includes a DC/DC converter 516, a detector 518 and the control portion 72.

Figure 26:
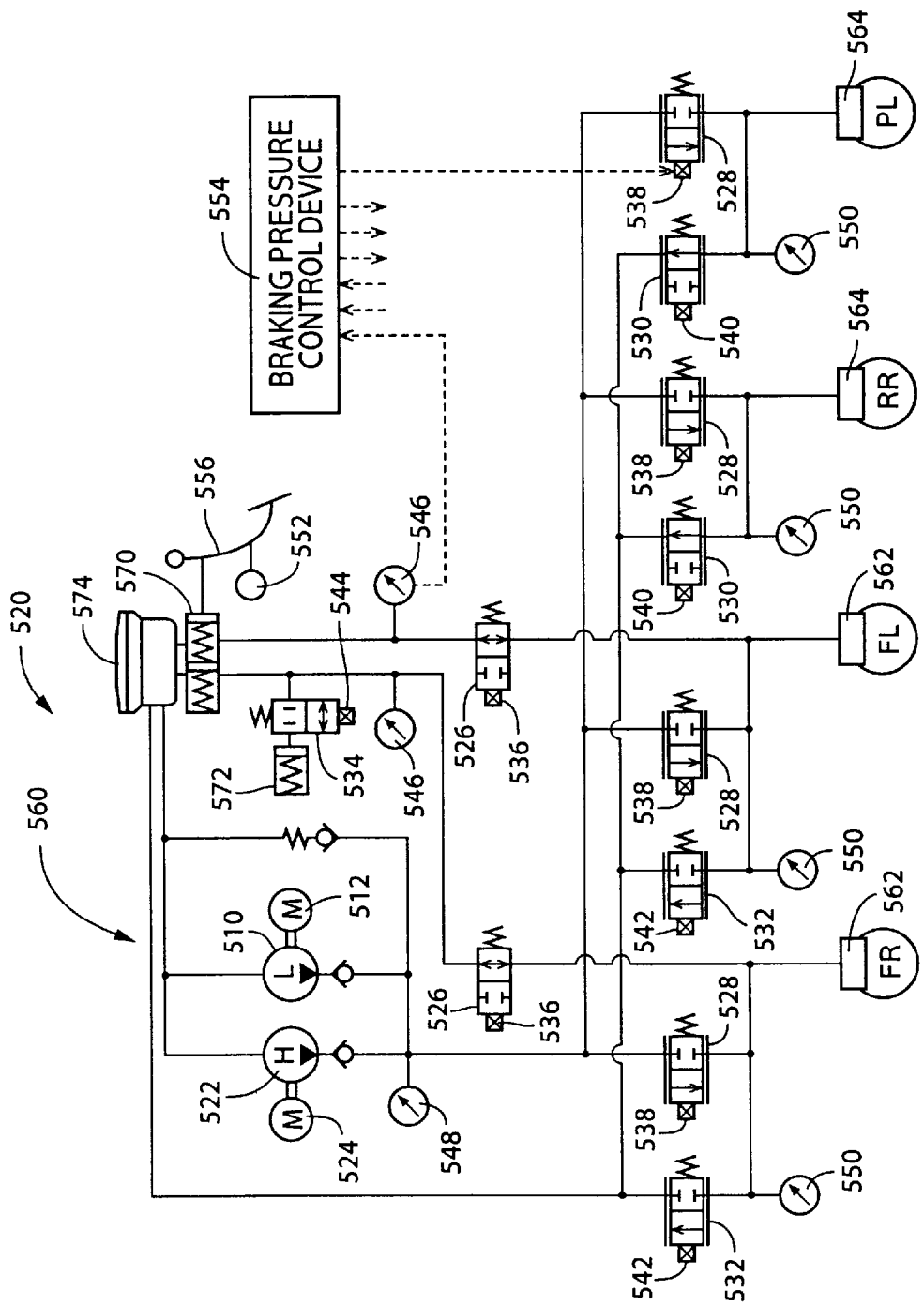
FIG. 26 is a circuit diagram showing a braking system including a load device including some of the electrical devices of FIG. 25.

The load device 500 includes a plurality of electrically operated loads which are included in a braking system 520 shown in FIG. 26. The electrically operated loads include: a high-pressure pump motor 524 for operating a high-pressure pump 522; solenoid coils 536–544 of solenoid-operated control valves 526–534; various sensors 546–552; and a braking pressure control device 554 which is principally constituted by a computer. Of the solenoid-operated control valves 526–534, the solenoid-operated control valves 526, 534 are shut-off valves which are controlled by controlling the duty ratios of their solenoid coils 536, 544. The solenoid-operated control valves 528, 530, 532 are linear solenoid valves which are controlled by linearly controlling the electric currents applied to their solenoid coils 538, 540, 542. In the present embodiment, the linear solenoid valves 528, 532 are normally closed valves, while the linear solenoid valve 530 is a normally open valve. The linear solenoid valves 528, 530 may be identical in construction with the linear solenoid valves 362 included in the braking system 240 of the fifth embodiment, and the linear solenoid valve 532 may be constructed such that a valve member is biased by a spring whose elastic force acts on the valve member in a direction that causes the valve member to be moved away from a valve seat. The low-pressure pump 510, the low-pressure pump motor 512, the high-pressure pump 522 and the high-pressure pump motor 524 constitute a major portion of an electrically operated hydraulic pressure source 560.

The desired braking force to be produced by the braking system 520 is determined by an amount of operation of a brake operating member. Namely, the desired braking force is determined on the basis of the operating stroke of a brake pedal 556 detected by a stroke sensor 552, in an initial period of operation of the brake pedal 556, and on the basis of the master cylinder pressure detected by a pressure sensor 546 in the following period of operation of the brake pedal 556, as in the fifth embodiment.

In the normal braking operation of the braking system 520, at least one of the low-pressure pump motor 512 and the high-pressure pump motor 524, and the solenoid-operated control valves 526–534 are controlled, so that fluid pressures in wheel brake cylinders 562, 564 coincide with the desired level corresponding to the desired braking force determined by the operating amount of the brake pedal 556. With the solenoid-operated shut-off valves 526 placed in the closed state, the wheel brake cylinders 562 are disconnected from a master cylinder 570. With the solenoid-operated shut-off valve 534 placed in the open state, the master cylinder 570 is held in communication with a stroke simulator 572. While the linear solenoid valves 528 are held in the open state with their solenoid coils 538 being energized with the maximum amount of electric current, the wheel brake cylinders 562, 564 are held in communication with the electrically operated hydraulic pressure source 560.

For increasing the fluid pressure in a certain one of the wheel brake cylinders 562, 564, the corresponding linear solenoid valve 528 is opened with its solenoid coil 538 being energized with the maximum current, and the corresponding linear solenoid valve 530, 532 is closed with its solenoid coil 540, 542 being fully de-energized. In this condition, at least one of the low-pressure pump motor 512 and the high-pressure pump motor 424 is controlled so that the delivery pressure of the electrically operated hydraulic pressure source 560 coincides with the desired level. For reducing the wheel brake cylinder pressure, the linear solenoid valve 530, 532 is controlled to permit the pressurized fluid to be discharged from the corresponding wheel brake cylinder 562, 564 to a master reservoir 574.

When the brake pedal is operated in a normal fashion, the wheel brake cylinders 562, 564 are usually activated with the pressurized fluid delivered from the low-pressure pump 510. In this case, the high-pressure pump motor 524 is not usually operated. When the brake pedal 556 is operated at a relatively high velocity (when the desired rate of increase of the braking pressure is relatively high), or when the amount of operation of the brake pedal 556 is relatively large (when the desired braking pressure is relatively high), the high-pressure pump motor 524 is operated together with the low-pressure pump motor 512. Thus, the low-pressure pump motor 512 is more frequently operated than the high-pressure pump motor 524, so that the cumulative operating time of the low-pressure pump motor 512 is longer-than that of the high-pressure pump motor 524.

When the fluid pressure in a certain one of the wheel brake cylinders 562, 564 is controlled in the anti-lock fashion, the delivery pressure of the electrically operated hydraulic pressure source 560 is controlled so as to coincide with the highest one of the desired fluid pressures of the wheel brake cylinders 562, 564, and the fluid pressure in the wheel brake cylinder 562, 564 in question is controlled by controlling the electric current to be applied to the solenoid coil 538, 540, 542 of the corresponding linear solenoid valve 528, 530, 532, so that the slipping tendency of the corresponding wheel is held in an optimum range.

The two auxiliary batteries 502, 506 are diagnosed by a computer 582 of a power source control device 580.

The 42V auxiliary battery 406 can be diagnosed in a manner similar to that in the sixth embodiment. In the present seventh embodiment, the diagnosis is effected on the basis of the delivery pressure of the hydraulic power source 570 detected by the pressure sensor 548 while the high-pressure pump 522 is not in operation and while the low-pressure pump 510 is in operation. The computer 582 determines that the 42V auxiliary battery 406 is abnormal, if the detected delivery pressure does not exceed the predetermined level within the predetermined time after the low-pressure pump motor 512 is turned on to operate only the low-pressure pump 510 when the ignition switch 348 is turned from off to on. As shown in FIG. 26, each linear solenoid valve 528 is disposed between the corresponding wheel brake cylinder 562, 564 and the electrically operated hydraulic pressure source 560 which includes the high-pressure pump 522 and the low-pressure pump 510. This linear solenoid valve 528 is held in the closed state as long as its solenoid coil 538 is placed in the de-energized state. Therefore, the delivery pressure of the hydraulic pressure source 560 must normally exceed the predetermined level within the predetermined time after the low-pressure pump 510 is turned on immediately after the ignition switch 348 is turned on while the braking system 520 is not in operation.

The 12V auxiliary battery 502 can be diagnosed in a manner similar to those in the preceding embodiments.

If the diagnosis reveals that the 42V auxiliary battery 506 is abnormal while the 12V auxiliary battery 502 is normal, the low-pressure pump motor 512 and the load device 500 are operated with the electric power supplied from the alternator 502, as in the preceding embodiment. To prevent a drop of the supply voltage, however, the operation of the low-pressure pump motor 512 may be inhibited. In this case, the normal operation of the load device 500 is permitted, so that the fluid pressure in the wheel brake cylinders can be controlled with the pressurized fluid delivered from the high-pressure pump 522.

If the diagnosis reveals that the 42V auxiliary battery 506 is normal while the 12V auxiliary battery 502 is abnormal, the operation of the high-pressure pump motor 524 is inhibited to restrict or limit the operation of the load device 500, in the present embodiment. In the braking system 520, therefore, the high-pressure pump 522 is held in the non-operated state. The inhibition of the operation of the high-pressure pump motor 524 does not usually cause a problem, since the wheel brake cylinder pressure can be controlled by controlling the low-pressure pump motor 512 and the solenoid coils 536–544.

Figure 27:
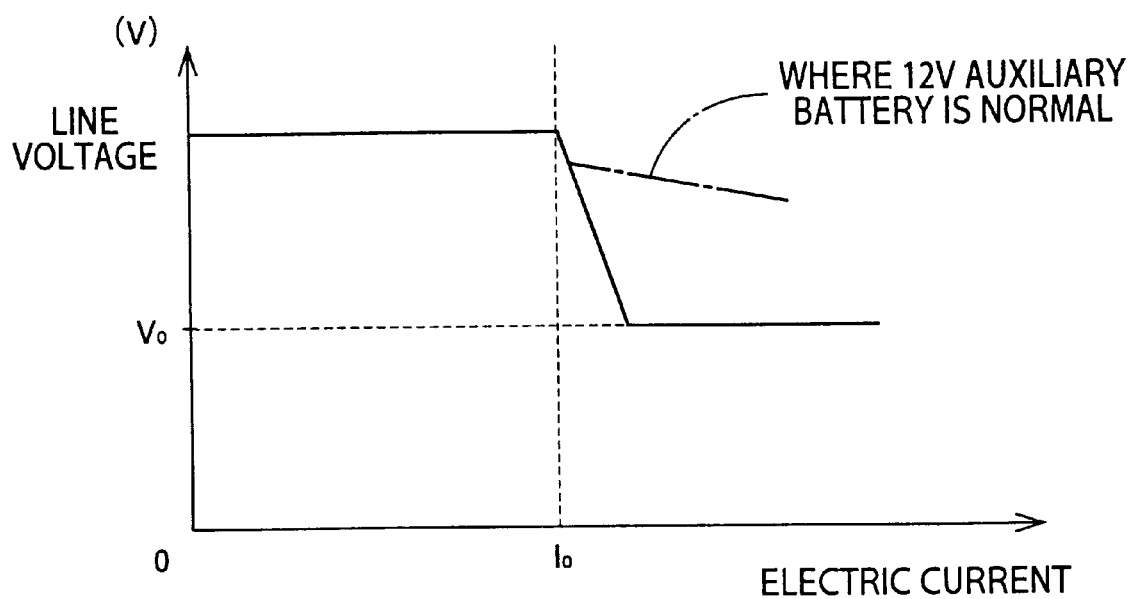
FIG. 27 is a view showing a characteristic of a supply power regulating device of FIG. 25.

However, the load current of the load device 500 may be excessively large before the operation of the high-pressure pump 522 is inhibited. This may occur when an abrupt operation of the braking system 520 is performed during the diagnosis, for instance. While the 12V auxiliary battery 502 is abnormal and no electric current can be supplied from the 12V auxiliary battery 502, the load current of the load device 500 becomes higher than the current capacity (maximum supply current) of the supply power regulating device 508, so that the voltage of the load current 500 may suddenly drop down to a level lower than the lowest level necessary to assure an operation of the computers 100, 582. To avoid this drawback, the voltage of the load device 500 is lowered to a predetermined level $V_0$ as indicated in FIG. 27, under the control of the DC/DC converter 516, when the load current of the load device 500 exceeds a predetermined upper limit Io which is determined by the maximum supply current of the supply power regulating device 508. For instance, the voltage level $V_0$ is selected to be higher than the required lowest level of the computers 100, 582 and may be 10V, for example. As a result, a sufficiently large amount of current may be temporarily applied to the load device 500, so as to prevent a sudden voltage drop of the load device 500.

This, the present seventh embodiment is characterized in that the voltage of the load device 500 can be changed in two steps by the DC/DC converter 516. In the present embodiment, the DC/DC converter 516 of the supply power regulating device 508 serves as a voltage regulating portion, and the control portion 72 of the supply power regulating device 508 and the power source control device 580 constitute a major part of a supply voltage reducing device.

In the present seventh embodiment described above, the relatively high voltage of 42V is applied to the low-pressure pump motor 512 whose cumulative operating time is relatively long (whose required electric power is relatively large), while the relatively low voltage of 12V is applied to the high-pressure pump motor 524 whose cumulative operating time is relatively short (whose required electric power is relatively small). This arrangement results in the operation of the low-pressure pump motor 512 (whose cumulative operating time is relatively long) with the relative high voltage and the relative small current, making it possible to restricting the voltage drop of the cables and increase the energy efficiency. Since the high-pressure pump motor 524 can be operated with the relatively small current, it may be a brush motor, because the brushes are less likely to wear, leading to a reduced energy loss due to sliding of the brushes. In addition, the use of the brush motor as the high-pressure pump motor 524 permits a reduction in the cost of manufacture of the braking system 520. On the other hand, the low-pressure pump motor 512 whose cumulative operating time is relatively long is desirably a brushless motor, which does not suffer from an energy loss which would occur due to sliding of the brushes in the brush motor, so that the energy efficiency can be improved, and the expected service life of the low-pressure pump motor 512 can be prolonged.

It is possible to turn off the low-pressure pump motor 512 and the high-pressure pump motor 524 and de-energize all of the solenoid coils 536–542 when at least one of the auxiliary batteries 502, 504 is found abnormal. In this case, the wheel brake cylinders 562, 564 are brought into communication with the master cylinder 570, so that the pressurized fluid can be delivered from the master cylinder 570 to the wheel brake cylinders 562 when the brake pedal 556 is operated. Since the linear solenoid valves 532 corresponding to the wheel brake cylinders 562 are normally placed in the closed state with their solenoid coils 542 being de-energized, the pressurized fluid is not discharged from the wheel brake cylinders 562 to the master reservoir 574, so that the vehicle can be braked with the activated wheel brake cylinders 562, with high stability.

As in the preceding embodiment, a voltage raising DC/DC converter similar to the converter 410 may be provided between the 12V auxiliary battery 502 and the 42V auxiliary battery 504.

It is further noted that the arrangement of the braking system to which the present invention is applicable is not limited to those of the illustrated embodiments. That is, the principle of the present invention is applicable to a braking system other than the illustrated braking systems. For instance, the invention is applicable to a braking system wherein solenoid-operated shut-off vales are used in place of the linear solenoid valves.

While the several embodiments of the present invention have been described in detail by reference to the accompanying drawings, for illustrative purpose only, it is to be understood that the present invention may be embodied with various changes and improvements, in various forms as described in the SUMMARY OF THE INVENTION, which may occur to those skilled in the art.

What is claimed is:

1. A power source monitoring apparatus for monitoring a state of each of at least one subject power source which consists of at least one of a plurality of electric power sources in an electric system wherein a load device having at least one electrically operated load is electrically connected to said plurality of electric power sources, said power source monitoring apparatus comprising:

a detecting portion which detects at least one of a voltage and a current of at least one of said load device, said at least one subject power source, and at least one non-subject power source which consists of said plurality of electric power sources except said at least one subject power source; and a first diagnosing device which diagnoses said each subject power source for an abnormality on the basis of an output of said detecting portion, while said electric system is placed in a power supply state wherein an electric power is permitted to be supplied from only said subject power source to said load device.

2. A power source monitoring apparatus according to claim 1, wherein said first diagnosing device includes means for assuring an operation of said load device with the electric power supplied from said at least one subject power source when said first diagnosing device diagnoses said each subject power source.

3. A power source monitoring apparatus according to claim 1, wherein said power supply state is established with said at least one non-subject power source being temporarily disconnected from said load device.

4. A power source monitoring apparatus according to claim 1, wherein said power supply state is established with a temporary limitation of said electric power to be supplied from said at least one non-subject power source to said load device, without a temporary disconnection of said at least one non-subject power source from said load device.

5. A power source monitoring apparatus according to claim 4, wherein said temporary limitation is established while said at least one non-subject power source is intermittently or continuously connected to said load device, such that a voltage of said at least one non-subject power source is lowered to a level which is between an upper limit lower than an expected lowest level of a voltage of said at least one subject power source when said at least one subject power source is normal, and a lower limit higher than zero.

6. A power source monitoring apparatus according to claim 1, wherein said at least one non-subject power source cooperates with a switching device to constitute a main power source device, said switching device having a connecting state wherein said at least one non-subject power source is connected to both of said at least one subject power source and said load device, and a disconnecting state wherein said at least one non-subject power source is disconnected from both of said at least one subject power source and said load device, and wherein said switching device is operable between said connecting and disconnecting states, to thereby control flows of the electric current between said at least one non-subject power source and a series connection of said at least one subject power source and said load device, said first diagnosing device commanding said switching device to establish said power supply state.

7. A power source monitoring apparatus according to claim 1, further comprising a switching device which has a connecting state wherein said at least one non-subject power source is connected to both of said at least one subject power source and said load device, and a disconnecting state wherein said said at least one non-subject power source is disconnected from both of said at least one subject power source and said load device, and wherein said switching device is operable between said connecting and disconnecting states, to thereby control flows of the electric current between said at least one non-subject power source and a series connection of said at least one subject power source and said load device, said first diagnosing device commanding said switching device to establish said power supply state.

8. A power source monitoring apparatus according to claim 7, wherein said switching device includes a switching element which is operable between an on state and an off state.

9. A power source monitoring apparatus according to claim 7, wherein each of said at least one subject power source and said at least one non-subject power source is a direct current power source, and said switching device comprises a DC/DC converter including (a) a DC-AC converter which converts a direct current of said at least one non-subject power source into an alternating current, (b) a transformer which changes a voltage of the alternating current, and (c) an AC-DC converter which converts the alternating current whose voltage has been changed, into a direct current.

10. A power source monitoring apparatus according to claim 1, wherein a nominal voltage of said at least one subject power source and a nominal voltage of said at least one non-subject power source are different from each other.

11. A power source monitoring apparatus according to claim 1, wherein a nominal voltage of said at least one non-subject power source is higher than that of said at least one subject power source.

12. A power source monitoring apparatus according to claim 11, wherein said at least one non-subject power source constitutes a primary power source, while each of said at least one subject power source is an auxiliary battery which has a lower nominal voltage and which is charged by said primary power source.

13. A power source monitoring apparatus according to claim 12, wherein said first diagnosing device determines whether said auxiliary battery is in a deteriorated state or in an insufficiently charged state, on the basis of said output of said detecting portion.

14. A power source monitoring apparatus according to claim 11, further comprising a second diagnosing device which diagnoses said each subject power source on the basis of said output of said detecting portion, without temporary disconnection or limitation of an electric power supply from said at least one non-subject power source to said load device, while the electric power is supplied to said load device from both said at least one non-subject power source and said at least one subject power source.

15. A power source monitoring apparatus according to claim 14, wherein said second diagnosing device includes means for determining that the electric power is supplied from both said at least one non-subject power source and said at least one subject power source to said load device, if a first condition is satisfied or if said first and a second condition are both satisfied, said first condition being satisfied when an amount of electric current supplied from said at least one non-subject power source to said load device is substantially equal to a maximum amount of electric current that can be supplied from said at least one non-subject power source to said load device, and said second condition being satisfied when a voltage of said at least one non-subject power source is substantially equal to that of said at least one subject power source.

16. A power source monitoring apparatus according to claim 1, wherein said load device includes an electric motor which converts an electric energy into a kinetic energy.

17. A power source monitoring apparatus according to claim 1, wherein said each of said plurality of electric power sources includes at least one of a battery and an electric generator.

18. A power source monitoring apparatus according to claim 1, wherein said first diagnosing device diagnoses said each subject power source at a time interval which changes depending upon a change of said output of said detecting portion.

19. A power source monitoring apparatus according to claim 18, wherein said at least one of said first and second diagnosing devices changes said time interval such that said time interval is longer when said output is relatively large than when said output is relatively small.

20. A power source monitoring apparatus according to claim 1, wherein said first diagnosing device diagnoses said each subject power source on the basis of a result of comparison of said output of said detecting portion with a threshold value which is determined by said output.

21. A power source monitoring apparatus according to claim 20, wherein said first diagnosing device includes means for determining said threshold value such that said threshold value is larger when said output is relatively large than when said output is relatively small.

22. A power source monitoring apparatus according to claim 1, wherein said first diagnosing device device includes determining means for determining that said each subject power source is abnormal, if said output of said detecting portion has been reduced to a threshold value before a predetermined time has passed after said power supply state has been established, said determining means determining said predetermined time depending upon said output.

23. A power source monitoring apparatus according to claim 22, wherein said determining means determines said predetermined time such that said predetermined time is shorter when said output is relatively large than when said output is relatively small.

24. A power source monitoring apparatus according to claim 1, wherein said first diagnosing device includes means for permitting a diagnosis of said each subject power source when said load device is not required to perform an assigned function thereof.

25. A power source monitoring apparatus according to claim 1, wherein said load device is provided on an automotive vehicle to enable said automotive vehicle to perform an intended function thereof, and said first diagnosing device includes means for permitting a diagnosis of said each subject power source when said automotive vehicle is in a substantially stationary state.

26. A power source monitoring apparatus according to claim 25, wherein said means for permitting a diagnosis of said each subject power source permits said diagnosis immediately after said automotive vehicle has been enabled to perform said intended function while said automotive vehicle is disabled to perform said intended function, and/or immediately after said automotive vehicle has been disabled to perform said intended function while said automotive vehicle is enabled to perform said intended function.

27. A power source monitoring apparatus according to claim 26, further comprising a connection control device which has a connecting state wherein said at least one non-subject power source is connected to both of said at least one subject power source and said load device, and a disconnecting state wherein said at least one non-subject power source is disconnected from both of said at least one subject power source and said load device, and wherein said connection control device is operable between said connecting and disconnecting states, to thereby control flows of the electric current between said at least one non-subject power source and a series connection of said at least one subject power source and said load device, said connection control device being brought into said disconnecting state immediately after said automotive vehicle has been enabled to perform said intended function while said automotive vehicle is disabled to perform said intended function, and/or immediately after said automotive vehicle has been disabled to perform said intended function while said automotive vehicle is enabled to perform said intended function.

28. A power source monitoring apparatus according to claim 26, wherein said first diagnosing device includes means for commanding said load device to perform a predetermined operation with the electric power supplied from said at least one subject power source such that an amount of electric power of said at least one subject power source which is consumed by said load device is made equal to a predetermined value, said load device being commanded to perform said predetermined operation immediately after said automotive vehicle has been enabled to perform said intended function while said automotive vehicle is disabled to perform said intended function, and/or immediately after said automotive vehicle has been disabled to perform said intended function while said automotive vehicle is disabled to perform said intended function.

29. A power source monitoring apparatus according to claim 1, wherein said first diagnosing device includes means for permitting a diagnosis of said each subject power source when an amount of consumption of the electric power of said at least one subject power source is larger than a threshold value.

30. A power source monitoring apparatus according to claim 29, wherein said automotive vehicle includes a drive power source which drives said automotive vehicle, and said electric system includes a starter which is operated by the electric power supplied by only said at least one subject power source, to start said drive power source for enabling said automotive vehicle to perform said intended function, said diagnosis of said each subject power source being permitted while said starter is operated to start said drive power source.

31. A power source monitoring apparatus according to claim 30, wherein said first diagnosing device includes means for inhibiting a diagnosis of said each subject power source while said drive power source is started without an operation of said starter.

32. A power source monitoring apparatus according to claim 1, wherein said first diagnosing device includes means for inhibiting a diagnosis of said each subject power source when a power source other than said plurality of power sources is connected to said each subject power source.

33. A power source monitoring apparatus according to claim 1, wherein said load device includes a plurality of electrically operated loads, said apparatus further comprising load limiting means for selecting at least one of said plurality of electrically operated loads as at least one operable load that is permitted to be operated with the electric power supplied from said at least one non-subject power source when said first diagnosing device determines that any one of said at least one subject power source is abnormal.

34. A power source monitoring apparatus according to claim 33, wherein said load limiting means includes selecting means for selecting said at least one operable load from said plurality of electrically operated loads, according to priorities which are respectively given to said plurality of electrically operated loads such that the priorities increase in the order of importance of functions performed by said electrically operated loads on an automotive vehicle.

35. A power source monitoring apparatus according to claim 1, further comprising power consumption limiting means for limiting an amount of electric power consumed by said load device when said first diagnosing device determines that any one of said at least one subject power source is abnormal, such that the limited amount is smaller than an amount normally consumed by said load device.

36. A power source monitoring apparatus according to claim 34, wherein said load limiting means includes power consumption limiting means for limiting an amount of electric power consumed by said at least one operable load selected by said selecting means when said first diagnosing device determines that any one of said at least one subject power source is abnormal, such that the limited amount is smaller than an amount normally consumed by said at least one operable load.

37. A power source monitoring apparatus according to claim 1, further comprising a third diagnosing device which diagnoses said at least one non-subject power source on the basis of said output of said detecting portion.

38. A power source monitoring apparatus according to claim 1, wherein said detecting portion includes a voltage detecting portion which detects a voltage of said load device, and said electric system includes a voltage regulating device which feedback-controls a voltage of said at least one non-subject power source to a predetermined value on the basis of the voltage detected by said voltage detecting portion.

39. A power source monitoring apparatus according to claim 38, wherein said first diagnosing device commands the voltage regulating device to establish said power supply state wherein said electric power is permitted to be supplied from only said subject power source to said load device.

40. A power source monitoring apparatus according to claim 1, wherein said electric system includes a supply power regulating device including (a) an electric power regulating portion provided between said at least one subject power source and said load device, to regulate an electric power to be supplied from said at least one subject power source to said load device, and (b) a control portion which controls an operating state of said electric power regulating portion so that an amount of electric power to be supplied to said load device is equal to a predetermined value, and wherein said detecting portion detects the operating state of said electric power regulating portion.

41. A power source monitoring apparatus according to claim 40, wherein said electric power regulating portion includes a DC/DC converter including (a) a plurality of switching elements which convert a direct current of said at least one subject power source into an alternating current, (b) a transformer which regulates a voltage of the alternating current, and (c) an AC/DC converting element which converts the alternating current whose voltage has been regulated by said transformer, into a direct current, and said control portion includes a duty ratio control portion which alternately turns on and off said plurality of switching elements at a duty ratio determined by the amount of electric power supplied to said load device and the voltage of said at least one subject power source, and wherein said detecting portion includes a duty ratio detecting portion which detects said duty ratio of said switching elements.

42. A power source monitoring apparatus according to claim 1, wherein said at least one non-subject power source consists of an electric generator which is operated to generate an electric power, by a drive power source provided to drive an automotive vehicle on which the power source monitoring apparatus is provided, and wherein said first diagnosing device diagnoses said each subject power source when said drive power source is turned on, and/or when said drive power source is turned off.

43. A power source monitoring apparatus according to claim 1, wherein said first diagnosing device includes a composite diagnosing portion on the basis of an output of said detecting portion immediately after an automotive vehicle on which the power source monitoring apparatus is provided has been enabled to perform an assigned function thereof while the automotive vehicle is disabled to perform said assigned function, and an output of said detecting portion immediately after the automotive vehicle has been disabled to perform said assigned function while the automotive vehicle is enabled to perform the assigned function.

44. A power source monitoring apparatus according to claim 1, wherein said at least one electrically operated load of said load device includes (a) a drive power source of an electrically operated hydraulic pressure source capable of pressurizing a working fluid, (b) a solenoid coil of a solenoid-operated control valve capable of controlling a pressure of the working fluid to be applied to a hydraulically operated brake in a braking system, and (c) a computer which constitutes a major portion of a hydraulic pressure control device which controls the pressure of said hydraulically operated brake, by controlling at least one of an electric energy to be supplied to said drive power source and an electric energy to be supplied to said solenoid coil, and wherein said drive power source, said solenoid coil and said computer are operable with an electric power supplied from an electric power source device which includes said plurality of power sources.

45. A power source monitoring apparatus according to claim 44, wherein said electric power source device consists of a first power source unit including at least one of said plurality of power sources, and a second power source unit including at least one of said plurality of power source which is other than said at least one power source of said first power source unit, and said solenoid coil and said computer are connected to both of said first and second power source units, while said drive power source of said hydraulic pressure source is connected to said electric power source device such that the drive power source is operated with the electric energy supplied from only said second power source unit, and wherein at least one of said first and second power source units includes at least one of said at least one subject power source.

46. A power source monitoring apparatus according to claim 44, wherein said electrically operated hydraulic pressure source includes a low-pressure pump, and a high-pressure pump whose delivery pressure is higher than that of said low-pressure pump and whose delivery rate is lower than that of said low-pressure pump, and said drive power source includes a low-pressure pump motor and a high-pressure pump motor for operating said low-pressure and high-pressure pumps, respectively, and wherein said solenoid coil, said computer and said high-pressure pump motor are connected to said at least one subject power source and said at least one non-subject power source whose voltage is higher than the voltage of said at least one subject power source, and said low-pressure pump motor is connected to said electric power source device such that the low-pressure pump motor is operated with the electric energy supplied from only said at least one non-subject power source.

47. A power source monitoring apparatus according to claim 1, which is provided on an automotive vehicle including (a) a drive power source, (b) said electric system including said load device connected to said plurality of power sources, and (c) a disconnecting circuit for temporarily disconnecting at least one of said plurality of power sources from said load device when said drive power source is started, and said at least one subject power source includes at least one of said plurality of power sources which is not temporarily disconnected by said disconnecting circuit from said load device, and wherein said detecting portion detects at least one of a voltage and an electric current of at least one of said load device and said at least one non-subject power source which consists of said plurality of power sources except said at least one of said plurality of power sources which is not temporarily disconnected by said disconnecting circuit from said load device, and said first diagnoses device diagnosing each of said at least one subject power source on the basis of at least one of said output of said detecting portion and a rate of change of said output, when said drive power source of the automotive vehicle is started.

48. A power source control apparatus provided in an electric system including (a) at least one subject power source, (b) at least one non-subject power source, (c) a load device connected to said at least one subject power source and said at least one non-subject power source and having at least one electrically operated load, and (d) a voltage regulating portion which is provided between said load device and at least one of said at least one non-subject power source and which regulates a voltage of said at least one of said at least one non-subject power source so that the regulated voltage is applied to said load device, said power source control apparatus comprising:

a power source monitoring device which diagnoses each of said at least one subject power source; and a supply voltage reducing device for controlling said voltage regulating portion such that a voltage to be applied to said load device is lower when said power source monitoring device has determined that any one of said at least one subject power source is abnormal, than when said power source monitoring device has determined that said at least one subject power source is normal.

49. A power source control apparatus according to claim 48, wherein said supply voltage reducing device includes means for controlling said voltage regulating portion to reduce the voltage to be applied to said load device, when an amount of electric power consumed by said load device has exceeded a predetermined upper limit.

50. A power source monitoring apparatus for monitoring a state of a low-voltage power source in an electric system wherein a load device having at least one electrically operated load is connected to said low-voltage power source and a high-voltage power source, said power source monitoring apparatus comprising:

a detecting portion which detects at least one of a voltage and an electric current of at least one of said load device, said high-voltage power source and said low-voltage power source; and a diagnosing device which diagnoses said low-voltage power source for an abnormality on the basis of at least one of an output of said detecting portion and a rate of change of said output, while an electric power is supplied to said load device from both of said high-voltage power source and said low-voltage power source, without temporary disconnection of said high-voltage power source from said load device or temporary limitation of the electric power supplied from said high-voltage power source to said load device.

51. A power source monitoring apparatus according to claim 50, wherein said diagnosing device includes means for determining that the electric power is supplied from both of said high-voltage and low-voltage power sources to said load device, if a first condition is satisfied or if said first and a second condition are both satisfied, said first condition being satisfied when an amount of electric current supplied from said high-voltage power source to said load device is substantially equal to a maximum amount of electric current that can be supplied from said high-voltage power source to said load device, and said second condition being satisfied when a voltage of said high-voltage power source is substantially equal to that of said low-voltage power source.

52. A braking system comprising:

a hydraulically operated brake;

an electrically operated hydraulic pressure source including a drive power source and pressurizing a working fluid;

a solenoid-operated control valve including a solenoid coil and capable of controlling a pressure of the working fluid to be applied to said hydraulically operated brake; and a hydraulic pressure control device which controls the pressure of said hydraulically operated brake, by controlling at least one of an electric energy to be supplied to said drive power source of said electrically operated hydraulic pressure source and an electric energy to be supplied to said solenoid coil, and wherein at least one of said drive power source and said solenoid coil is connected to a plurality of electric power sources which include at least one subject power source, and said hydraulic pressure control device includes an abnormality-handling pressure control portion which is operated when any one of said at least one subject power source is abnormal, to control at least one of the electric energy to be supplied to said drive power source and the electric energy to be supplied to said solenoid coil, in an abnormality-handling manner which is different from a normal manner in which said at least one of said electric energies is controlled when none of said at least one subject power source is abnormal.

53. A method of monitoring a state of each of at least one subject power source which consists of at least one of a plurality of electric power sources in an electric system wherein a load device is electrically connected to the plurality of electric power sources, the method comprising the steps of:

detecting at least one of a voltage and a current of at least one of said load device, said at least one subject power source and at least one non-subject power source which consists of said plurality of electric power sources except said at least one subject power source; and diagnosing said each subject power source for an abnormality on the basis of at least one of said at least one of said voltage and said current and a rate of change of said at least one of said at least one of said voltage and said current, while said electric system is placed in a power supply state wherein an electric power is permitted to be supplied from only said subject power source to said load device.

54. A method according to claim 53, wherein said power supply state is established with a temporary limitation of the electric power to be supplied from said at least one non-subject power source to said load device, without a temporary disconnection of said at least one non-subject power source from said load device.

55. A method of monitoring a state of a low-voltage power source in an electric system wherein a load device having at least one electrically operated load is electrically connected to said low-voltage power source and a high-voltage power source, said method comprising the steps of:

detecting at least one of a voltage and a current of at least one of said high-voltage and low-voltage power sources; and diagnosing said low-voltage power source for an abnormality on the basis of at least one of said at least one of said voltage and said current and a rate of change of said at least one of said at least one of said voltage and said current, while said electric system is placed in a power supply state wherein an electric power is permitted to be supplied from at least said low-voltage power source.

56. A method according to claim 55, wherein said power supply state is established with a temporary limitation of the electric power to be supplied from said high-voltage power source to said load device, without a temporary disconnection of said high-voltage power source from said load device.

57. A method according to claim 56, wherein said power supply state includes a state wherein the electric power is supplied to said load device from both of said high-voltage and low-voltage power sources.

58. A method according to claim 53, wherein said low-voltage power source includes a battery which is charged by said high-voltage power source.

59. A method according to claim 55, wherein said low-voltage power source includes a battery which is charged by said high-voltage power source.

* * * * *